United States Patent
Huang et al.

(10) Patent No.: US 12,500,607 B2
(45) Date of Patent: Dec. 16, 2025

(54) ENCODING AND DECODING METHODS AND DEVICES, AND SYSTEM

(71) Applicant: Huawei Technologies Co., Ltd., Shenzhen (CN)

(72) Inventors: Kechao Huang, Shenzhen (CN); Wai Kong Raymond Leung, Shenzhen (CN); Huixiao Ma, Shenzhen (CN); Xiaoling Yang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 71 days.

(21) Appl. No.: 18/469,087

(22) Filed: Sep. 18, 2023

(65) Prior Publication Data
US 2024/0007131 A1    Jan. 4, 2024

Related U.S. Application Data

(63) Continuation of application No. PCT/CN2022/081021, filed on Mar. 15, 2022.

(30) Foreign Application Priority Data

Mar. 18, 2021 (CN) .......................... 202110293130.9

(51) Int. Cl.
   *H03M 13/11* (2006.01)
(52) U.S. Cl.
   CPC .... *H03M 13/1174* (2013.01); *H03M 13/1111* (2013.01); *H03M 13/1168* (2013.01)

(58) Field of Classification Search
   CPC .............. H03M 13/11; H03M 13/1111; H03M 13/1168; H03M 13/1174; H03M 13/19;
   (Continued)

(56) References Cited

U.S. PATENT DOCUMENTS

| 10,725,841 B1 * | 7/2020 | Rahul ................. H03M 13/618 |
| 2006/0282756 A1 * | 12/2006 | Gammel .............. H03M 13/19 714/801 |

(Continued)

FOREIGN PATENT DOCUMENTS

JP    2016187099 A    10/2016

OTHER PUBLICATIONS

M. Richter, K. Oberlaender and M. Goessel, "New Linear SEC-DED Codes with Reduced Triple Bit Error Miscorrection Probability," 2008 14th IEEE International On-Line Testing Symposium, Rhodes, Greece, 2008, pp. 37-42. Jul. 7-9, 2008. (Year: 2008).*

(Continued)

*Primary Examiner* — Albert Decady
*Assistant Examiner* — Enamul M Kabir
(74) *Attorney, Agent, or Firm* — Conley Rose, P.C.

(57) ABSTRACT

An encoding method includes: obtaining a generator matrix for encoding, where the generator matrix is determined based on a target parity-check matrix of a Hamming code for encoding, the target parity-check matrix is based on a target function for decoding, the target function is used to determine a not-all-zero row vector extended based on the target parity-check matrix, and the target function is one of a predetermined function set; encoding information bits using the generator matrix to obtain an encoded data stream; and sending the encoded data stream.

30 Claims, 4 Drawing Sheets

(58) Field of Classification Search
CPC .............. H03M 13/616; H03M 13/618; H03M 13/6502
See application file for complete search history.

(56) References Cited

U.S. PATENT DOCUMENTS

| | | | |
|---|---|---|---|
| 2013/0055050 A1 | 2/2013 | Uchikawa | |
| 2013/0139028 A1* | 5/2013 | Goel | H03M 13/1575 714/753 |
| 2014/0068391 A1* | 3/2014 | Goel | H03M 13/2942 714/785 |
| 2015/0067012 A1* | 3/2015 | Goettfert | G06F 17/16 708/520 |
| 2016/0283326 A1 | 9/2016 | Hayashi | |
| 2020/0220556 A1* | 7/2020 | Usatyuk | H03M 13/036 |
| 2020/0389186 A1* | 12/2020 | Kim | G06F 11/076 |
| 2023/0004852 A1* | 1/2023 | Ide | H03M 13/37 |

OTHER PUBLICATIONS

OIF-400ZR-01.0, Implementation Agreement 400ZR, Mar. 10, 2020, total 100 pages.

ITU-T G.709.3/Y.1331.3, Nov. 2018, "Series G: Transmission Systems and Media, Digital Systems and Networks, Digital terminal equipments—General, Series Y: Global Information Infrastructure, Internet Protocol Aspects, Next-Generation Networks, Internet of Things and Smart Cities, Internet protocol aspects—Transport, Flexible OTN long-reach interfaces Amendment 1," 6 pages.

Mike A Sluyski, "Implementation Agreement 400ZR," ITU-T Draft; Study Period 2017-2020; Study Group 15, International Telecommunication Union, Geneva; CH, vol. ties/15, Sep. 3, 2019, 91 pages, XP044275308.

* cited by examiner

ENCODING AND DECODING METHODS AND DEVICES, AND SYSTEM

CROSS-REFERENCE TO RELATED APPLICATIONS

This application is a continuation of International Patent Application No. PCT/CN2022/081021 filed on Mar. 15, 2022, which claims priority to Chinese Patent Application No. 202110293130.9 filed on Mar. 18, 2021. The disclosures of the aforementioned applications are hereby incorporated by reference in their entireties.

TECHNICAL FIELD

Embodiments of this disclosure generally relate to the field of communication technologies, and more specifically, to encoding and decoding methods and devices, and a system.

BACKGROUND

In a communication system, information is sent from a transmit end in a form of a signal, and is transmitted to a receive end through a communication channel such as an optical fiber, a cable, or a radio wave. In this process, noise in the channel or noise from the receive end and the transmit end is usually superimposed on a signal, thereby causing an error of a signal received by the receive end. In order that the receive end can restore, based on the erroneously received signal, the original signal sent by the transmit end, currently the forward error correction (FEC) technology is generally used in the communication system to encode the information before the signal is sent. In addition, the FEC technology is also widely applied to storage systems.

FEC-based encoding technologies include, for example, a Hamming code, a Bose, Chaudhuri, and Hocquenghem (BCH) code, a Reed-Solomon (RS) code, and a Turbo product code (TPC). The Hamming code is a perfect code with a simple hard-decision decoding scheme, and the Hamming code can detect and correct a one-bit error. Specifically, for the Hamming code, a concept of a parity bit is used. Information is first grouped, and then a check bit is added before each group of information bits. In this design, validity of the information can be verified, and a location of an error in the information can be further indicated. In practice, various forms of extended Hamming codes have been provided. A principle of the extended Hamming codes is to extend a conventional Hamming code by using an additional parity bit or row vector to implement enhanced detection and error correction capabilities. However, currently performance of a single-extended Hamming code is not ideal, and performance of a double-extended Hamming code is improved but coding and decoding complexity is relatively high.

SUMMARY

In general, example embodiments of this disclosure provide a scheme for generating a double-extended Hamming code and related encoding and decoding schemes.

According to a first aspect of this disclosure, an encoding method is provided. In the method, a generator matrix for encoding is obtained. In the context of this disclosure, the generator matrix is determined based on a target parity-check matrix of a Hamming code for encoding, and the target parity-check matrix is determined based on a target function for decoding. The target function is used to determine a not-all-zero row vector extended based on the target parity-check matrix. The target function is one of a predetermined function set. In this method, information bits are encoded by using the generator matrix, to obtain an encoded data stream. The method further includes: sending the encoded data stream.

In the encoding method provided in this embodiment of this disclosure, the improved double-extended Hamming code is used, and the target parity-check matrix of the improved double-extended Hamming code is obtained based on the target function that has a smaller operation quantity and that is selected from the predetermined function set, so that such an extended Hamming code can implement lower encoding complexity and optimized performance in specific code space.

In a first implementation of the first aspect, the target function $h(s_{0,i}, s_{1,i}, s_{2,i})$ determines the not-all-zero row vector based on at least some elements of first three elements $s_{0,i}, s_{1,i}$, and $s_{2,i}$ of column vectors corresponding to the not-all-zero row vector, and the predetermined function set includes one or more of the following: $h(s_{0,i},s_{1,i},s_{2,i})=s_{1,i} \wedge s_{2,i}, h(s_{0,i},s_{1,i},s_{2,i})=s_{0,i} \wedge s_{1,i}, h(s_{0,i},s_{1,i},s_{2,i})=s_{0,i} \wedge s_{2,i}, h(s_{0,i},s_{1,i},s_{2,i})=s_{0,i} \wedge s_{1,i} \wedge \overline{s_{2,i}}, h(s_{0,i},s_{1,i},s_{2,i})=\overline{s_{0,i}} \wedge s_{1,i} \wedge s_{2,i}, h(s_{0,i},s_{1,i},s_{2,i})=(s_{0,i} \wedge \overline{s_{1,i}} \wedge s_{2,i}), h(s_{0,i},s_{1,i},s_{2,i})=(s_{0,i} \wedge \overline{s_{2,i}}) \vee (s_{1,i} \wedge \overline{s_{2,i}}), h(s_{0,i},s_{1,i},s_{2,i})=(s_{0,i} \wedge \overline{s_{1,i}}) \wedge (\overline{s_{1,i}} \wedge s_{2,i}), h(s_{0,i},s_{1,i},s_{2,i})=(\overline{s_{0,i}} \wedge s_{1,i}) \vee (\overline{s_{0,i}} \wedge s_{2,i}), h(s_{0,i},s_{1,i},s_{2,i})=(s_{1,i} \wedge \overline{s_{2,i}}) \vee (s_{0,i} \wedge s_{1,i})$, and $h(s_{0,i},s_{1,i},s_{2,i})=(s_{0,i} \wedge \overline{s_{2,i}}) \vee (s_{1,i} \wedge s_{2,i})$.

In a second implementation of the first aspect, a code length of the Hamming code is 180, a length of the information bits is 170, all elements in a ninth row of the target parity-check matrix are 1, and the target function $h(s_{0,i}, s_{1,i}, s_{2,i})$ determines an element $s_{8,i}$ of a column vector corresponding to the not-all-zero row vector as $s_{8,i}=h(s_{0,i},s_{1,i},s_{2,i})=s_{0,i} \wedge s_{1,i}$. Herein i is an integer greater than or equal to 0 and less than 180, $i=2^7 s_{7,i}+2^6 s_{6,i}+2^5 s_{5,i}+2^4 s_{4,i}+2^3 s_{3,i}+2^2 s_{2,i}+2 s_{1,i}+s_{0,i}$, and $s_{8,i}, s_{7,i}, s_{6,i}, s_{5,i}, s_{4,i}, s_{3,i}, s_{2,i}, s_{1,i}$, and $s_{0,i}$ are respectively elements of column vectors corresponding to the row vector of the target parity-check matrix.

In a third implementation of the first aspect, a code length of the Hamming code is 128, a length of the information bits is 119, all elements $s_{8,i}$ in an eighth row of the target parity-check matrix are 1, and the target function $h(s_{0,i}, s_{1,i}, s_{2,i})$ determines an element $s_{7,i}$ of a column vector corresponding to the not-all-zero row vector as one of $s_{7,i}=h(s_{0,i},s_{1,i},s_{2,i})=s_{0,i} \wedge s_{1,i}, s_{7,i}=h(s_{0,i},s_{1,i},s_{2,i})=s_{0,i} \wedge s_{2,i}$, and $s_{7,i}=h(s_{0,i},s_{1,i},s_{2,i})=s_{1,i} \wedge s_{2,i}$. Herein i is an integer greater than or equal to 0 and less than 128, $i=2^6 s_{6,i}+2^5 s_{5,i}+2^4 s_{4,i}+2^3 s_{3,i}+2^2 s_{2,i}+2 s_{1,i}+s_{0,i}$, and $s_{7,i}, s_{6,i}, s_{5,i}, s_{4,i}, s_{3,i}, s_{2,i}, s_{1,i}$, and $s_{0,i}$ are respectively elements of column vectors corresponding to the row vector of the target parity-check matrix.

In a fourth implementation of the first aspect, a code length of the Hamming code is 64, a length of the information bits is 56, all elements $s_{7,i}$ in a seventh row of the target parity-check matrix are 1, and the target function $h(s_{0,i}, s_{1,i}, s_{2,i})$ determines an element $s_{6,i}$ of a column vector corresponding to the not-all-zero row vector as one of $s_{6,i}=h(s_{0,i},s_{1,i},s_{2,i})=s_{0,i} \wedge s_{1,i}, s_{6,i}=h(s_{0,i},s_{1,i},s_{2,i})=s_{0,i} \wedge s_{2,i}$, and $s_{6,i}=h(s_{0,i},s_{1,i},s_{2,i})=s_{1,i} \wedge s_{2,i}$. Herein i is an integer greater than or equal to 0 and less than 64, $i=2^5 s_{5,i}+2^4 s_{4,i}+2^3 s_{3,i}+2^2 s_{2,i}+2 s_{1,i}+s_{0,i}$, and $s_{6,i}, s_{5,i}, s_{4,i}, s_{3,i}, s_{2,i}$, and $s_{0,i}$ are respectively elements of column vectors corresponding to the row vector of the target parity-check matrix.

In a fifth implementation of the first aspect, the target parity-check matrix is transformed to obtain a system check matrix, and the generator matrix is determined based on the system check matrix.

In a sixth implementation of the first aspect, the predetermined function set includes a plurality of candidate functions for determining the not-all-zero row vector extended based on the target parity-check matrix.

In a seventh implementation of the first aspect, in the method, the target parity-check matrix is determined in the following manner: determining a plurality of candidate parity-check matrices based on the plurality of candidate functions; selecting a non-singular matrix from the plurality of candidate parity-check matrices, to obtain a first candidate parity-check matrix set; transforming the first candidate parity-check matrix set into a second candidate parity-check matrix set in a systematic form; determining a third parameter associated with each candidate parity-check matrix in the second candidate parity-check matrix set, where the third parameter indicates encoding complexity of the Hamming code; selecting a first group of candidate parity-check matrices from the first candidate parity-check matrix set based on the third parameter; and determining the target parity-check matrix from the first group of candidate parity-check matrices.

In an eighth implementation of the first aspect, in the method, the target parity-check matrix is determined from the first group of candidate parity-check matrices in the following manner: determining a fourth parameter associated with each candidate parity-check matrix in the first group of candidate parity-check matrices, where the fourth parameter indicates a quantity of minimum code weights of the Hamming code corresponding to each candidate parity-check matrix in the first group of candidate parity-check matrices; selecting a second group of candidate parity-check matrices from the first group of candidate parity-check matrices based on the fourth parameter; and determining the target parity-check matrix from the second group of candidate parity-check matrices.

In a ninth implementation of the first aspect, in the method, the target parity-check matrix is determined in the following manner: determining a plurality of candidate parity-check matrices based on the plurality of candidate functions; selecting a non-singular matrix from the plurality of candidate parity-check matrices, to obtain a first candidate parity-check matrix set; transforming the first candidate parity-check matrix set into a second candidate parity-check matrix set in a systematic form; determining a fourth parameter associated with each candidate parity-check matrix in the second candidate parity-check matrix set, where the fourth parameter indicates a quantity of minimum code weights of the Hamming code corresponding to each candidate parity-check matrix in the second candidate parity-check matrix set; selecting a first group of candidate parity-check matrices from the first candidate parity-check matrix set based on the fourth parameter; and determining the target parity-check matrix from the first group of candidate parity-check matrices.

In a tenth implementation of the first aspect, in the method, the target parity-check matrix is determined from the first group of candidate parity-check matrices in the following manner: determining a third parameter associated with each candidate parity-check matrix in the first group of candidate parity-check matrices, where the third parameter indicates encoding complexity of the Hamming code; selecting a second group of candidate parity-check matrices from the first group of candidate parity-check matrices, where the second group of candidate parity-check matrices has the third parameter below a predetermined threshold; and determining the target parity-check matrix from the second group of candidate parity-check matrices.

In an eleventh implementation of the first aspect, in the method, the second candidate parity-check matrix set in the systematic form is obtained through transformation in the following manner: for each candidate parity-check matrix in the first candidate parity-check matrix set, moving at least some linearly independent column vectors from right to left to the rightmost of the corresponding candidate parity-check matrix, and performing elementary row transformation, so that a right part of the corresponding candidate parity-check matrix is an identity matrix.

In a twelfth implementation of the first aspect, in the method, the target parity-check matrix is determined from the second group of candidate parity-check matrices in the following manner: determining an operation quantity of a function corresponding to each candidate parity-check matrix in the second group of candidate parity-check matrices in the function set; and determining the target parity-check matrix based on the operation quantity.

According to a second aspect of this disclosure, a decoding method is provided. The method includes: receiving a data stream; obtaining a target parity-check matrix of a Hamming code for decoding, where the target parity-check matrix is determined based on a target function for decoding, the target function is used to determine a not-all-zero row vector extended based on the target parity-check matrix, and the target function is one of a predetermined function set; and decoding the data stream by using the target parity-check matrix.

In the decoding method provided in this embodiment of this disclosure, the improved extended Hamming code is used, and the target parity-check matrix of the improved extended Hamming code is obtained based on the target function that has a smaller operation quantity and that is selected from the predetermined function set, so that such an extended Hamming code can implement lower decoding complexity and optimized performance at a decoding end without changing a codeword output by an encoding end.

In a first implementation of the second aspect, the target function $h(s_{0,i}, s_{1,i}, s_{2,i})$ determines the not-all-zero row vector based on at least some elements of first three elements $s_{0,i}, s_{1,i}$, and $s_{2,i}$ of column vectors corresponding to the not-all-zero row vector, and the predetermined function set includes one or more of the following: $h(s_{0,i}, s_{1,i}, s_{2,i}) = s_{1,i} \wedge s_{2,i}, h(s_{0,i}, s_{1,i}, s_{2,i}) = s_{0,i} \wedge s_{1,i}, h(s_{0,i}, s_{1,i}, s_{2,i}) = s_{0,i} \wedge s_{2,i}, h(s_{0,i}, s_{1,i}, s_{2,i}) = s_{0,i} \wedge s_{1,i} \wedge s_{2,i}, h(s_{0,i}, s_{1,i}, s_{2,i}) = \overline{s_{0,i}} \wedge s_{1,i} \wedge s_{2,i}, h(s_{0,i}, s_{1,i}, s_{2,i}) = s_{0,i} \wedge \overline{s_{1,i}} \wedge s_{2,i}, h(s_{0,i}, s_{1,i}, s_{2,i}) = (s_{0,i} \wedge \overline{s_{2,i}}) \vee (s_{1,i} \wedge \overline{s_{2,i}}) = (s_{0,i} \vee \overline{s_{1,i}}) \vee (\overline{s_{1,i}} \wedge s_{2,i}), h(s_{0,i}, s_{1,i}, s_{2,i}) = (\overline{s_{0,i}} \wedge s_{1,i}) \vee (\overline{s_{0,i}} \wedge s_{2,i}), h(s_{0,i}, s_{1,i}, s_{2,i}) = (s_{1,i} \wedge \overline{s_{2,i}}) \wedge (s_{0,i} \wedge s_{1,i})$, and $h(s_{0,i}, s_{1,i}, s_{2,i}) = (s_{0,i} \wedge \overline{s_{2,i}}) \wedge (s_{1,i} \wedge s_{2,i})$.

In a second implementation of the second aspect, a code length of the Hamming code is 180, a length of information bits is 170, all elements in a ninth row of the target parity-check matrix are 1, and the target function $h(s_{0,i}, s_{1,i}, s_{2,i})$ determines an element $s_{8,i}$ of a column vector corresponding to the not-all-zero row vector as $s_{8,i} = h(s_{0,i}, s_{1,i}, s_{2,i}) = s_{0,i} \wedge s_{1,i}$. Herein i is an integer greater than or equal to 0 and less than 180, $i = 2^7 s_{7,i} + 2^6 s_{6,i} + 2^5 s_{5,i} + 2^4 s_{4,i} + 2^3 s_{3,i} + 2^2 s_{2,i} + 2 s_{1,i} + s_{0,i}$, and $s_{8,i}, s_{7,i}, s_{6,i}, s_{5,i}, s_{4,i}, s_{3,i}, s_{2,i}, s_{1,i}$, and $s_{0,i}$ are respectively elements of column vectors corresponding to the row vector of the target parity-check matrix.

In a third implementation of the second aspect, a code length of the Hamming code is 128, a length of information bits is 119, all elements $s_{8,i}$ in an eighth row of the target parity-check matrix are 1, and the target function $h(s_{0,i}, s_{1,i}, s_{2,i})$ determines an element $s_{7,i}$ of a column vector corresponding to the not-all-zero row vector as one of $s_{7,i}=h(s_{0,i},s_{1,i},s_{2,i})=s_{0,i}\wedge s_{1,i}$, $s_{7,i}=h(s_{0,i},s_{1,i},s_{2,i})=s_{0,i}\wedge s_{2,i}$, and $s_{7,i}=h(s_{0,i},s_{1,i},s_{2,i})=s_{1,i}$. Herein i is an integer greater than or equal to 0 and less than 128, $i=2^6 s_{6,i}+2^5 s_{5,i}+2^4 s_{4,i}+2^3 s_{3,i}+2^2 s_{2,i}+2 s_{1,i}+s_{0,i}$, and $s_{7,i}, s_{6,i}, s_{5,i}, s_{4,i}, s_{3,i}, s_{2,i}, s_{1,i}$, and $s_{0,i}$ are respectively elements of column vectors corresponding to the row vector of the target parity-check matrix.

In a fourth implementation of the second aspect, a code length of the Hamming code is 64, a length of the information bits is 56, all elements $s_{7,i}$ in a seventh row of the target parity-check matrix are 1, and the target function $h(s_{0,i}, s_{1,i}, s_{2,i})$ determines an element $s_{6,i}$ of a column vector corresponding to the not-all-zero row vector as one of $s_{6,i}=h(s_{0,i},s_{1,i},s_{2,i})=s_{0,i}\wedge s_{1,i}$, $s_{6,i}=h(s_{0,i},s_{1,i},s_{2,i})=s_{0,i}\wedge s_{2,i}$, and $s_{6,i}=h(s_{0,i},s_{1,i},s_{2,i})=s_{1,i}\wedge s_{2,i}$. Herein i is an integer greater than or equal to 0 and less than 64, $i=2^5 s_{5,i}+2^4 s_{4,i}+2^3 s_{3,i}+2^2 s_{2,i}+2 s_{1,i}+s_{0,i}$, and $s_{6,i}, s_{5,i}, s_{4,i}, s_{3,i}, s_{2,i}, s_{1,i}$, and $s_{0,i}$ are respectively elements of column vectors corresponding to the row vector of the target parity-check matrix.

In a fifth implementation of the second aspect, the predetermined function set includes a plurality of candidate functions for determining the not-all-zero row vector extended based on the target parity-check matrix.

In a sixth implementation of the second aspect, in the method, the target parity-check matrix is determined in the following manner: determining a plurality of candidate parity-check matrices based on the plurality of candidate functions; selecting a non-singular matrix from the plurality of candidate parity-check matrices, to obtain a first candidate parity-check matrix set; transforming the first candidate parity-check matrix set into a second candidate parity-check matrix set in a systematic form; determining a third parameter associated with each candidate parity-check matrix in the second candidate parity-check matrix set, where the third parameter indicates encoding complexity of the Hamming code; selecting a first group of candidate parity-check matrices from the first candidate parity-check matrix set based on the third parameter; and determining the target parity-check matrix from the first group of candidate parity-check matrices.

In a seventh implementation of the second aspect, in the method, the target parity-check matrix is determined from the first group of candidate parity-check matrices in the following manner: determining a fourth parameter associated with each candidate parity-check matrix in the first group of candidate parity-check matrices, where the fourth parameter indicates a quantity of minimum code weights of the Hamming code corresponding to each candidate parity-check matrix in the first group of candidate parity-check matrices; selecting a second group of candidate parity-check matrices from the first group of candidate parity-check matrices based on the fourth parameter; and determining the target parity-check matrix from the second group of candidate parity-check matrices.

In an eighth implementation of the second aspect, in the method, the target parity-check matrix is determined in the following manner: determining a plurality of candidate parity-check matrices based on the plurality of candidate functions; selecting a non-singular matrix from the plurality of candidate parity-check matrices, to obtain a first candidate parity-check matrix set; transforming the first candidate parity-check matrix set into a second candidate parity-check matrix set in a systematic form; determining a fourth parameter associated with each candidate parity-check matrix in the second candidate parity-check matrix set, where the fourth parameter indicates a quantity of minimum code weights of the Hamming code corresponding to each candidate parity-check matrix in the second candidate parity-check matrix set; selecting a first group of candidate parity-check matrices from the first candidate parity-check matrix set based on the fourth parameter; and determining the target parity-check matrix from the first group of candidate parity-check matrices.

In a ninth implementation of the second aspect, in the method, the target parity-check matrix is determined from the first group of candidate parity-check matrices in the following manner: determining a third parameter associated with each candidate parity-check matrix in the first group of candidate parity-check matrices, where the third parameter indicates encoding complexity of the Hamming code; selecting a second group of candidate parity-check matrices from the first group of candidate parity-check matrices, where the second group of candidate parity-check matrices has the third parameter below a predetermined threshold; and determining the target parity-check matrix from the second group of candidate parity-check matrices.

In a tenth implementation of the second aspect, in the method, the second candidate parity-check matrix set in the systematic form is obtained through transformation in the following manner: for each candidate parity-check matrix in the first candidate parity-check matrix set, moving at least some linearly independent column vectors from right to left to the rightmost of the corresponding candidate parity-check matrix, and performing elementary row transformation, so that a right part of the corresponding candidate parity-check matrix is an identity matrix.

In an eleventh implementation of the second aspect, in the method, the target parity-check matrix is determined from the second group of candidate parity-check matrices in the following manner: determining an operation quantity of a function corresponding to each candidate parity-check matrix in the second group of candidate parity-check matrices in the function set; and determining the target parity-check matrix based on the operation quantity.

In a twelfth implementation of the second aspect, in the method, the decoding the data stream by using the target parity-check matrix includes: calculating a syndrome for the data based on the target parity-check matrix; and if the syndrome is zero, outputting at least some bits of the data stream as decoded information bits; or if the syndrome is not zero, determining whether there is a first column vector equal to the syndrome in the target parity-check matrix: if there is the first column vector equal to the syndrome in the target parity-check matrix, flipping bits corresponding to the first column vector in the data stream; and outputting at least some bits of the data stream after the flipping as the decoded information bits.

According to a third aspect of this disclosure, an encoding device is provided. The encoding device includes at least one processor and at least one memory including computer program code. The at least one memory and the computer program code are configured to work with the at least one processor to enable the encoding device to perform the method in the first aspect of this disclosure.

According to a fourth aspect of this disclosure, a decoding device is provided. The decoding device includes at least one processor and at least one memory including computer program code. The at least one memory and the computer program code are configured to work with the at least one processor to enable the decoding device to perform the method in the second aspect of this disclosure.

According to the fifth aspect of this disclosure, a communication system is provided. The communication system includes: the encoding device according to the third aspect of this disclosure and the decoding device according to the fourth aspect of this disclosure.

Based on the improved extended Hamming code provided in embodiments of this disclosure, for the encoding device, the decoding device, and the communication system including the encoding device and the decoding device, a bit error rate can be significantly reduced, and a capability of resisting channel interference can be improved, thereby improving system performance.

BRIEF DESCRIPTION OF DRAWINGS

The foregoing and other features, advantages, and aspects of embodiments of this disclosure become more obvious with reference to the accompanying drawings and with reference to the following detailed description. In the accompanying drawings, same or similar reference numerals represent same or similar elements.

DESCRIPTION OF EMBODIMENTS

Figure 1:
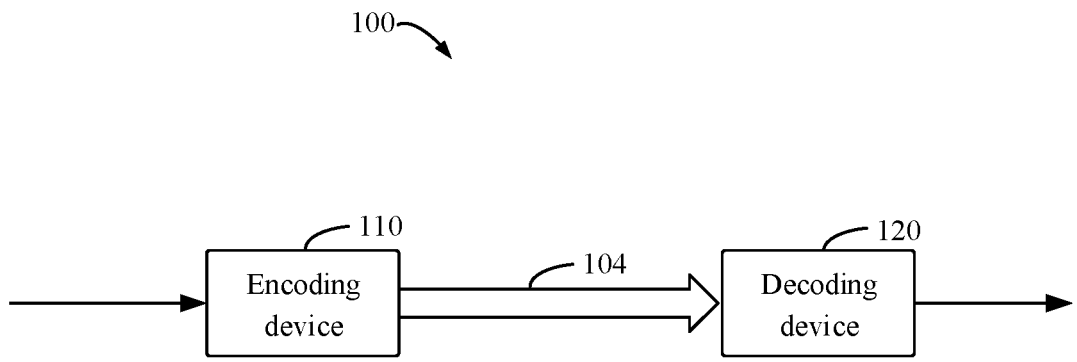
FIG. 1 is a schematic diagram of an architecture of a communication system according to an example embodiment of this disclosure.

The following describes some example embodiments with reference to the accompanying drawings. Although some example embodiments of this disclosure are shown in the accompanying drawings, it should be understood that this disclosure may be implemented in various forms, and should not be construed as being limited to the embodiments described herein. On the contrary, these embodiments are provided so that this disclosure can be thoroughly and completely understood. It should be understood that the accompanying drawings and embodiments of this disclosure are merely used as examples, but are not intended to limit the protection scope of this disclosure.

The term "include" and variants thereof used in this specification indicate open inclusion, that is, "include but is not limited to". Unless otherwise stated, the term "or" means "and/or". The term "based on" means "at least partially based on". The terms "example embodiments" and "some embodiments" represent "at least one example embodiment". Other explicit and implicit definitions may also be included below.

A minimum Hamming distance of a conventional Hamming code is 3, and the conventional Hamming code can detect and correct a one-bit error. To enhance performance of the Hamming code, an additional parity bit may be added to the conventional Hamming code, for example, the Hamming code $(2^m-1, 2^m-1-m)$, to obtain a single-bit extended Hamming code (eHamming) $(2^m, 2^m-1-m)$ that is also referred to as an "extended Hamming code" or a "conventional extended Hamming code" in the following. The conventional extended Hamming code has a parity-check matrix with a size of $(m+1)\times 2^m$, which may be represented as follows:

$$H_e = \begin{bmatrix} H & 0 \\ 1 & 1 \end{bmatrix} \quad (1)$$

Herein, H represents the parity-check matrix of the conventional Hamming code (Hamming) $(2^m-1, 2^m-1-m)$, a size of the parity-check matrix is $m\times(2^m-1)$, 1 represents an all-one row vector with a length of $2^m-1$, and 0 represents an m-dimensional all-zero column vector. Clearly, a last row of H e is an all-one row vector with a length of $2^m$.

A minimum Hamming distance of the conventional extended Hamming code (eHamming) is 4, and can detect a two-bit error and correct a one-bit error. A code rate of the conventional extended Hamming code (eHamming) $(2^m, 2^m-1-m)$ is $R_e=(2^m-1-m)/2^m$. To implement a lower code rate, q information bits may be set to 0 by using a shortening (shorten) technology, to obtain a shortened extended Hamming code $(2^m-q, 2^m-1-m-q)$, where $0\leq q<(2^m-1)/2$.

Although a function expression of the conventional extended Hamming code (eHamming) is simple, performance of the conventional extended Hamming code needs to be further improved. In addition, in cases of some specific code lengths, a length of shortened bits of the conventional extended Hamming code is longer. For example, for a conventional extended Hamming code (eHamming) (180, 170), a code parameter of the conventional extended Hamming code is m=9, and a length of shortened bits is q=332, where q is almost twice an information length k=170. In view of this, the Hamming code needs to be improved and optimized.

According to embodiments of this disclosure, an improved double-extended Hamming code and encoding and decoding methods based on the improved double-extended Hamming code are provided. A target parity-check matrix of the improved double-extended Hamming code is obtained based on a target function that has a smaller operation quantity and that is selected from a predetermined function set, so that such an extended Hamming code can implement lower encoding and decoding complexity and a lower bit error rate in specific code space and provide optimized performance. In this way, an interference resistance capability of the communication system is improved.

FIG. 1 is a schematic diagram of an architecture of a communication system 100 according to an example embodiment of this disclosure. As shown in FIG. 1, the communication system 100 includes an encoding device 110, a decoding device 120, and a channel 104 connecting the encoding device 110 and the decoding device 120. The architecture of the communication system 100 is merely an example and is not intended to imply any limitation on the scope of this disclosure. Embodiments of this disclosure may also be implemented in other communication systems. In addition, it should be further understood that the communication system 100 may further include another element or entity configured to receive, send, encode, decode, or the like information or data. These elements or entities are not shown in the communication system 100 for simplicity of description. However, it does not mean that embodiments of this disclosure do not include these elements or entities.

The encoding device 110 serves as a transmit end of information or data. The encoding device 110 obtains to-be-sent information bit sequence u from a source (not shown), encodes the information bit sequence u into a data stream c, and sends the data stream c to the decoding device 120 through the channel 104. The channel 104 may be implemented in various forms such as wired or wireless connection, including but not limited to an optical fiber, a cable, or a radio wave. In a process of transmitting information or a data stream, noise in the channel 104 or noise introduced by the transmit end and/or the receive end is usually superimposed, so that an error exists in the data stream received by the receive end. By using various encoding and decoding technologies, interference resistance performance of the communication system 100 can be well enhanced.

The encoding device 110 may encode information in various encoding manners. In some embodiments, the encoding device 110 may use a Hamming code as an encoding technology, and correspondingly the decoding device 120 also uses the Hamming code as a decoding technology. The Hamming code corresponds to a generator matrix G for encoding and a parity-check matrix H for decoding. The generator matrix G is determined based on the parity-check matrix H. In some embodiments, the generator matrix G is configured for the encoding device 110. Before sending the information bit sequence u, the encoding device 110 encodes the information bit sequence u by using the generator matrix G, to generate the encoded data stream c.

The decoding device 120 serves as a receive end. The decoding device 120 receives the data stream c from the encoding device 110 through the channel 104, and decodes the data stream c to obtain an original information bit sequence u sent by the encoding device 110. The decoding device 120 may decode the data stream c in a decoding manner corresponding to an encoding manner of the encoding device 110. In some embodiments, the decoding device 120 may use the Hamming code as a decoding technology. In such an embodiment, the parity-check matrix H corresponding to the generator matrix G of the Hamming code may be configured for the decoding device 120. After receiving the data stream c, the decoding device 120 first determines a syndrome T based on the data stream c and the parity-check matrix H. If the syndrome is zero, that is, T=0, it indicates that the data stream c does not need to be corrected. If the syndrome is not zero, it indicates that an error exists in the data stream. In this case, the decoding device 120 corrects the data stream by flipping bits corresponding to a column vector that is consistent with the syndrome and that is in the parity-check matrix H, to obtain the original information bit sequence u.

According to an example embodiment of this disclosure, an optimized Hamming code is provided, to further shorten a bit length and implement double extension based on a conventional Hamming code. The optimized Hamming code is generated by using a relatively simple function, so that the Hamming code has lower design complexity. In addition, the optimized Hamming code can reduce encoding and decoding complexity for various code lengths and information bit lengths, and provide good interference resistance performance of a system.

A code length of the Hamming code (DE-Hamming) in this disclosure is $2^m-q$, and a length of information bits is $2^m-2-m-q$, where m is a positive integer, m≥3, and $0 \leq q < (2^m-1)/2$. A parity-check matrix $H_{DE}$ of the Hamming code is a matrix of $m \times (2^m-1-q)$, and may be expressed as follows:

$$H_{DE} = \begin{bmatrix} 0 & H \\ D \\ 1 \end{bmatrix} \quad (2)$$

Herein H is a parity-check matrix of a conventional Hamming code whose code length is $2^m-1-q$ and whose information bit length is $2^m-1-m-q$, 1 represents an all-one row vector with a length of $2^m-q$, 0 represents an m-dimensional all-zero column vector, and D represents a not-all-zero row vector that is to be extended and whose length is $2^m-q$.

It may be determined from Formula (2) that the row vectors D and 1 are extended on the parity-check matrix of the conventional Hamming code, to obtain a parity-check matrix $H_{DE}$ of the Hamming code (DE-Hamming) in this disclosure. In other words, the parity-check matrix $H_{DE}$ includes an (m+2)-dimensional row vector. According to embodiments of this disclosure, an appropriate function is selected to generate the not-all-zero row vector D for extension, to effectively reduce design complexity of the Hamming code (DE-Hamming) in this disclosure, so that the Hamming code in this disclosure has better encoding and decoding performance than the conventional Hamming code and a conventional extended Hamming code (eHamming).

To determine the not-all-zero row vector D, a function g is considered, and the function may map an (m+2)-dimensional row vector of the parity-check matrix $H_{DE}$ to an (m+2)-dimensional column vector. Specifically, the function g maps the (m+2)-dimensional column vector based on an integer i, where $0 \leq i \leq 2^m-q-1$. Herein the function g may be determined as follows:

$$g(i) = \begin{bmatrix} s_{0,i} \\ s_{1,i} \\ \vdots \\ s_{m-1,i} \\ s_{m,i} \\ 1 \end{bmatrix} \quad (3)$$

Herein $i=2^{m-1}s_{m-1,i}+2^{m-2}s_{m-2,i}+ \ldots +2s_{1,i}+s_{0,i}$, $s_{0,i}$, $s_{1,i}, \ldots$, and $s_{m-1,i}$ respectively represent elements of column vectors corresponding to a row vector of the parity-check matrix H, $s_{m,i}$ represent an element of a column vector corresponding to the not-all-zero row vector D, and all elements of a last column vector are 1.

Further, a function h may be used to determine $s_{m,i}$. This is described as follows:

$$s_{m,i} = h(s_{0,i}, s_{1,i}, s_{2,i}) \quad (4)$$

The function h has a 3-bit input, that is, $s_{0,i}$, $s_{1,i}$, and $s_{2,i}$, and outputs a 1-bit element $s_{m,i}$.

Clearly, the function h has $2^8$ input-output possibilities that form a set of the function h. The set of the function h may be represented by a truth table. Because a length of the not-all-zero row vector D is $2^m-q$, an output of the function h includes at least one value "1". In addition, cases in which the output of the function h includes seven, six, and five 1 s are respectively equivalent to cases in which the output of the function h includes one, two, and three values "1". Therefore, in an example embodiment, only cases in which the output of the function h includes one, two, three, and four values "1" are considered. In this way, the function h has $C_8^1+C_8^2+C_8^4+C_8^4=8+28+56+70=162$ possibilities. In other words, the set of the function h includes 162 functions, as shown in Table 1 to Table 4. Herein, the function $h_j$ represents a $j^{th}$ case, where $0 < j \leq 162$.

TABLE 1

The output of the function h includes one value "1"

| Sequence number | i %8 | 0 | 1 | 2 | 3 | 4 | 5 | 6 | 7 | Logical expression |
|---|---|---|---|---|---|---|---|---|---|---|
| 0 | $h_1$ | 1 | 0 | 0 | 0 | 0 | 0 | 0 | 0 | $h = \overline{s_{0,i}} \wedge \overline{s_{1,i}} \wedge \overline{s_{2,i}}$ |
| 1 | $h_2$ | 0 | 1 | 0 | 0 | 0 | 0 | 0 | 0 | $h = s_{0,i} \wedge \overline{s_{1,i}} \wedge \overline{s_{2,i}}$ |
| 2 | $h_3$ | 0 | 0 | 1 | 0 | 0 | 0 | 0 | 0 | $h = \overline{s_{0,i}} \wedge s_{1,i} \wedge \overline{s_{2,i}}$ |
| 3 | $h_4$ | 0 | 0 | 0 | 1 | 0 | 0 | 0 | 0 | $h = s_{0,i} \wedge s_{1,i} \wedge \overline{s_{2,i}}$ |
| 4 | $h_5$ | 0 | 0 | 0 | 0 | 1 | 0 | 0 | 0 | $h = \overline{s_{0,i}} \wedge \overline{s_{1,i}} \wedge s_{2,i}$ |
| 5 | $h_6$ | 0 | 0 | 0 | 0 | 0 | 1 | 0 | 0 | $h = s_{0,i} \wedge \overline{s_{1,i}} \wedge s_{2,i}$ |
| 6 | $h_7$ | 0 | 0 | 0 | 0 | 0 | 0 | 1 | 0 | $h = \overline{s_{0,i}} \wedge s_{1,i} \wedge s_{2,i}$ |
| 7 | $h_8$ | 0 | 0 | 0 | 0 | 0 | 0 | 0 | 1 | $h = s_{0,i} \wedge s_{1,i} \wedge s_{2,i}$ |

TABLE 2

The output of the function h includes two values "1"

| Sequence number | i %8 | 0 | 1 | 2 | 3 | 4 | 5 | 6 | 7 | Logical expression |
|---|---|---|---|---|---|---|---|---|---|---|
| 0 | $h_9$ | 1 | 1 | 0 | 0 | 0 | 0 | 0 | 0 | $h = (\overline{s_{0,i}} \wedge \overline{s_{1,i}} \wedge \overline{s_{2,i}}) \vee (s_{0,i} \wedge \overline{s_{1,i}} \wedge \overline{s_{2,i}}) = \overline{s_{1,i}} \wedge \overline{s_{2,i}}$ |
| 1 | $h_{10}$ | 1 | 0 | 1 | 0 | 0 | 0 | 0 | 0 | $h = (\overline{s_{0,i}} \wedge \overline{s_{1,i}} \wedge \overline{s_{2,i}}) \vee (\overline{s_{0,i}} \wedge s_{1,i} \wedge \overline{s_{2,i}}) = \overline{s_{0,i}} \wedge \overline{s_{2,i}}$ |
| 2 | $h_{11}$ | 0 | 1 | 1 | 0 | 0 | 0 | 0 | 0 | $h = (s_{0,i} \wedge \overline{s_{1,i}} \wedge \overline{s_{2,i}}) \vee (\overline{s_{0,i}} \wedge s_{1,i} \wedge \overline{s_{2,i}})$ |
| 3 | $h_{12}$ | 1 | 0 | 0 | 1 | 0 | 0 | 0 | 0 | $h = (\overline{s_{0,i}} \wedge \overline{s_{1,i}} \wedge \overline{s_{2,i}}) \vee (s_{0,i} \wedge s_{1,i} \wedge \overline{s_{2,i}})$ |
| 4 | $h_{13}$ | 0 | 1 | 0 | 1 | 0 | 0 | 0 | 0 | $h = (s_{0,i} \wedge \overline{s_{1,i}} \wedge \overline{s_{2,i}}) \vee (s_{0,i} \wedge s_{1,i} \wedge \overline{s_{2,i}}) = s_{0,i} \wedge \overline{s_{2,i}}$ |
| 5 | $h_{14}$ | 0 | 0 | 1 | 1 | 0 | 0 | 0 | 0 | $h = (\overline{s_{0,i}} \wedge s_{1,i} \wedge \overline{s_{2,i}}) \vee (s_{0,i} \wedge s_{1,i} \wedge \overline{s_{2,i}}) = s_{1,i} \wedge \overline{s_{2,i}}$ |
| 6 | $h_{15}$ | 1 | 0 | 0 | 0 | 1 | 0 | 0 | 0 | $h = (\overline{s_{0,i}} \wedge \overline{s_{1,i}} \wedge \overline{s_{2,i}}) \vee (\overline{s_{0,i}} \wedge \overline{s_{1,i}} \wedge s_{2,i}) = \overline{s_{0,i}} \wedge \overline{s_{1,i}}$ |
| 7 | $h_{16}$ | 0 | 1 | 0 | 0 | 1 | 0 | 0 | 0 | $h = (s_{0,i} \wedge \overline{s_{1,i}} \wedge \overline{s_{2,i}}) \vee (\overline{s_{0,i}} \wedge \overline{s_{1,i}} \wedge s_{2,i})$ |
| 8 | $h_{17}$ | 0 | 0 | 1 | 0 | 1 | 0 | 0 | 0 | $h = (\overline{s_{0,i}} \wedge s_{1,i} \wedge \overline{s_{2,i}}) \vee (\overline{s_{0,i}} \wedge \overline{s_{1,i}} \wedge s_{2,i})$ |
| 9 | $h_{18}$ | 0 | 0 | 0 | 1 | 1 | 0 | 0 | 0 | $h = (s_{0,i} \wedge s_{1,i} \wedge \overline{s_{2,i}}) \vee (\overline{s_{0,i}} \wedge \overline{s_{1,i}} \wedge s_{2,i})$ |
| 10 | $h_{19}$ | 1 | 0 | 0 | 0 | 0 | 1 | 0 | 0 | $h = (\overline{s_{0,i}} \wedge \overline{s_{1,i}} \wedge \overline{s_{2,i}}) \vee (s_{0,i} \wedge \overline{s_{1,i}} \wedge s_{2,i})$ |
| 11 | $h_{20}$ | 0 | 1 | 0 | 0 | 0 | 1 | 0 | 0 | $h = (s_{0,i} \wedge \overline{s_{1,i}} \wedge \overline{s_{2,i}}) \vee (s_{0,i} \wedge \overline{s_{1,i}} \wedge s_{2,i}) = s_{0,i} \wedge \overline{s_{1,i}}$ |
| 12 | $h_{21}$ | 0 | 0 | 1 | 0 | 0 | 1 | 0 | 0 | $h = (\overline{s_{0,i}} \wedge s_{1,i} \wedge \overline{s_{2,i}}) \vee (s_{0,i} \wedge \overline{s_{1,i}} \wedge s_{2,i})$ |
| 13 | $h_{22}$ | 0 | 0 | 0 | 1 | 0 | 1 | 0 | 0 | $h = (s_{0,i} \wedge s_{1,i} \wedge \overline{s_{2,i}}) \vee (s_{0,i} \wedge \overline{s_{1,i}} \wedge s_{2,i})$ |
| 14 | $h_{23}$ | 0 | 0 | 0 | 0 | 1 | 1 | 0 | 0 | $h = (\overline{s_{0,i}} \wedge \overline{s_{1,i}} \wedge s_{2,i}) \vee (s_{0,i} \wedge \overline{s_{1,i}} \wedge s_{2,i}) = \overline{s_{1,i}} \wedge s_{2,i}$ |
| 15 | $h_{24}$ | 1 | 0 | 0 | 0 | 0 | 0 | 1 | 0 | $h = (\overline{s_{0,i}} \wedge \overline{s_{1,i}} \wedge \overline{s_{2,i}}) \vee (\overline{s_{0,i}} \wedge s_{1,i} \wedge s_{2,i})$ |
| 16 | $h_{25}$ | 0 | 1 | 0 | 0 | 0 | 0 | 1 | 0 | $h = (s_{0,i} \wedge \overline{s_{1,i}} \wedge \overline{s_{2,i}}) \vee (\overline{s_{0,i}} \wedge s_{1,i} \wedge s_{2,i})$ |
| 17 | $h_{26}$ | 0 | 0 | 1 | 0 | 0 | 0 | 1 | 0 | $h = (\overline{s_{0,i}} \wedge s_{1,i} \wedge \overline{s_{2,i}}) \vee (\overline{s_{0,i}} \wedge s_{1,i} \wedge s_{2,i}) = \overline{s_{0,i}} \wedge s_{1,i}$ |
| 18 | $h_{27}$ | 0 | 0 | 0 | 1 | 0 | 0 | 1 | 0 | $h = (s_{0,i} \wedge s_{1,i} \wedge \overline{s_{2,i}}) \vee (\overline{s_{0,i}} \wedge s_{1,i} \wedge s_{2,i})$ |
| 19 | $h_{28}$ | 0 | 0 | 0 | 0 | 1 | 0 | 1 | 0 | $h = (\overline{s_{0,i}} \wedge \overline{s_{1,i}} \wedge s_{2,i}) \vee (\overline{s_{0,i}} \wedge s_{1,i} \wedge s_{2,i}) = \overline{s_{0,i}} \wedge s_{2,i}$ |
| 20 | $h_{29}$ | 0 | 0 | 0 | 0 | 0 | 1 | 1 | 0 | $h = (s_{0,i} \wedge \overline{s_{1,i}} \wedge s_{2,i}) \vee (\overline{s_{0,i}} \wedge s_{1,i} \wedge s_{2,i})$ |
| 21 | $h_{30}$ | 1 | 0 | 0 | 0 | 0 | 0 | 0 | 1 | $h = (\overline{s_{0,i}} \wedge \overline{s_{1,i}} \wedge \overline{s_{2,i}}) \vee (s_{0,i} \wedge s_{1,i} \wedge s_{2,i})$ |
| 22 | $h_{31}$ | 0 | 1 | 0 | 0 | 0 | 0 | 0 | 1 | $h = (s_{0,i} \wedge \overline{s_{1,i}} \wedge \overline{s_{2,i}}) \vee (s_{0,i} \wedge s_{1,i} \wedge s_{2,i})$ |

TABLE 2-continued

The output of the function h includes two values "1"

| Sequence number | i %8 | 0 | 1 | 2 | 3 | 4 | 5 | 6 | 7 | Logical expression |
|---|---|---|---|---|---|---|---|---|---|---|
| 23 | $h_{32}$ | 0 | 0 | 1 | 0 | 0 | 0 | 0 | 1 | $h = (\overline{s_{0,i}} \wedge s_{1,i} \wedge \overline{s_{2,i}}) \vee (s_{0,i} \wedge s_{1,i} \wedge s_{2,i})$ |
| 24 | $h_{33}$ | 0 | 0 | 0 | 1 | 0 | 0 | 0 | 1 | $h = (s_{0,i} \wedge s_{1,i} \wedge \overline{s_{2,i}}) \vee (s_{0,i} \wedge s_{1,i} \wedge s_{2,i}) = s_{0,i} \wedge s_{1,i}$ |
| 25 | $h_{34}$ | 0 | 0 | 0 | 0 | 1 | 0 | 0 | 1 | $h = (\overline{s_{0,i}} \wedge \overline{s_{1,i}} \wedge s_{2,i}) \vee (s_{0,i} \wedge s_{1,i} \wedge s_{2,i})$ |
| 26 | $h_{35}$ | 0 | 0 | 0 | 0 | 0 | 1 | 0 | 1 | $h = (s_{0,i} \wedge \overline{s_{1,i}} \wedge s_{2,i}) \vee (s_{0,i} \wedge s_{1,i} \wedge s_{2,i}) = s_{0,i} \wedge s_{2,i}$ |
| 27 | $h_{36}$ | 0 | 0 | 0 | 0 | 0 | 0 | 1 | 1 | $h = (\overline{s_{0,i}} \wedge s_{1,i} \wedge s_{2,i}) \vee (s_{0,i} \wedge s_{1,i} \wedge s_{2,i}) = s_{1,i} \wedge s_{2,i}$ |

TABLE 3

The output of the function h includes three values "1"

| Sequence number | i %8 | 0 | 1 | 2 | 3 | 4 | 5 | 6 | 7 | Logical expression |
|---|---|---|---|---|---|---|---|---|---|---|
| 0 | $h_{37}$ | 1 | 1 | 1 | 0 | 0 | 0 | 0 | 0 | $h = (\overline{s_{0,i}} \wedge \overline{s_{1,i}} \wedge \overline{s_{2,i}}) \vee (s_{0,i} \wedge \overline{s_{1,i}} \wedge \overline{s_{2,i}}) \vee (\overline{s_{0,i}} \wedge s_{1,i} \wedge \overline{s_{2,i}}) = (\overline{s_{1,i}} \wedge \overline{s_{2,i}}) \vee (\overline{s_{0,i}} \wedge \overline{s_{2,i}})$ |
| 1 | $h_{38}$ | 1 | 1 | 0 | 1 | 0 | 0 | 0 | 0 | $h = (\overline{s_{0,i}} \wedge \overline{s_{1,i}} \wedge \overline{s_{2,i}}) \vee (s_{0,i} \wedge \overline{s_{1,i}} \wedge \overline{s_{2,i}}) \vee (s_{0,i} \wedge s_{1,i} \wedge \overline{s_{2,i}}) = (\overline{s_{1,i}} \wedge \overline{s_{2,i}}) \vee (s_{0,i} \wedge \overline{s_{2,i}})$ |
| 2 | $h_{39}$ | 1 | 0 | 1 | 1 | 0 | 0 | 0 | 0 | $h = (\overline{s_{0,i}} \wedge \overline{s_{1,i}} \wedge \overline{s_{2,i}}) \vee (\overline{s_{0,i}} \wedge s_{1,i} \wedge \overline{s_{2,i}}) \vee (s_{0,i} \wedge s_{1,i} \wedge \overline{s_{2,i}}) = (\overline{s_{0,i}} \wedge \overline{s_{2,i}}) \vee (s_{1,i} \wedge \overline{s_{2,i}})$ |
| 3 | $h_{40}$ | 0 | 1 | 1 | 1 | 0 | 0 | 0 | 0 | $h = (s_{0,i} \wedge \overline{s_{1,i}} \wedge \overline{s_{2,i}}) \vee (\overline{s_{0,i}} \wedge s_{1,i} \wedge \overline{s_{2,i}}) \vee (s_{0,i} \wedge s_{1,i} \wedge \overline{s_{2,i}}) = (s_{0,i} \wedge \overline{s_{2,i}}) \vee (s_{1,i} \wedge \overline{s_{2,i}})$ |
| 4 | $h_{41}$ | 1 | 1 | 0 | 0 | 1 | 0 | 0 | 0 | $h = (\overline{s_{0,i}} \wedge \overline{s_{1,i}} \wedge \overline{s_{2,i}}) \vee (s_{0,i} \wedge \overline{s_{1,i}} \wedge \overline{s_{2,i}}) \vee (\overline{s_{0,i}} \wedge \overline{s_{1,i}} \wedge s_{2,i}) = (\overline{s_{1,i}} \wedge \overline{s_{2,i}}) \vee (\overline{s_{0,i}} \wedge \overline{s_{1,i}})$ |
| 5 | $h_{42}$ | 1 | 0 | 1 | 0 | 1 | 0 | 0 | 0 | $h = (\overline{s_{0,i}} \wedge \overline{s_{1,i}} \wedge \overline{s_{2,i}}) \vee (\overline{s_{0,i}} \wedge s_{1,i} \wedge \overline{s_{2,i}}) \vee (\overline{s_{0,i}} \wedge \overline{s_{1,i}} \wedge s_{2,i}) = (\overline{s_{0,i}} \wedge \overline{s_{2,i}}) \vee (\overline{s_{0,i}} \wedge \overline{s_{1,i}})$ |
| 6 | $h_{43}$ | 0 | 1 | 1 | 0 | 1 | 0 | 0 | 0 | $h = (s_{0,i} \wedge \overline{s_{1,i}} \wedge \overline{s_{2,i}}) \vee (\overline{s_{0,i}} \wedge s_{1,i} \wedge \overline{s_{2,i}}) \vee (\overline{s_{0,i}} \wedge \overline{s_{1,i}} \wedge s_{2,i})$ |
| 7 | $h_{44}$ | 1 | 0 | 0 | 1 | 1 | 0 | 0 | 0 | $h = (\overline{s_{0,i}} \wedge \overline{s_{1,i}} \wedge \overline{s_{2,i}}) \vee (s_{0,i} \wedge s_{1,i} \wedge \overline{s_{2,i}}) \vee (\overline{s_{0,i}} \wedge \overline{s_{1,i}} \wedge s_{2,i}) = (\overline{s_{0,i}} \wedge \overline{s_{1,i}}) \vee (s_{0,i} \wedge s_{1,i} \wedge \overline{s_{2,i}})$ |
| 8 | $h_{45}$ | 0 | 1 | 0 | 1 | 1 | 0 | 0 | 0 | $h = (s_{0,i} \wedge \overline{s_{1,i}} \wedge \overline{s_{2,i}}) \vee (s_{0,i} \wedge s_{1,i} \wedge \overline{s_{2,i}}) \vee (\overline{s_{0,i}} \wedge \overline{s_{1,i}} \wedge s_{2,i}) = (s_{0,i} \wedge \overline{s_{2,i}}) \vee (\overline{s_{0,i}} \wedge \overline{s_{1,i}} \wedge s_{2,i})$ |
| 9 | $h_{46}$ | 0 | 0 | 1 | 1 | 1 | 0 | 0 | 0 | $h = (\overline{s_{0,i}} \wedge s_{1,i} \wedge \overline{s_{2,i}}) \vee (s_{0,i} \wedge s_{1,i} \wedge \overline{s_{2,i}}) \vee (\overline{s_{0,i}} \wedge \overline{s_{1,i}} \wedge s_{2,i}) = (\overline{s_{0,i}} \wedge \overline{s_{2,i}}) \vee (\overline{s_{0,i}} \wedge \overline{s_{1,i}} \wedge s_{2,i})$ |
| 10 | $h_{47}$ | 1 | 1 | 0 | 0 | 0 | 1 | 0 | 0 | $h = (\overline{s_{0,i}} \wedge \overline{s_{1,i}} \wedge \overline{s_{2,i}}) \vee (s_{0,i} \wedge \overline{s_{1,i}} \wedge \overline{s_{2,i}}) \vee (s_{0,i} \wedge \overline{s_{1,i}} \wedge s_{2,i}) = (\overline{s_{1,i}} \wedge \overline{s_{2,i}}) \vee (s_{0,i} \wedge \overline{s_{1,i}})$ |
| 11 | $h_{48}$ | 1 | 0 | 1 | 0 | 0 | 1 | 0 | 0 | $h = (\overline{s_{0,i}} \wedge \overline{s_{1,i}} \wedge \overline{s_{2,i}}) \vee (\overline{s_{0,i}} \wedge s_{1,i} \wedge \overline{s_{2,i}}) \vee (s_{0,i} \wedge \overline{s_{1,i}} \wedge s_{2,i}) = (\overline{s_{0,i}} \wedge \overline{s_{2,i}}) \vee (s_{0,i} \wedge \overline{s_{1,i}} \wedge s_{2,i})$ |
| 12 | $h_{49}$ | 0 | 1 | 1 | 0 | 0 | 1 | 0 | 0 | $h = (s_{0,i} \wedge \overline{s_{1,i}} \wedge \overline{s_{2,i}}) \vee (\overline{s_{0,i}} \wedge s_{1,i} \wedge \overline{s_{2,i}}) \vee (s_{0,i} \wedge \overline{s_{1,i}} \wedge s_{2,i}) = (s_{0,i} \wedge \overline{s_{1,i}}) \vee (\overline{s_{0,i}} \wedge s_{1,i} \wedge \overline{s_{2,i}})$ |
| 13 | $h_{50}$ | 1 | 0 | 0 | 1 | 0 | 1 | 0 | 0 | $h = (\overline{s_{0,i}} \wedge \overline{s_{1,i}} \wedge \overline{s_{2,i}}) \vee (s_{0,i} \wedge s_{1,i} \wedge \overline{s_{2,i}}) \vee (s_{0,i} \wedge \overline{s_{1,i}} \wedge s_{2,i})$ |
| 14 | $h_{51}$ | 0 | 1 | 0 | 1 | 0 | 1 | 0 | 0 | $h = (s_{0,i} \wedge \overline{s_{1,i}} \wedge \overline{s_{2,i}}) \vee (s_{0,i} \wedge s_{1,i} \wedge \overline{s_{2,i}}) \vee (s_{0,i} \wedge \overline{s_{1,i}} \wedge s_{2,i}) = (s_{0,i} \wedge \overline{s_{2,i}}) \vee (s_{0,i} \wedge \overline{s_{1,i}})$ |
| 15 | $h_{52}$ | 0 | 0 | 1 | 1 | 0 | 1 | 0 | 0 | $h = (\overline{s_{0,i}} \wedge s_{1,i} \wedge \overline{s_{2,i}}) \vee (s_{0,i} \wedge s_{1,i} \wedge \overline{s_{2,i}}) \vee (s_{0,i} \wedge \overline{s_{1,i}} \wedge s_{2,i}) = (s_{1,i} \wedge \overline{s_{2,i}}) \vee (s_{0,i} \wedge \overline{s_{1,i}} \wedge s_{2,i})$ |
| 16 | $h_{53}$ | 1 | 0 | 0 | 0 | 1 | 1 | 0 | 0 | $h = (\overline{s_{0,i}} \wedge \overline{s_{1,i}} \wedge \overline{s_{2,i}}) \vee (\overline{s_{0,i}} \wedge \overline{s_{1,i}} \wedge s_{2,i}) \vee (s_{0,i} \wedge \overline{s_{1,i}} \wedge s_{2,i}) = (\overline{s_{0,i}} \wedge \overline{s_{1,i}}) \vee (\overline{s_{1,i}} \wedge s_{2,i})$ |

TABLE 3-continued

The output of the function h includes three values "1"

| Sequence number | i %8 | 0 | 1 | 2 | 3 | 4 | 5 | 6 | 7 | Logical expression |
|---|---|---|---|---|---|---|---|---|---|---|
| 17 | $h_{54}$ | 0 | 1 | 0 | 0 | 1 | 1 | 0 | 0 | $h = (s_{0,i} \wedge \overline{s_{1,i}} \wedge \overline{s_{2,i}}) \vee (\overline{s_{0,i}} \wedge s_{1,i} \wedge s_{2,i}) \vee (s_{0,i} \wedge \overline{s_{1,i}} \wedge s_{2,i}) = (s_{0,i} \wedge \overline{s_{1,i}}) \vee (\overline{s_{1,i}} \wedge s_{2,i})$ |
| 18 | $h_{55}$ | 0 | 0 | 1 | 0 | 1 | 1 | 0 | 0 | $h = (\overline{s_{0,i}} \wedge s_{1,i} \wedge \overline{s_{2,i}}) \vee (\overline{s_{0,i}} \wedge s_{1,i} \wedge s_{2,i}) \vee (s_{0,i} \wedge \overline{s_{1,i}} \wedge s_{2,i}) = (\overline{s_{1,i}} \wedge s_{2,i}) \vee (\overline{s_{0,i}} \wedge s_{1,i} \wedge \overline{s_{2,i}})$ |
| 19 | $h_{56}$ | 0 | 0 | 0 | 1 | 1 | 1 | 0 | 0 | $h = (s_{0,i} \wedge s_{1,i} \wedge \overline{s_{2,i}}) \vee (\overline{s_{0,i}} \wedge s_{1,i} \wedge s_{2,i}) \vee (s_{0,i} \wedge \overline{s_{1,i}} \wedge s_{2,i}) = (\overline{s_{1,i}} \wedge s_{2,i}) \vee (\overline{s_{0,i}} \wedge s_{1,i} \wedge \overline{s_{2,i}})$ |
| 20 | $h_{57}$ | 1 | 1 | 0 | 0 | 0 | 0 | 0 | 1 | $h = (\overline{s_{0,i}} \wedge \overline{s_{1,i}} \wedge \overline{s_{2,i}}) \vee (s_{0,i} \wedge \overline{s_{1,i}} \wedge \overline{s_{2,i}}) \vee (s_{0,i} \wedge s_{1,i} \wedge s_{2,i}) = (\overline{s_{1,i}} \wedge \overline{s_{2,i}}) \vee (s_{0,i} \wedge \overline{s_{1,i}} \wedge \overline{s_{2,i}})$ |
| 21 | $h_{58}$ | 1 | 0 | 1 | 0 | 0 | 0 | 0 | 1 | $h = (\overline{s_{0,i}} \wedge \overline{s_{1,i}} \wedge \overline{s_{2,i}}) \vee (\overline{s_{0,i}} \wedge s_{1,i} \wedge \overline{s_{2,i}}) \vee (s_{0,i} \wedge s_{1,i} \wedge s_{2,i}) = (\overline{s_{0,i}} \wedge \overline{s_{2,i}}) \vee (\overline{s_{0,i}} \wedge s_{1,i})$ |
| 22 | $h_{59}$ | 0 | 1 | 1 | 0 | 0 | 0 | 0 | 1 | $h = (s_{0,i} \wedge \overline{s_{1,i}} \wedge \overline{s_{2,i}}) \vee (\overline{s_{0,i}} \wedge s_{1,i} \wedge \overline{s_{2,i}}) \vee (s_{0,i} \wedge s_{1,i} \wedge s_{2,i}) = (s_{0,i} \wedge s_{1,i}) \vee (s_{0,i} \wedge \overline{s_{1,i}} \wedge \overline{s_{2,i}})$ |
| 23 | $h_{60}$ | 1 | 0 | 0 | 1 | 0 | 0 | 0 | 1 | $h = (\overline{s_{0,i}} \wedge \overline{s_{1,i}} \wedge \overline{s_{2,i}}) \vee (s_{0,i} \wedge s_{1,i} \wedge \overline{s_{2,i}}) \vee (s_{0,i} \wedge s_{1,i} \wedge s_{2,i}) = (s_{0,i} \wedge s_{1,i}) \vee (\overline{s_{0,i}} \wedge \overline{s_{1,i}} \wedge \overline{s_{2,i}})$ |
| 24 | $h_{61}$ | 0 | 1 | 0 | 1 | 0 | 0 | 0 | 1 | $h = (s_{0,i} \wedge \overline{s_{1,i}} \wedge \overline{s_{2,i}}) \vee (s_{0,i} \wedge s_{1,i} \wedge \overline{s_{2,i}}) \vee (s_{0,i} \wedge s_{1,i} \wedge s_{2,i}) = (s_{0,i} \wedge \overline{s_{2,i}}) \vee (s_{0,i} \wedge s_{1,i} \wedge s_{2,i})$ |
| 25 | $h_{62}$ | 0 | 0 | 1 | 1 | 0 | 0 | 0 | 1 | $h = (\overline{s_{0,i}} \wedge s_{1,i} \wedge \overline{s_{2,i}}) \vee (s_{0,i} \wedge s_{1,i} \wedge \overline{s_{2,i}}) \vee (s_{0,i} \wedge s_{1,i} \wedge s_{2,i}) = (s_{1,i} \wedge \overline{s_{2,i}}) \vee (s_{0,i} \wedge s_{1,i})$ |
| 26 | $h_{63}$ | 1 | 0 | 0 | 0 | 1 | 0 | 0 | 1 | $h = (\overline{s_{0,i}} \wedge \overline{s_{1,i}} \wedge \overline{s_{2,i}}) \vee (\overline{s_{0,i}} \wedge \overline{s_{1,i}} \wedge s_{2,i}) \vee (s_{0,i} \wedge s_{1,i} \wedge s_{2,i}) = (\overline{s_{0,i}} \wedge \overline{s_{1,i}}) \vee (s_{0,i} \wedge s_{2,i})$ |
| 27 | $h_{64}$ | 0 | 1 | 0 | 0 | 1 | 0 | 0 | 1 | $h = (s_{0,i} \wedge \overline{s_{1,i}} \wedge \overline{s_{2,i}}) \vee (\overline{s_{0,i}} \wedge \overline{s_{1,i}} \wedge s_{2,i}) \vee (s_{0,i} \wedge s_{1,i} \wedge s_{2,i}) = (\overline{s_{0,i}} \wedge s_{2,i}) \vee (s_{0,i} \wedge \overline{s_{1,i}} \wedge \overline{s_{2,i}})$ |
| 28 | $h_{65}$ | 0 | 0 | 1 | 0 | 1 | 0 | 0 | 1 | $h = (\overline{s_{0,i}} \wedge s_{1,i} \wedge \overline{s_{2,i}}) \vee (\overline{s_{0,i}} \wedge \overline{s_{1,i}} \wedge s_{2,i}) \vee (s_{0,i} \wedge s_{1,i} \wedge s_{2,i}) = (\overline{s_{0,i}} \wedge s_{1,i}) \vee (\overline{s_{0,i}} \wedge s_{2,i})$ |
| 29 | $h_{66}$ | 0 | 0 | 0 | 1 | 1 | 0 | 0 | 1 | $h = (s_{0,i} \wedge s_{1,i} \wedge \overline{s_{2,i}}) \vee (\overline{s_{0,i}} \wedge \overline{s_{1,i}} \wedge s_{2,i}) \vee (s_{0,i} \wedge s_{1,i} \wedge s_{2,i}) = (s_{0,i} \wedge s_{1,i}) \vee (\overline{s_{0,i}} \wedge \overline{s_{1,i}} \wedge s_{2,i})$ |
| 30 | $h_{67}$ | 1 | 0 | 0 | 0 | 0 | 1 | 1 | 0 | $h = (\overline{s_{0,i}} \wedge \overline{s_{1,i}} \wedge \overline{s_{2,i}}) \vee (s_{0,i} \wedge \overline{s_{1,i}} \wedge s_{2,i}) \vee (\overline{s_{0,i}} \wedge s_{1,i} \wedge s_{2,i})$ |
| 31 | $h_{68}$ | 0 | 1 | 0 | 0 | 0 | 1 | 1 | 0 | $h = (s_{0,i} \wedge \overline{s_{1,i}} \wedge \overline{s_{2,i}}) \vee (s_{0,i} \wedge \overline{s_{1,i}} \wedge s_{2,i}) \vee (\overline{s_{0,i}} \wedge s_{1,i} \wedge s_{2,i}) = (s_{0,i} \wedge \overline{s_{1,i}}) \vee (\overline{s_{0,i}} \wedge s_{1,i} \wedge s_{2,i})$ |
| 32 | $h_{69}$ | 0 | 0 | 1 | 0 | 0 | 1 | 1 | 0 | $h = (\overline{s_{0,i}} \wedge s_{1,i} \wedge \overline{s_{2,i}}) \vee (s_{0,i} \wedge \overline{s_{1,i}} \wedge s_{2,i}) \vee (\overline{s_{0,i}} \wedge s_{1,i} \wedge s_{2,i}) = (\overline{s_{0,i}} \wedge s_{1,i}) \vee (s_{0,i} \wedge \overline{s_{1,i}} \wedge s_{2,i})$ |
| 33 | $h_{70}$ | 0 | 0 | 0 | 1 | 0 | 1 | 1 | 0 | $h = (s_{0,i} \wedge s_{1,i} \wedge \overline{s_{2,i}}) \vee (s_{0,i} \wedge \overline{s_{1,i}} \wedge s_{2,i}) \vee (\overline{s_{0,i}} \wedge s_{1,i} \wedge s_{2,i})$ |
| 34 | $h_{71}$ | 0 | 0 | 0 | 0 | 1 | 1 | 1 | 0 | $h = (\overline{s_{0,i}} \wedge \overline{s_{1,i}} \wedge s_{2,i}) \vee (s_{0,i} \wedge \overline{s_{1,i}} \wedge s_{2,i}) \vee (\overline{s_{0,i}} \wedge s_{1,i} \wedge s_{2,i}) = (s_{1,i} \wedge s_{2,i}) \vee (\overline{s_{0,i}} \wedge s_{2,i})$ |
| 35 | $h_{72}$ | 1 | 1 | 0 | 0 | 0 | 0 | 0 | 1 | $h = (\overline{s_{0,i}} \wedge \overline{s_{1,i}} \wedge \overline{s_{2,i}}) \vee (s_{0,i} \wedge \overline{s_{1,i}} \wedge \overline{s_{2,i}}) \vee (s_{0,i} \wedge s_{1,i} \wedge s_{2,i}) = (\overline{s_{1,i}} \wedge \overline{s_{2,i}}) \vee (s_{0,i} \wedge s_{1,i} \wedge s_{2,i})$ |
| 36 | $h_{73}$ | 1 | 0 | 1 | 0 | 0 | 0 | 0 | 1 | $h = (\overline{s_{0,i}} \wedge \overline{s_{1,i}} \wedge \overline{s_{2,i}}) \vee (\overline{s_{0,i}} \wedge s_{1,i} \wedge \overline{s_{2,i}}) \vee (s_{0,i} \wedge s_{1,i} \wedge s_{2,i}) = (\overline{s_{0,i}} \wedge \overline{s_{2,i}}) \vee (s_{0,i} \wedge s_{2,i} \wedge s_{2,i})$ |
| 37 | $h_{74}$ | 0 | 1 | 1 | 0 | 0 | 0 | 0 | 1 | $h = (s_{0,i} \wedge \overline{s_{1,i}} \wedge \overline{s_{2,i}}) \vee (\overline{s_{0,i}} \wedge s_{1,i} \wedge \overline{s_{2,i}}) \vee (s_{0,i} \wedge s_{1,i} \wedge s_{2,i}) = (s_{0,i} \wedge s_{1,i} \wedge \overline{s_{2,i}})$ |
| 38 | $h_{75}$ | 1 | 0 | 0 | 1 | 0 | 0 | 0 | 1 | $h = (\overline{s_{0,i}} \wedge \overline{s_{1,i}} \wedge \overline{s_{2,i}}) \vee (s_{0,i} \wedge s_{1,i} \wedge \overline{s_{2,i}}) \vee (s_{0,i} \wedge s_{1,i} \wedge s_{2,i}) = (s_{0,i} \wedge s_{1,i}) \vee (\overline{s_{0,i}} \wedge \overline{s_{1,i}} \wedge \overline{s_{2,i}})$ |
| 39 | $h_{76}$ | 0 | 1 | 0 | 1 | 0 | 0 | 0 | 1 | $h = (s_{0,i} \wedge \overline{s_{1,i}} \wedge \overline{s_{2,i}}) \vee (s_{0,i} \wedge s_{1,i} \wedge \overline{s_{2,i}}) \vee (s_{0,i} \wedge s_{1,i} \wedge s_{2,i}) = (s_{0,i} \wedge \overline{s_{2,i}}) \vee (s_{0,i} \wedge s_{1,i})$ |
| 40 | $h_{77}$ | 0 | 0 | 1 | 1 | 0 | 0 | 0 | 1 | $h = (\overline{s_{0,i}} \wedge s_{1,i} \wedge \overline{s_{2,i}}) \vee (s_{0,i} \wedge s_{1,i} \wedge \overline{s_{2,i}}) \vee (s_{0,i} \wedge s_{1,i} \wedge s_{2,i}) = (s_{1,i} \wedge \overline{s_{2,i}}) \vee (s_{0,i} \wedge s_{1,i})$ |
| 41 | $h_{78}$ | 1 | 0 | 0 | 0 | 1 | 0 | 0 | 1 | $h = (\overline{s_{0,i}} \wedge \overline{s_{1,i}} \wedge \overline{s_{2,i}}) \vee (\overline{s_{0,i}} \wedge \overline{s_{1,i}} \wedge s_{2,i}) \vee (s_{0,i} \wedge s_{1,i} \wedge s_{2,i}) = (\overline{s_{0,i}} \wedge \overline{s_{1,i}}) \vee (s_{0,i} \wedge s_{1,i} \wedge s_{2,i})$ |
| 42 | $h_{79}$ | 0 | 1 | 0 | 0 | 1 | 0 | 0 | 1 | $h = (s_{0,i} \wedge \overline{s_{1,i}} \wedge \overline{s_{2,i}}) \vee (\overline{s_{0,i}} \wedge \overline{s_{1,i}} \wedge s_{2,i}) \vee (s_{0,i} \wedge s_{1,i} \wedge s_{2,i})$ |
| 43 | $h_{80}$ | 0 | 0 | 1 | 0 | 1 | 0 | 0 | 1 | $h = (\overline{s_{0,i}} \wedge s_{1,i} \wedge \overline{s_{2,i}}) \vee (\overline{s_{0,i}} \wedge \overline{s_{1,i}} \wedge s_{2,i}) \vee (s_{0,i} \wedge s_{1,i} \wedge s_{2,i})$ |

TABLE 3-continued

The output of the function h includes three values "1"

| Sequence number | i %8 | 0 | 1 | 2 | 3 | 4 | 5 | 6 | 7 | Logical expression |
|---|---|---|---|---|---|---|---|---|---|---|
| 44 | $h_{81}$ | 0 | 0 | 0 | 1 | 1 | 0 | 0 | 1 | $h = (s_{0,i} \wedge s_{1,i} \wedge \overline{s_{2,i}}) \vee (\overline{s_{0,i}} \wedge \overline{s_{1,i}} \wedge s_{2,i}) \vee (s_{0,i} \wedge s_{1,i} \wedge s_{2,i}) = (s_{0,i} \wedge s_{1,i}) \vee (\overline{s_{0,i}} \wedge \overline{s_{1,i}} \wedge s_{2,i})$ |
| 45 | $h_{82}$ | 1 | 0 | 0 | 0 | 0 | 1 | 0 | 1 | $h = (\overline{s_{0,i}} \wedge \overline{s_{1,i}} \wedge \overline{s_{2,i}}) \vee (s_{0,i} \wedge \overline{s_{1,i}} \wedge s_{2,i}) \vee (s_{0,i} \wedge s_{1,i} \wedge s_{2,i}) = (s_{0,i} \wedge s_{2,i}) \vee (\overline{s_{0,i}} \wedge \overline{s_{1,i}} \wedge \overline{s_{2,i}})$ |
| 46 | $h_{83}$ | 0 | 1 | 0 | 0 | 0 | 1 | 0 | 1 | $h = (s_{0,i} \wedge \overline{s_{1,i}} \wedge \overline{s_{2,i}}) \vee (s_{0,i} \wedge \overline{s_{1,i}} \wedge s_{2,i}) \vee (s_{0,i} \wedge s_{1,i} \wedge s_{2,i}) = (s_{0,i} \wedge \overline{s_{1,i}}) \vee (s_{0,i} \wedge s_{2,i})$ |
| 47 | $h_{84}$ | 0 | 0 | 1 | 0 | 0 | 1 | 0 | 1 | $h = (\overline{s_{0,i}} \wedge s_{1,i} \wedge \overline{s_{2,i}}) \vee (s_{0,i} \wedge \overline{s_{1,i}} \wedge s_{2,i}) \vee (s_{0,i} \wedge s_{1,i} \wedge s_{2,i}) = (s_{0,i} \wedge s_{2,i}) \vee (\overline{s_{0,i}} \wedge s_{1,i} \wedge \overline{s_{2,i}})$ |
| 48 | $h_{85}$ | 0 | 0 | 0 | 1 | 0 | 1 | 0 | 1 | $h = (s_{0,i} \wedge s_{1,i} \wedge \overline{s_{2,i}}) \vee (s_{0,i} \wedge \overline{s_{1,i}} \wedge s_{2,i}) \vee (s_{0,i} \wedge s_{1,i} \wedge s_{2,i}) = (s_{0,i} \wedge s_{1,i}) \vee (s_{0,i} \wedge s_{2,i})$ |
| 49 | $h_{86}$ | 0 | 0 | 0 | 0 | 1 | 1 | 0 | 1 | $h = (\overline{s_{0,i}} \wedge \overline{s_{1,i}} \wedge s_{2,i}) \vee (s_{0,i} \wedge \overline{s_{1,i}} \wedge s_{2,i}) \vee (s_{0,i} \wedge s_{1,i} \wedge s_{2,i}) = (\overline{s_{1,i}} \wedge s_{2,i}) \vee (s_{0,i} \wedge s_{2,i})$ |
| 50 | $h_{87}$ | 1 | 0 | 0 | 0 | 0 | 0 | 1 | 1 | $h = (\overline{s_{0,i}} \wedge \overline{s_{1,i}} \wedge \overline{s_{2,i}}) \vee (\overline{s_{0,i}} \wedge s_{1,i} \wedge s_{2,i}) \vee (s_{0,i} \wedge s_{1,i} \wedge s_{2,i}) = (s_{1,i} \wedge s_{2,i}) \vee (\overline{s_{0,i}} \wedge \overline{s_{1,i}} \wedge \overline{s_{2,i}})$ |
| 51 | $h_{88}$ | 0 | 1 | 0 | 0 | 0 | 0 | 1 | 1 | $h = (s_{0,i} \wedge \overline{s_{1,i}} \wedge \overline{s_{2,i}}) \vee (\overline{s_{0,i}} \wedge s_{1,i} \wedge s_{2,i}) \vee (s_{0,i} \wedge s_{1,i} \wedge s_{2,i}) = (s_{1,i} \wedge s_{2,i}) \vee (s_{0,i} \wedge \overline{s_{1,i}} \wedge \overline{s_{2,i}})$ |
| 52 | $h_{89}$ | 0 | 0 | 1 | 0 | 0 | 0 | 1 | 1 | $h = (\overline{s_{0,i}} \wedge s_{1,i} \wedge \overline{s_{2,i}}) \vee (\overline{s_{0,i}} \wedge s_{1,i} \wedge s_{2,i}) \vee (s_{0,i} \wedge s_{1,i} \wedge s_{2,i}) = (\overline{s_{0,i}} \wedge s_{1,i}) \vee (s_{1,i} \wedge s_{2,i})$ |
| 53 | $h_{90}$ | 0 | 0 | 0 | 1 | 0 | 0 | 1 | 1 | $h = (s_{0,i} \wedge s_{1,i} \wedge \overline{s_{2,i}}) \vee (\overline{s_{0,i}} \wedge s_{1,i} \wedge s_{2,i}) \vee (s_{0,i} \wedge s_{1,i} \wedge s_{2,i}) = (s_{0,i} \wedge s_{1,i}) \vee (s_{1,i} \wedge s_{2,i})$ |
| 54 | $h_{91}$ | 0 | 0 | 0 | 0 | 1 | 0 | 1 | 1 | $h = (\overline{s_{0,i}} \wedge \overline{s_{1,i}} \wedge s_{2,i}) \vee (\overline{s_{0,i}} \wedge s_{1,i} \wedge s_{2,i}) \vee (s_{0,i} \wedge s_{1,i} \wedge s_{2,i}) = (\overline{s_{0,i}} \wedge s_{2,i}) \vee (s_{1,i} \wedge s_{2,i})$ |
| 55 | $h_{92}$ | 0 | 0 | 0 | 0 | 0 | 1 | 1 | 1 | $h = (s_{0,i} \wedge \overline{s_{1,i}} \wedge s_{2,i}) \vee (\overline{s_{0,i}} \wedge s_{1,i} \wedge s_{2,i}) \vee (s_{0,i} \wedge s_{1,i} \wedge s_{2,i}) = (s_{0,i} \wedge s_{2,i}) \vee (s_{1,i} \wedge s_{2,i})$ |

TABLE 4

The output of the function h includes four values "1"

| Sequence number | i %8 | 0 | 1 | 2 | 3 | 4 | 5 | 6 | 7 | Logical expression |
|---|---|---|---|---|---|---|---|---|---|---|
| 0 | $h_{93}$ | 1 | 1 | 1 | 1 | 0 | 0 | 0 | 0 | $h = (\overline{s_{0,i}} \wedge \overline{s_{1,i}} \wedge \overline{s_{2,i}}) \vee (s_{0,i} \wedge \overline{s_{1,i}} \wedge \overline{s_{2,i}}) \vee (\overline{s_{0,i}} \wedge s_{1,i} \wedge \overline{s_{2,i}}) \vee (s_{0,i} \wedge s_{1,i} \wedge \overline{s_{2,i}}) = \overline{s_{2,i}}$ |
| 1 | $h_{94}$ | 1 | 1 | 1 | 0 | 1 | 0 | 0 | 0 | $h = (\overline{s_{0,i}} \wedge \overline{s_{1,i}} \wedge \overline{s_{2,i}}) \vee (s_{0,i} \wedge \overline{s_{1,i}} \wedge \overline{s_{2,i}}) \vee (\overline{s_{0,i}} \wedge s_{1,i} \wedge \overline{s_{2,i}}) \vee (\overline{s_{0,i}} \wedge \overline{s_{1,i}} \wedge s_{2,i}) = (\overline{s_{1,i}} \wedge s_{2,i}) \vee (\overline{s_{0,i}} \wedge \overline{s_{1,i}})$ |
| 2 | $h_{95}$ | 1 | 1 | 0 | 1 | 1 | 0 | 0 | 0 | $h = (\overline{s_{0,i}} \wedge \overline{s_{1,i}} \wedge \overline{s_{2,i}}) \vee (s_{0,i} \wedge \overline{s_{1,i}} \wedge \overline{s_{2,i}}) \vee (s_{0,i} \wedge s_{1,i} \wedge \overline{s_{2,i}}) \vee (\overline{s_{0,i}} \wedge \overline{s_{1,i}} \wedge s_{2,i}) = (\overline{s_{0,i}} \wedge \overline{s_{1,i}}) \vee (s_{0,i} \wedge \overline{s_{2,i}})$ |
| 3 | $h_{96}$ | 1 | 0 | 1 | 1 | 1 | 0 | 0 | 0 | $h = (\overline{s_{0,i}} \wedge \overline{s_{1,i}} \wedge \overline{s_{2,i}}) \vee (\overline{s_{0,i}} \wedge s_{1,i} \wedge \overline{s_{2,i}}) \vee (s_{0,i} \wedge s_{1,i} \wedge \overline{s_{2,i}}) \vee (\overline{s_{0,i}} \wedge \overline{s_{1,i}} \wedge s_{2,i}) = (\overline{s_{0,i}} \wedge \overline{s_{1,i}}) \vee (s_{1,i} \wedge \overline{s_{2,i}})$ |
| 4 | $h_{97}$ | 0 | 1 | 1 | 1 | 1 | 0 | 0 | 0 | $h = (s_{0,i} \wedge \overline{s_{1,i}} \wedge \overline{s_{2,i}}) \vee (\overline{s_{0,i}} \wedge s_{1,i} \wedge \overline{s_{2,i}}) \vee (s_{0,i} \wedge s_{1,i} \wedge \overline{s_{2,i}}) \vee (\overline{s_{0,i}} \wedge \overline{s_{1,i}} \wedge s_{2,i}) = (\overline{s_{0,i}} \wedge \overline{s_{2,i}}) \vee (s_{1,i} \wedge s_{2,i})$ |
| 5 | $h_{98}$ | 1 | 1 | 1 | 0 | 0 | 1 | 0 | 0 | $h = (\overline{s_{0,i}} \wedge \overline{s_{1,i}} \wedge \overline{s_{2,i}}) \vee (s_{0,i} \wedge \overline{s_{1,i}} \wedge \overline{s_{2,i}}) \vee (\overline{s_{0,i}} \wedge s_{1,i} \wedge \overline{s_{2,i}}) \vee (s_{0,i} \wedge \overline{s_{1,i}} \wedge s_{2,i}) = (\overline{s_{0,i}} \wedge \overline{s_{2,i}}) \vee (s_{0,i} \wedge \overline{s_{2,i}})$ |
| 6 | $h_{99}$ | 1 | 1 | 0 | 1 | 0 | 1 | 0 | 0 | $h = (\overline{s_{0,i}} \wedge \overline{s_{1,i}} \wedge \overline{s_{2,i}}) \vee (s_{0,i} \wedge \overline{s_{1,i}} \wedge \overline{s_{2,i}}) \vee (s_{0,i} \wedge s_{1,i} \wedge \overline{s_{2,i}}) \vee (s_{0,i} \wedge \overline{s_{1,i}} \wedge s_{2,i}) = (\overline{s_{0,i}} \wedge \overline{s_{2,i}}) \vee (s_{0,i} \wedge \overline{s_{1,i}})$ |
| 7 | $h_{100}$ | 1 | 0 | 1 | 1 | 0 | 1 | 0 | 0 | $h = (\overline{s_{0,i}} \wedge \overline{s_{1,i}} \wedge \overline{s_{2,i}}) \vee (\overline{s_{0,i}} \wedge s_{1,i} \wedge \overline{s_{2,i}}) \vee (s_{0,i} \wedge s_{1,i} \wedge \overline{s_{2,i}}) \vee (s_{0,i} \wedge \overline{s_{1,i}} \wedge s_{2,i}) = (s_{0,i} \wedge \overline{s_{2,i}}) \vee (s_{1,i} \wedge \overline{s_{2,i}})$ |
| 8 | $h_{101}$ | 0 | 1 | 1 | 1 | 0 | 1 | 0 | 0 | $h = (s_{0,i} \wedge \overline{s_{1,i}} \wedge \overline{s_{2,i}}) \vee (\overline{s_{0,i}} \wedge s_{1,i} \wedge \overline{s_{2,i}}) \vee (s_{0,i} \wedge s_{1,i} \wedge \overline{s_{2,i}}) \vee (s_{0,i} \wedge \overline{s_{1,i}} \wedge s_{2,i}) = (s_{0,i} \wedge s_{1,i}) \vee (s_{1,i} \wedge \overline{s_{2,i}})$ |
| 9 | $h_{102}$ | 1 | 1 | 0 | 0 | 1 | 1 | 0 | 0 | $h = (\overline{s_{0,i}} \wedge \overline{s_{1,i}} \wedge \overline{s_{2,i}}) \vee (s_{0,i} \wedge \overline{s_{1,i}} \wedge \overline{s_{2,i}}) \vee (\overline{s_{0,i}} \wedge \overline{s_{1,i}} \wedge s_{2,i}) \vee (s_{0,i} \wedge \overline{s_{1,i}} \wedge s_{2,i}) = \overline{s_{1,i}}$ |
| 10 | $h_{103}$ | 1 | 0 | 1 | 0 | 1 | 1 | 0 | 0 | $h = (\overline{s_{0,i}} \wedge \overline{s_{1,i}} \wedge \overline{s_{2,i}}) \vee (\overline{s_{0,i}} \wedge s_{1,i} \wedge \overline{s_{2,i}}) \vee (\overline{s_{0,i}} \wedge \overline{s_{1,i}} \wedge s_{2,i}) \vee (s_{0,i} \wedge \overline{s_{1,i}} \wedge s_{2,i}) = (\overline{s_{0,i}} \wedge \overline{s_{2,i}}) \vee (s_{1,i} \wedge s_{2,i})$ |
| 11 | $h_{104}$ | 0 | 1 | 1 | 0 | 1 | 1 | 0 | 0 | $h = (s_{0,i} \wedge \overline{s_{1,i}} \wedge \overline{s_{2,i}}) \vee (\overline{s_{0,i}} \wedge s_{1,i} \wedge \overline{s_{2,i}}) \vee (\overline{s_{0,i}} \wedge \overline{s_{1,i}} \wedge s_{2,i}) \vee (s_{0,i} \wedge \overline{s_{1,i}} \wedge s_{2,i}) = (s_{0,i} \wedge s_{1,i}) \vee (\overline{s_{0,i}} \wedge s_{2,i})$ |

TABLE 4-continued

The output of the function h includes four values "1"

| Sequence number | i %8 0 1 2 3 4 5 6 7 | Logical expression |
|---|---|---|
| 12 | $h_{105}$ 1 0 0 1 1 1 0 0 | $h = (s_{0,i} \wedge \overline{s_{1,i} \wedge s_{2,i}}) \vee (s_{0,i} \wedge s_{1,i} \wedge \overline{s_{2,i}})$ $\vee (\overline{s_{0,i}} \wedge s_{1,i} \wedge s_{2,i})$ $\vee (s_{0,i} \wedge s_{1,i} \wedge s_{2,i}) =$ $(s_{0,i} \wedge \overline{s_{1,i}}) \vee (s_{1,i} \wedge s_{2,i})$ $\vee (s_{0,i} \wedge s_{1,i} \wedge s_{2,i})$ |
| 13 | $h_{106}$ 0 1 0 1 1 1 0 0 | $h = (\overline{s_{0,i}} \wedge \overline{s_{1,i} \wedge s_{2,i}}) \vee (s_{0,i} \wedge s_{1,i} \wedge \overline{s_{2,i}})$ $\vee (\overline{s_{0,i}} \wedge s_{1,i} \wedge s_{2,i})$ $\vee (s_{0,i} \wedge s_{1,i} \wedge s_{2,i}) =$ $(s_{0,i} \wedge s_{2,i}) \vee (s_{1,i} \wedge s_{2,i})$ |
| 14 | $h_{107}$ 0 0 1 1 1 1 0 0 | $h = (s_{0,i} \wedge \overline{s_{1,i} \wedge s_{2,i}}) \vee (s_{0,i} \wedge s_{1,i} \wedge \overline{s_{2,i}})$ $\vee (\overline{s_{0,i}} \wedge s_{1,i} \wedge s_{2,i})$ $\vee (s_{0,i} \wedge s_{1,i} \wedge s_{2,i}) =$ $(s_{1,i} \wedge s_{2,i}) \vee (s_{1,i} \wedge \overline{s_{2,i}})$ |
| 15 | $h_{108}$ 1 1 1 0 0 0 1 0 | $h = (\overline{s_{0,i} \wedge s_{1,i} \wedge s_{2,i}}) \vee (s_{0,i} \wedge \overline{s_{1,i} \wedge s_{2,i}})$ $\vee (\overline{s_{0,i}} \wedge s_{1,i} \wedge s_{2,i})$ $\vee (s_{0,i} \wedge s_{1,i} \wedge s_{2,i}) =$ $(\overline{s_{1,i} \wedge s_{2,i}}) \vee (\overline{s_{0,i}} \wedge s_{1,i})$ $\vee (s_{0,i} \wedge s_{1,i} \wedge s_{2,i})$ |
| 16 | $h_{109}$ 1 1 0 1 0 0 1 0 | $h = (\overline{s_{0,i} \wedge s_{1,i} \wedge s_{2,i}}) \vee (s_{0,i} \wedge s_{1,i} \wedge \overline{s_{2,i}})$ $\vee (\overline{s_{0,i}} \wedge s_{1,i} \wedge s_{2,i})$ $\vee (s_{0,i} \wedge s_{1,i} \wedge s_{2,i}) =$ $(\overline{s_{1,i} \wedge s_{2,i}}) \vee (s_{0,i} \wedge s_{2,i})$ $\vee (s_{0,i} \wedge s_{1,i} \wedge s_{2,i})$ |
| 17 | $h_{110}$ 1 0 1 1 0 0 1 0 | $h = (\overline{s_{0,i} \wedge s_{1,i} \wedge s_{2,i}}) \vee (\overline{s_{0,i} \wedge s_{1,i} \wedge s_{2,i}})$ $\vee (s_{0,i} \wedge s_{1,i} \wedge s_{2,i})$ $\vee (\overline{s_{0,i} \wedge s_{1,i} \wedge s_{2,i}}) =$ $(s_{0,i} \wedge \overline{s_{2,i}}) \vee (s_{1,i} \wedge s_{2,i})$ $\vee (\overline{s_{0,i}} \wedge s_{1,i})$ |
| 18 | $h_{111}$ 0 1 1 1 0 0 1 0 | $h = (s_{0,i} \wedge \overline{s_{1,i} \wedge s_{2,i}}) \vee (\overline{s_{0,i}} \wedge s_{1,i} \wedge \overline{s_{2,i}})$ $\vee (\overline{s_{0,i}} \wedge s_{1,i} \wedge s_{2,i})$ $\vee (s_{0,i} \wedge s_{1,i} \wedge s_{2,i}) =$ $(s_{0,i} \wedge s_{2,i}) \vee (\overline{s_{0,i}} \wedge s_{1,i})$ |
| 19 | $h_{112}$ 1 1 0 0 1 0 1 0 | $h = (\overline{s_{0,i} \wedge s_{1,i} \wedge s_{2,i}}) \vee (s_{0,i} \wedge \overline{s_{1,i} \wedge s_{2,i}})$ $\vee (s_{0,i} \wedge s_{1,i} \wedge \overline{s_{2,i}})$ $\vee (s_{0,i} \wedge s_{1,i} \wedge s_{2,i}) =$ $(\overline{s_{1,i} \wedge s_{2,i}}) \vee (s_{0,i} \wedge \overline{s_{2,i}})$ $\vee (s_{0,i} \wedge s_{1,i} \wedge s_{2,i})$ |
| 20 | $h_{113}$ 1 0 1 0 1 0 1 0 | $h = (\overline{s_{0,i} \wedge s_{1,i} \wedge s_{2,i}}) \vee (s_{0,i} \wedge \overline{s_{1,i} \wedge s_{2,i}})$ $\vee (s_{0,i} \wedge \overline{s_{1,i}} \wedge s_{2,i})$ $\vee (s_{0,i} \wedge s_{1,i} \wedge s_{2,i}) = \overline{s_{0,i}}$ |
| 21 | $h_{114}$ 0 1 1 0 1 0 1 0 | $h = (s_{0,i} \wedge \overline{s_{1,i} \wedge s_{2,i}}) \vee (\overline{s_{0,i}} \wedge s_{1,i} \wedge \overline{s_{2,i}})$ $\vee (s_{0,i} \wedge s_{1,i} \wedge \overline{s_{2,i}})$ $\vee (s_{0,i} \wedge s_{1,i} \wedge s_{2,i}) =$ $(\overline{s_{0,i}} \wedge s_{1,i}) \vee (s_{0,i} \wedge \overline{s_{2,i}})$ |
| 22 | $h_{115}$ 1 0 0 1 1 0 1 0 | $h = (s_{0,i} \wedge \overline{s_{1,i} \wedge s_{2,i}}) \vee (s_{0,i} \wedge s_{1,i} \wedge \overline{s_{2,i}})$ $\vee (s_{0,i} \wedge s_{1,i} \wedge s_{2,i})$ $\vee (s_{0,i} \wedge s_{1,i} \wedge s_{2,i}) =$ $(\overline{s_{0,i}} \wedge s_{1,i}) \vee (s_{0,i} \wedge s_{2,i})$ |
| 23 | $h_{116}$ 0 1 0 1 1 0 1 0 | $h = (\overline{s_{0,i}} \wedge \overline{s_{1,i} \wedge s_{2,i}}) \vee (s_{0,i} \wedge s_{1,i} \wedge \overline{s_{2,i}})$ $\vee (\overline{s_{0,i}} \wedge s_{1,i} \wedge s_{2,i})$ $\vee (s_{0,i} \wedge s_{1,i} \wedge s_{2,i}) =$ $(s_{0,i} \wedge s_{2,i}) \vee (\overline{s_{0,i}} \wedge s_{2,i})$ |
| 24 | $h_{117}$ 0 0 1 1 1 0 1 0 | $h = (s_{0,i} \wedge s_{1,i} \wedge \overline{s_{2,i}}) \vee (\overline{s_{0,i}} \wedge s_{1,i} \wedge \overline{s_{2,i}})$ $\vee (\overline{s_{0,i}} \wedge s_{1,i} \wedge s_{2,i})$ $\vee (s_{0,i} \wedge s_{1,i} \wedge s_{2,i}) =$ $(s_{1,i} \wedge s_{2,i}) \vee (\overline{s_{0,i}} \wedge s_{2,i})$ |
| 25 | $h_{118}$ 1 1 0 0 0 1 1 0 | $h = (\overline{s_{0,i} \wedge s_{1,i} \wedge s_{2,i}}) \vee (s_{0,i} \wedge \overline{s_{1,i} \wedge s_{2,i}})$ $\vee (s_{0,i} \wedge s_{1,i} \wedge s_{2,i})$ $\vee (s_{0,i} \wedge s_{1,i} \wedge s_{2,i}) =$ $(\overline{s_{1,i} \wedge s_{2,i}}) \vee (s_{0,i} \wedge s_{1,i})$ $\vee (s_{0,i} \wedge s_{1,i} \wedge s_{2,i})$ |
| 26 | $h_{119}$ 1 0 1 0 0 1 1 0 | $h = (\overline{s_{0,i} \wedge s_{1,i} \wedge s_{2,i}}) \vee (\overline{s_{0,i}} \wedge s_{1,i} \wedge \overline{s_{2,i}})$ $\vee (s_{0,i} \wedge s_{1,i} \wedge s_{2,i})$ $\vee (s_{0,i} \wedge s_{1,i} \wedge s_{2,i}) =$ $(\overline{s_{1,i} \wedge s_{2,i}}) \vee (s_{0,i} \wedge s_{1,i})$ $\vee (s_{0,i} \wedge s_{1,i} \wedge s_{2,i})$ |
| 27 | $h_{120}$ 0 1 1 0 0 1 1 0 | $h = (s_{0,i} \wedge \overline{s_{1,i} \wedge s_{2,i}}) \vee (\overline{s_{0,i}} \wedge s_{1,i} \wedge \overline{s_{2,i}})$ $\vee (s_{0,i} \wedge s_{1,i} \wedge s_{2,i})$ $\vee (s_{0,i} \wedge s_{1,i} \wedge s_{2,i}) =$ $(s_{0,i} \wedge s_{1,i}) \vee (\overline{s_{0,i}} \wedge s_{1,i})$ |
| 28 | $h_{121}$ 1 0 0 1 0 1 1 0 | $h = (s_{0,i} \wedge \overline{s_{1,i} \wedge s_{2,i}}) \vee (s_{0,i} \wedge s_{1,i} \wedge \overline{s_{2,i}})$ $\vee (s_{0,i} \wedge s_{1,i} \wedge s_{2,i})$ $\vee (s_{0,i} \wedge s_{1,i} \wedge s_{2,i})$ |
| 29 | $h_{122}$ 0 1 0 1 0 1 1 0 | $h = (s_{0,i} \wedge \overline{s_{1,i} \wedge s_{2,i}}) \vee (s_{0,i} \wedge s_{1,i} \wedge \overline{s_{2,i}})$ $\vee (s_{0,i} \wedge s_{1,i} \wedge s_{2,i})$ $\vee (s_{0,i} \wedge s_{1,i} \wedge s_{2,i}) =$ $(s_{0,i} \wedge \overline{s_{2,i}}) \vee (s_{0,i} \wedge s_{1,i})$ $\vee (s_{0,i} \wedge s_{1,i} \wedge s_{2,i})$ |
| 30 | $h_{123}$ 0 0 1 1 0 1 1 0 | $h = (s_{0,i} \wedge s_{1,i} \wedge \overline{s_{2,i}}) \vee (s_{0,i} \wedge s_{1,i} \wedge \overline{s_{2,i}})$ $\vee (s_{0,i} \wedge s_{1,i} \wedge s_{2,i})$ $\vee (s_{0,i} \wedge s_{1,i} \wedge s_{2,i}) =$ $(s_{1,i} \wedge \overline{s_{2,i}}) \vee (\overline{s_{0,i}} \wedge s_{1,i})$ $\vee (s_{0,i} \wedge s_{1,i} \wedge s_{2,i})$ |
| 31 | $h_{124}$ 1 0 0 0 1 1 1 0 | $h = (\overline{s_{0,i}} \wedge \overline{s_{1,i} \wedge s_{2,i}}) \vee (s_{0,i} \wedge \overline{s_{1,i}} \wedge s_{2,i})$ $\vee (s_{0,i} \wedge s_{1,i} \wedge \overline{s_{2,i}})$ $\vee (s_{0,i} \wedge s_{1,i} \wedge s_{2,i}) =$ $(s_{0,i} \wedge s_{1,i}) \vee (s_{1,i} \wedge s_{2,i})$ $\vee (\overline{s_{0,i}} \wedge s_{2,i})$ |
| 32 | $h_{125}$ 0 1 0 0 1 1 1 0 | $h = (s_{0,i} \wedge \overline{s_{1,i} \wedge s_{2,i}}) \vee (s_{0,i} \wedge \overline{s_{1,i}} \wedge s_{2,i})$ $\vee (s_{0,i} \wedge s_{1,i} \wedge \overline{s_{2,i}})$ $\vee (s_{0,i} \wedge s_{1,i} \wedge s_{2,i}) =$ $(s_{0,i} \wedge s_{1,i}) \vee (\overline{s_{0,i}} \wedge s_{2,i})$ |
| 33 | $h_{126}$ 0 0 1 0 1 1 1 0 | $h = (\overline{s_{0,i}} \wedge s_{1,i} \wedge \overline{s_{2,i}}) \vee (s_{0,i} \wedge \overline{s_{1,i}} \wedge s_{2,i})$ $\vee (s_{0,i} \wedge s_{1,i} \wedge \overline{s_{2,i}})$ $\vee (s_{0,i} \wedge s_{1,i} \wedge s_{2,i}) =$ $(s_{0,i} \wedge s_{1,i}) \vee (s_{1,i} \wedge s_{2,i})$ |
| 34 | $h_{127}$ 0 0 0 1 1 1 1 0 | $h = (s_{0,i} \wedge s_{1,i} \wedge \overline{s_{2,i}}) \vee (s_{0,i} \wedge \overline{s_{1,i}} \wedge s_{2,i})$ $\vee (s_{0,i} \wedge s_{1,i} \wedge \overline{s_{2,i}})$ $\vee (s_{0,i} \wedge s_{1,i} \wedge s_{2,i}) =$ $(s_{1,i} \wedge s_{2,i}) \vee (s_{0,i} \wedge s_{2,i})$ $\vee (s_{0,i} \wedge s_{1,i} \wedge s_{2,i})$ |
| 35 | $h_{128}$ 1 1 1 0 0 0 0 1 | $h = (\overline{s_{0,i} \wedge s_{1,i} \wedge s_{2,i}}) \vee (s_{0,i} \wedge \overline{s_{1,i} \wedge s_{2,i}})$ $\vee (s_{0,i} \wedge \overline{s_{1,i}} \wedge s_{2,i})$ $\vee (s_{0,i} \wedge s_{1,i} \wedge s_{2,i}) =$ $(\overline{s_{1,i} \wedge s_{2,i}}) \vee (s_{0,i} \wedge s_{2,i})$ $\vee (s_{0,i} \wedge s_{1,i} \wedge s_{2,i})$ |
| 36 | $h_{129}$ 1 1 0 1 0 0 0 1 | $h = (\overline{s_{0,i} \wedge s_{1,i} \wedge s_{2,i}}) \vee (s_{0,i} \wedge s_{1,i} \wedge \overline{s_{2,i}})$ $\vee (s_{0,i} \wedge \overline{s_{1,i}} \wedge \overline{s_{2,i}})$ $\vee (s_{0,i} \wedge s_{1,i} \wedge s_{2,i}) =$ $(\overline{s_{1,i} \wedge s_{2,i}}) \vee (s_{0,i} \wedge s_{2,i})$ $\vee (s_{0,i} \wedge s_{1,i} \wedge s_{2,i})$ |
| 37 | $h_{130}$ 1 0 1 1 0 0 0 1 | $h = (\overline{s_{0,i} \wedge s_{1,i} \wedge s_{2,i}}) \vee (s_{0,i} \wedge s_{1,i} \wedge \overline{s_{2,i}})$ $\vee (s_{0,i} \wedge \overline{s_{1,i}} \wedge s_{2,i})$ $\vee (s_{0,i} \wedge s_{1,i} \wedge s_{2,i}) =$ $(\overline{s_{0,i} \wedge s_{2,i}}) \vee (s_{0,i} \wedge s_{1,i})$ |
| 38 | $h_{131}$ 0 1 1 1 0 0 0 1 | $h = (s_{0,i} \wedge \overline{s_{1,i} \wedge s_{2,i}}) \vee (\overline{s_{0,i}} \wedge s_{1,i} \wedge \overline{s_{2,i}})$ $\vee (\overline{s_{0,i}} \wedge s_{1,i} \wedge s_{2,i})$ $\vee (s_{0,i} \wedge s_{1,i} \wedge s_{2,i}) =$ $(\overline{s_{0,i} \wedge s_{2,i}}) \vee (s_{1,i} \wedge s_{2,i})$ $\vee (s_{0,i} \wedge s_{1,i})$ |
| 39 | $h_{132}$ 1 1 0 0 1 0 0 1 | $h = (\overline{s_{0,i} \wedge s_{1,i} \wedge s_{2,i}}) \vee (s_{0,i} \wedge s_{1,i} \wedge \overline{s_{2,i}})$ $\vee (\overline{s_{0,i}} \wedge s_{1,i} \wedge s_{2,i})$ $\vee (s_{0,i} \wedge s_{1,i} \wedge s_{2,i}) =$ $(\overline{s_{1,i} \wedge s_{2,i}}) \vee (s_{0,i} \wedge s_{1,i})$ $\vee (s_{0,i} \wedge s_{1,i} \wedge s_{2,i})$ |
| 40 | $h_{133}$ 1 0 1 0 1 0 0 1 | $h = (s_{0,i} \wedge s_{1,i} \wedge \overline{s_{2,i}}) \vee (s_{0,i} \wedge \overline{s_{1,i}} \wedge s_{2,i})$ $\vee (\overline{s_{0,i} \wedge s_{1,i}} \wedge s_{2,i})$ $\vee (s_{0,i} \wedge s_{1,i} \wedge s_{2,i}) =$ $(s_{1,i} \wedge s_{2,i}) \vee (s_{0,i} \wedge s_{1,i})$ $\vee (s_{0,i} \wedge s_{1,i} \wedge s_{2,i})$ |
| 41 | $h_{134}$ 0 1 1 0 1 0 0 1 | $h = (s_{0,i} \wedge \overline{s_{1,i} \wedge s_{2,i}}) \vee$ $(s_{0,i} \wedge s_{1,i} \wedge \overline{s_{2,i}})$ $\vee (s_{0,i} \wedge \overline{s_{1,i}} \wedge s_{2,i})$ $\vee (s_{0,i} \wedge s_{1,i} \wedge s_{2,i})$ |
| 42 | $h_{135}$ 1 0 0 1 1 0 0 1 | $h = (\overline{s_{0,i} \wedge s_{1,i} \wedge s_{2,i}}) \vee (s_{0,i} \wedge \overline{s_{1,i}} \wedge s_{2,i})$ $\vee (s_{0,i} \wedge s_{1,i} \wedge \overline{s_{2,i}})$ $\vee (s_{0,i} \wedge s_{1,i} \wedge s_{2,i}) =$ $(\overline{s_{1,i} \wedge s_{2,i}}) \vee (s_{0,i} \wedge s_{2,i})$ |
| 43 | $h_{136}$ 0 1 0 1 1 0 0 1 | $h = (s_{0,i} \wedge s_{1,i} \wedge \overline{s_{2,i}}) \vee (s_{0,i} \wedge s_{1,i} \wedge \overline{s_{2,i}})$ $\vee (s_{0,i} \wedge s_{1,i} \wedge s_{2,i})$ $\vee (s_{0,i} \wedge s_{1,i} \wedge s_{2,i}) =$ $(s_{0,i} \wedge \overline{s_{2,i}}) \vee (s_{0,i} \wedge s_{1,i})$ $\vee (\overline{s_{0,i}} \wedge s_{1,i} \wedge s_{2,i})$ |

TABLE 4-continued

The output of the function h includes four values "1"

| Sequence number | | i %8 0 1 2 3 4 5 6 7 | Logical expression |
|---|---|---|---|
| 44 | $h_{137}$ | 0 0 1 1 1 0 0 1 | $h = (s0,i \land s_{1,i} \land \overline{s_{2,i}}) \lor (s0,i \land s_{1,i} \land s2,i)$ $\lor (s_{0,i} \land s1,i \land s2,i)$ $\lor (s_{0,i} \land s_{1,i} \land s_{2,i}) =$ $(s_{1,i} \land \overline{s_{2,i}}) \lor (s0,i \land s_{1,i})$ $\lor (\overline{s_{0,i}} \land s1,i \land s2,i)$ |
| 45 | $h_{138}$ | 1 1 0 0 0 1 0 1 | $h = (s0,i \land \overline{s_{1,i}} \land \overline{s2,i}) \lor (s0,i \land \overline{s_{1,i}} \land s2,i)$ $\lor (s_{0,i} \land s1,i \land s2,i)$ $\lor (s_{0,i} \land s_{1,i} \land s_{2,i}) =$ $(\overline{s_{1,i}} \land s1,i) \lor (s0,i \land s_{2,i})$ |
| 46 | $h_{139}$ | 1 0 1 0 0 1 0 1 | $h = (s0,i \land \overline{s_{1,i}} \land \overline{s2,i}) \lor (s0,i \land s1,i \land s2,i)$ $\lor (s_{0,i} \land s1,i \land s_{2,i})$ $\lor (s_{0,i} \land s_{1,i} \land s_{2,i}) =$ $(s0,i \land \overline{s_{2,i}}) \lor (s0,i \land \overline{s_{2,i}})$ |
| 47 | $h_{140}$ | 0 1 1 0 0 1 0 1 | $h = (s_{0,i} \land \overline{s_{1,i}} \land \overline{s2,i}) \lor (s0,i \land s1,i \land s2,i)$ $\lor (s_{0,i} \land s1,i \land s_{2,i})$ $\lor (s_{0,i} \land s_{1,i} \land s_{2,i}) =$ $(s_{0,i} \land s1,i) \lor (s_{0,i} \land s_{2,i})$ $\lor (s0,i \land s_{1,i} \land s2,i)$ |
| 48 | $h_{141}$ | 1 0 0 1 0 1 0 1 | $h = (s0,i \land s1,i \land \overline{s_{2,i}}) \lor (s0,i \land s_{1,i} \land s2,i)$ $\lor (s_{0,i} \land s1,i \land s_{2,i})$ $\lor (s_{0,i} \land s_{1,i} \land s_{2,i}) =$ $(s_{0,i} \land s_{1,i}) \lor (s_{0,i} \land s_{2,i})$ $\lor (s0,i \land \overline{s_{1,i}} \land s2,i)$ |
| 49 | $h_{142}$ | 0 1 0 1 0 1 0 1 | $h = (s_{0,i} \land \overline{s_{1,i}} \land s2,i) \lor (s_{0,i} \land s_{1,i} \land s2,i)$ $\lor (s_{0,i} \land s1,i \land s_{2,i})$ $\lor (s_{0,i} \land s_{1,i} \land s_{2,i}) = s_{0,i}$ |
| 50 | $h_{143}$ | 0 0 1 1 0 1 0 1 | $h = (\overline{s_{0,i}} \land s1,i \land \overline{s_{2,i}}) \lor (s0,i \land s_{1,i} \land s2,i)$ $\lor (s_{0,i} \land s1,i \land s_{2,i})$ $\lor (s_{0,i} \land s_{1,i} \land s_{2,i}) =$ $(s_{1,i} \land s2,i) \lor (s_{0,i} \land s_{2,i})$ |
| 51 | $h_{144}$ | 1 0 0 0 1 1 0 1 | $h = (s0,i \land \overline{s_{1,i}} \land s2,i) \lor (s0,i \land \overline{s1,i} \land s2,i)$ $\lor (s_{0,i} \land s1,i \land s_{2,i})$ $\lor (s_{0,i} \land s_{1,i} \land s_{2,i}) =$ $(s0,i \land s1,i) \lor (s_{0,i} \land s_{2,i})$ |
| 52 | $h_{145}$ | 0 1 0 0 1 1 0 1 | $h = (s_{0,i} \land \overline{s_{1,i}} \land s2,i) \lor (s0,i \land \overline{s1,i} \land s2,i)$ $\lor (s_{0,i} \land s1,i \land s_{2,i})$ $\lor (s_{0,i} \land s_{1,i} \land s_{2,i}) =$ $(s_{0,i} \land \overline{s_{1,i}}) \lor (\overline{s_{1,i}} \land s2,i)$ $\lor (s_{0,} \land s_{2,i})$ |
| 53 | $h_{146}$ | 0 0 1 0 1 1 0 1 | $h = (s0,i \land s_{1,i} \land \overline{s_{2,i}}) \lor (s0,i \land \overline{s1,i} \land s2,i)$ $\lor (s_{0,i} \land s1,i \land s_{2,i})$ $\lor (s_{0,i} \land s_{1,i} \land s_{2,i}) =$ $(\overline{s_{1,i}} \land s2,i) \lor (s_{0,} \land s_{2,i})$ $\lor (\overline{s_{0,i}} \land s1,i \land s2,i)$ |
| 54 | $h_{147}$ | 0 0 0 1 1 1 0 1 | $h = (s_{0,i} \land s_{1,i} \land s2,i) \lor (s0,i \land \overline{s_{1,i}} \land s2,i)$ $\lor (s_{0,i} \land s1,i \land s_{2,i})$ $\lor (s_{0,i} \land s_{1,i} \land s_{2,i}) =$ $(s_{0,i} \land s_{1,i}) \lor (s1,i \land s_{2,i})$ |
| 55 | $h_{148}$ | 1 1 0 0 0 0 1 1 | $h = (s0,i \land \overline{s_{1,i}} \land s2,i) \lor (s0,i \land \overline{s_{1,i}} \land s2,i)$ $\lor (s0,i \land s_{1,i} \land s_{2,i})$ $\lor (s_{0,i} \land s_{1,i} \land s_{2,i}) =$ $(s1,i \land s2,i) \lor (s_{1,i} \land s_{2,i})$ |
| 56 | $h_{149}$ | 1 0 1 0 0 0 1 1 | $h = (s0,i \land \overline{s_{1,i}} \land s2,i) \lor (s0,i \land s1,i \land s2,i)$ $\lor (s_{0,i} \land s_{1,i} \land s_{2,i})$ $\lor (s_{0,i} \land s_{1,i} \land s_{2,i}) =$ $(s0,i \land s_{2,i}) \lor (s1,i \land s_{2,i})$ |
| 57 | $h_{150}$ | 0 1 1 0 0 0 1 1 | $h = (s_{0,i} \land \overline{s_{1,i}} \land s2,i) \lor (s0,i \land s1,i \land s2,i)$ $\lor (s_{0,i} \land s_{1,i} \land s_{2,i})$ $\lor (s_{0,i} \land s_{1,i} \land s_{2,i}) =$ $(s0,i \land s_{1,i}) \lor (s_{1,i} \land s_{2,i})$ $\lor (s_{0,i} \land \overline{s_{1,i}} \land s2,i)$ |
| 58 | $h_{151}$ | 1 0 0 1 0 0 1 1 | $h = (s0,i \land \overline{s_{1,i}} \land s2,i) \lor (s0,i \land s_{1,i} \land s2,i)$ $\lor (s_{0,i} \land s_{1,i} \land s_{2,i})$ $\lor (s_{0,i} \land s_{1,i} \land s_{2,i}) =$ $(s_{0,i} \land s_{1,i}) \lor (s_{1,i} \land s_{2,i})$ $\lor (s0,i \land \overline{s_{1,i}} \land s2,i)$ |
| 59 | $h_{152}$ | 0 1 0 1 0 0 1 1 | $h = (s_{0,i} \land \overline{s_{1,i}} \land s2,i) \lor (s0,i \land s_{1,i} \land s2,i)$ $\lor (s_{0,i} \land s_{1,i} \land s_{2,i})$ $\lor (s_{0,i} \land s_{1,i} \land s_{2,i}) =$ $(s_{0,i} \land s2,i) \lor (s_{1,i} \land s_{2,i})$ |
| 60 | $h_{153}$ | 0 0 1 1 0 0 1 1 | $h = (s0,i \land s_{1,i} \land s2,i) \lor (s_{0,i} \land s_{1,i} \land s2,i)$ $\lor (s0,i \land s_{1,i} \land s_{2,i})$ $\lor (s_{0,i} \land s_{1,i} \land s_{2,i}) = s_{1,i}$ |
| 61 | $h_{154}$ | 1 0 0 0 1 0 1 1 | $h = (s0,i \land \overline{s_{1,i}} \land s2,i) \lor (s0,i \land \overline{s1,i} \land s2,i)$ $\lor (s_{0,i} \land s_{1,i} \land s_{2,i})$ $\lor (s_{0,i} \land s_{1,i} \land s_{2,i}) =$ $(s0,i \land s1,i) \lor (s_{1,i} \land s_{2,i})$ |
| 62 | $h_{155}$ | 0 1 0 0 1 0 1 1 | $h = (s_{0,i} \land \overline{s_{1,i}} \land s2,i) \lor (s0,i \land \overline{s1,i} \land s2,i)$ $\lor (s_{0,i} \land s_{1,i} \land s_{2,i})$ $\lor (s_{0,i} \land s_{1,i} \land s_{2,i}) =$ $(s0,i \land s_{2,i}) \lor (s_{1,i} \land s_{2,i})$ $\lor (s_{0,i} \land \overline{s_{1,i}} \land s2,i)$ |
| 63 | $h_{156}$ | 0 0 1 0 1 0 1 1 | $h = (s0,i \land s_{1,i} \land s2,i) \lor (s_{0,i} \land \overline{s_{1,i}} \land s2,i)$ $\lor (\overline{s_{0,i}} \land s1,i \land s_{2,i})$ $\lor (s_{0,i} \land s_{1,i} \land s_{2,i}) =$ $(s0,i \land s_{1,i}) \lor (s0,i \land s_{2,i})$ $\lor (s_{1,i} \land s_{2,i})$ |
| 64 | $h_{157}$ | 0 0 0 1 1 0 1 1 | $h = (s_{0,i} \land s_{1,i} \land s2,i) \lor (s0,i \land \overline{s_{1,i}} \land s2,i)$ $\lor (s0,i \land s_{1,i} \land s_{2,i})$ $\lor (s_{0,i} \land s_{1,i} \land s_{2,i}) =$ $(s_{0,i} \land s_{1,i}) \lor (s0,i \land s_{2,i})$ |
| 65 | $h_{158}$ | 1 0 0 0 0 1 1 1 | $h = (s0,i \land \overline{s_{1,i}} \land s2,i) \lor (s0,i \land \overline{s_{1,i}} \land s2,i)$ $\lor (s0,i \land s_{1,i} \land s_{2,i})$ $\lor (s_{0,i} \land s_{1,i} \land s_{2,i}) =$ $(s_{0,i} \land s_{2,i}) \lor (s_{1,i} \land s_{2,i})$ $\lor (s0,i \land \overline{s_{1,i}} \land s2,i)$ |
| 66 | $h_{159}$ | 0 1 0 0 0 1 1 1 | $h = (s0,i \land s1,i \land s2,i) \lor (s_{0,i} \land \overline{s_{1,i}} \land s2,i)$ $\lor (s0,i \land s_{1,i} \land s_{2,i})$ $\lor (s_{0,i} \land s_{1,i} \land s_{2,i}) =$ $(s_{0,i} \land s1,i) \lor (s_{1,i} \land s_{2,i})$ |
| 67 | $h_{160}$ | 0 0 1 0 0 1 1 1 | $h = (s0,i \land s_{1,i} \land s2,i) \lor (s_{0,i} \land \overline{s_{1,i}} \land s2,i)$ $\lor (s0,i \land s_{1,i} \land s_{2,i})$ $\lor (s_{0,i} \land s_{1,i} \land s_{2,i}) =$ $(s0,i \land s_{1,i}) \lor (s_{0,i} \land s_{2,i})$ |
| 68 | $h_{161}$ | 0 0 0 1 0 1 1 1 | $h = (s_{0,i} \land s_{1,i} \land s2,i) \lor (s_{0,i} \land \overline{s_{1,i}} \land s2,i)$ $\lor (s0,i \land s_{1,i} \land s_{2,i})$ $\lor (s_{0,i} \land s_{1,i} \land s_{2,i}) =$ $(s0,i \land s_{1,i}) \lor (s_{0,i} \land s_{2,i})$ $\lor (s_{1,i} \land s_{2,i})$ |
| 69 | $h_{162}$ | 0 0 0 0 1 1 1 1 | $h = (s0,i \land s1,i \land s2,i) \lor (s_{0,i} \land \overline{s_{1,i}} \land s2,i)$ $\lor (s0,i \land s_{1,i} \land s_{2,i})$ $\lor (s_{0,i} \land s_{1,i} \land s_{2,i}) = s_{2,i}$ |

For a given function $h_j$ in the set of the function h: $h_1$ to $h_{162}$, $0 < j \leq 162$, and the following parity-check matrix $H_j$ with a size of $(m+2) \times (2^m - q)$ is determined:

$$H_j = [g(0), g(1), g(2), \ldots, g(2^m - q - 1)] \quad (5)$$

Based on Formula (5), the function g may be determined as follows:

$$g(i) = \begin{bmatrix} s_{0,i} \\ s_{1,i} \\ \vdots \\ s_{m-1,i} \\ s_{m,i} \\ 1 \end{bmatrix} = \begin{bmatrix} s_{0,i} \\ s_{1,i} \\ \vdots \\ s_{m-1,i} \\ h_j(s_{0,i}, s_{1,i}, s_{2,i}) \\ 1 \end{bmatrix} \quad (6)$$

Further, a rank of the parity-check matrix $H_j$ is determined. If the parity-check matrix $H_j$ is not non-singular, it indicates that the function $h_j$ corresponding to the parity-check matrix $H_j$ is unavailable. Otherwise, if the parity-check matrix $H_j$ is a non-singular matrix, it indicates that the function $h_j$ corresponding to the parity-check matrix $H_j$ is available.

In some example embodiments, a non-singular parity-check matrix $H_j$ is transformed into a systematic form. For example, m+2 linearly independent column vectors may be selected from the parity-check matrix $H_j$ from right to left, and these column vectors are moved to the rightmost of the parity-check matrix $H_j$, as shown below:

$$H_{DE,j} = [H_L; H_R] \quad (7)$$

Herein $H_R$ represents a right part of a parity-check matrix $H_{DE,j}$, and is a matrix that includes m+2 linearly independent column vectors and whose size is $(m+2) \times (m+2)$; and $H_L$ represents an $(m+2) \times (2^m-2-m-q)$ matrix obtained after the matrix $H_R$ is removed from the matrix $H_j$.

Further, elementary row transformation is performed on the parity-check matrix $H_{DE,j}$, so that a right part of the parity-check matrix is an identity matrix, to obtain a system check matrix $H_{sys,j}$:

$$H_{sys,j} = [P; I] \quad (8)$$

Herein I represents an identity matrix with a size of $(m+2) \times (m+2)$, P represents a matrix with a size of $(m+2) \times (2^m-2-m-q)$, and $P = (H_R)^{-1} H_L$.

Further, for the function $h_j$, a generator matrix $G_j$ that is of a system Hamming code and whose size is $(2^m-2-m-q) \times (2^m-q)$ may be determined according to Formula (9):

$$G_j = [I; P^T] \quad (9)$$

Herein I represents an identity matrix with a size of $(2^m-2-m-q) \times (2^m-2-m-q)$.

Herein, encoding complexity of the Hamming code is related to a quantity of elements 1 in the matrix P, and the quantity of elements 1 is denoted as $\mathcal{O}$. Therefore, in some example embodiments, the parameter $\mathcal{O}$ may be used as an indicator indicating the encoding complexity of the Hamming code (DE-Hamming) in this disclosure.

Based on the system check matrix $H_{sys,j}$, a weight hierarchy of the Hamming code (DE-Hamming) in this disclosure may be further determined. Since a quantity $A_j$ of minimum code weights 4 has dominant impact on performance of the Hamming code, in some example embodiments, the parameter $A_j$ may be used as an indicator indicating the performance of the Hamming code.

For the set of the function h shown in Table 1 to Table 4, that is, functions $h_1$ to $h_{162}$, the foregoing operations are repeated, and parameters $\mathcal{O}$ and $A_j$ that respectively indicate the encoding complexity and the Hamming code performance are determined. Based on one or more of the parameters $\mathcal{O}$ and $A_j$, the target function $h(s_{0,i}, s_{1,i}, s_{2,i})$, the target parity-check matrix $H_{DE}$, and the generator matrix G for generating the Hamming code that can provide low encoding complexity and excellent performance can be determined.

The following briefly describes a Hamming code generating method according to an embodiment of this disclosure. In some embodiments, corresponding parity-check matrices $H_j$ may be determined for all the functions h1 to h162 in the set of the function h. In some other embodiments, parity-check matrices $H_j$ obtained by using some functions h in the set of the function h are definitely not non-singular, for example, functions h93, h102, h113, h142, h153, and h162 in Table 1 to Table 4. In consideration of this, subsequent steps may not be performed for these functions h and their parity-check matrices $H_j$. In this embodiment, a predetermined function set that includes some functions in the set of the function h may be used, and includes a plurality of candidate functions h.

The predetermined function set is used as an example. A plurality of corresponding candidate parity-check matrices $H_j$ may be determined based on the plurality of candidate functions h. A non-singular matrix is selected from these candidate parity-check matrices $H_j$ as a first candidate parity-check matrix set. The first candidate parity-check matrix set is transformed to obtain a second candidate parity-check matrix set in a systematic form. For the second candidate parity-check matrix set, matrices P corresponding to the second candidate parity-check matrix set may be first sorted based on parameters $\mathcal{O}$, and a matrix P with a parameter $\mathcal{O}$ less than a predetermined threshold is selected from the second candidate parity-check matrix set. Then, parity-check matrices $H_{DE}$ corresponding to these matrices P are determined as a first group of candidate parity-check matrices. Further, a target parity-check matrix $H_{DE}$ may be determined from the first group of candidate parity-check matrices, and a target function $h(s_{0,i}, s_{1,i}, s_{2,i})$ corresponding to the target parity-check matrix may be determined. In this embodiment, the predetermined threshold may be a predetermined quantity of elements 1. Additionally, or alternatively, a matrix P with a minimum value in all the parameters $\mathcal{O}$ may be selected.

In an implementation of the foregoing embodiment, a corresponding parameter $A_j$ may be further determined for each candidate parity-check matrix in the determined first group of candidate parity-check matrices. Then, based on the parameter $A_j$, the target parity-check matrix is determined from the first group of candidate parity-check matrices, and the corresponding function h is determined as the target function $h(s_{0,i}, s_{1,i}, s_{2,i})$. For example, a candidate parity-check matrix with a minimum quantity of minimum code weights may be selected from the first group of candidate parity-check matrices as a second group of candidate parity-check matrices based on the parameter $A_j$. Then, the target parity-check matrix is determined from the second group of candidate parity-check matrices, and the corresponding function h is determined as the target function $h(s_{0,i}, s_{1,i}, s_{2,i})$.

In other example embodiments, the parameter $A_j$ may be considered first. Similarly, the predetermined function set is used as an example. A plurality of corresponding candidate parity-check matrices $H_j$ may be determined. A non-singular matrix is selected from these candidate parity-check matrices $H_j$ as a first candidate parity-check matrix set. Similarly, the first candidate parity-check matrix set is transformed to obtain a second candidate parity-check matrix set in a systematic form. For the second candidate parity-check matrix set, sorting may be performed based on the parameter $A_j$, and a parity-check matrix with a minimum quantity of minimum code weights is selected from the second candidate parity-check matrix set as a first group of candidate parity-check matrices. Further, the target parity-check matrix is determined from the first group of candidate parity-check matrices.

In an implementation of the foregoing embodiment, a corresponding parameter $\mathcal{O}$ may be further determined for each candidate parity-check matrix in the determined first group of candidate parity-check matrices. Then, based on the parameter $\mathcal{O}$, the target parity-check matrix is determined from the first group of candidate parity-check matrices, and the corresponding function h is determined as the target function $h(s_{0,i}, s_{1,i}, s_{2,i})$. For example, a candidate parity-check matrix with a parameter $\mathcal{O}$ less than a predetermined threshold may be selected as a second group of candidate parity-check matrices based on a parameter $\mathcal{O}$ associated with each candidate parity-check matrix in the first group of candidate parity-check matrices. For example, a candidate parity-check matrix with a minimum quantity of minimum code weights may be selected from the first group of candidate parity-check matrices as the second group of candidate parity-check matrices. Then, the target parity-check matrix is determined from the second group of candidate parity-check matrices, and the corresponding function h is determined as the target function $h(s_{0,i},s_{1,i},s_{2,i})$.

In an implementation of determining the target parity-check matrix from the second group of candidate parity-check matrices, an operation quantity of a function h that is in the set of the function h and that corresponds to each candidate parity-check matrix in the second group of candidate parity-check matrices may be determined, to determine, based on the operation quantity, the corresponding target function $h(s_{0,i},s_{1,i},s_{2,i})$ and the target parity-check matrix from the second group of candidate parity-check matrices. For example, a function h with a minimum operation quantity is selected as the target function $h(s_{0,i},s_{1,i},s_{2,i})$.

In an example embodiment of this disclosure, the predetermined function set for determining the target function $h(s_{0,i},s_{1,i},s_{2,i})$ may be obtained according to logical expressions of the function h shown in Table 1 to Table 4, and the predetermined function set includes one or more of the following functions: $h(s_{0,i},s_{1,i},s_{2,i})=s_{0,i}\wedge s_{1,i}\wedge \overline{s_{2,i}}, h(s_{0,i},s_{1,i},s_{2,i})=s_{0,i}\wedge \overline{s_{1,i}}\wedge s_{2,i}, h(s_{0,i},s_{1,i},s_{2,i})=\overline{s_{0,i}}\wedge s_{1,i}\wedge s_{2,i}, h(s_{0,i},s_{1,i},s_{2,i})=s_{0,i}\wedge s_{1,i}\wedge s_{2,i}, h(s_{0,i},s_{1,i},s_{2,i})=s_{0,i}\wedge s_{2,i}, h(s_{0,i},s_{1,i},s_{2,i})=s_{1,i}\wedge s_{2,i}, h(s_{0,i},s_{1,i},s_{2,i})=(\overline{s_{0,i}}\wedge s_{2,i})\vee(s_{1,i}\wedge s_{2,i}), h(s_{0,i},s_{1,i},s_{2,i})=(s_{0,i}\wedge \overline{s_{1,i}})\vee(\overline{s_{0,i}}\wedge s_{1,i})\vee(s_{0,i}\vee s_{2,i}), h(s_{0,i},s_{1,i},s_{2,i})=(s_{1,i}\wedge \overline{s_{2,i}})\vee(s_{0,i}\wedge s_{2,i})$, and $h(s_{0,i},s_{1,i},s_{2,i})=(s_{0,i}\vee \overline{s_{2,i}})\vee(s_{1,i}\wedge s_{2,i})$ that respectively correspond to h4, h6, h7, h33, h35, h36, h40, h54, h65, h143, and h152 in Table 1 to Table 4. However, it should be understood that the predetermined function set and the universal set of the function h provided above are merely examples. In practice, according to a requirement, more or fewer candidate functions may be included, and a candidate function h that is not shown in Table 1 to Table 4 may be included. The scope of this disclosure is not limited in this aspect.

According to an embodiment of this disclosure, a Hamming code generating method is provided. According to the method, for various code lengths and information bit lengths, an appropriate function is selected from a function set for determining a parity-check matrix. Therefore, a generated Hamming code can implement excellent performance and reduce encoding and decoding complexity at both encoding and decoding ends, thereby enhancing performance of a communication system and improving communication quality.

An optimized Hamming code according to embodiments of this disclosure, an example encoding process, and an example decoding process based on the optimized Hamming code are discussed in detail below with reference to FIG. 2 to FIG. 5.

Figure 2:
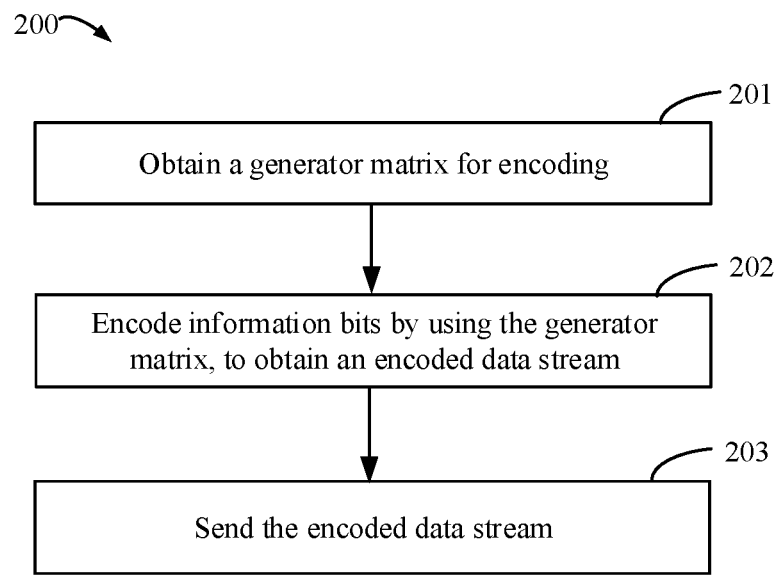
FIG. 2 is a flowchart of an encoding method according to an example embodiment of this disclosure.

FIG. 2 is a flowchart of an encoding method 200 according to an example embodiment of this disclosure. The method 200 may be implemented by the encoding device 110 shown in FIG. 1, and may involve the channel 104 and the decoding device 120 shown in FIG. 1. For ease of discussion, the following describes the method 200 with reference to FIG. 1. It should be understood that the method 200 is also applicable to other communication scenarios and other encoding devices.

At a block 201, the encoding device 110 obtains a generator matrix G for encoding. The generator matrix G is determined based on a target parity-check matrix $H_{DE}$ of a Hamming code for encoding. In some example embodiments, the target parity-check matrix $H_{DE}$ is determined based on a target function $h(s_{0,i},s_{1,i},s_{2,i})$ for decoding. The target function $h(s_{0,i},s_{1,i},s_{2,i})$ is one of a predetermined function set, and is used to determine a not-all-zero row vector D extended based on the target parity-check matrix $H_{DE}$.

The predetermined function set may include a plurality of candidate functions for determining the not-all-zero row vector D extended based on the target parity-check matrix $H_{DE}$. In some example embodiments, the target function $h(s_{0,i},s_{1,i},s_{2,i})$ may determine the not-all-zero row vector D based on at least some elements of first three elements $s_{0,i}, s_{1,i}$, and $s_{2,i}$ of column vectors corresponding to the not-all-zero row vector D. For example, the predetermined function set may include one or more of the following: $h(s_{0,i},s_{1,i},s_{2,i})=s_{1,i}\wedge s_{2,i}, h(s_{0,i},s_{1,i},s_{2,i})=s_{0,i}\wedge s_{1,i}, h(s_{0,i},s_{1,i},s_{2,i})=s_{0,i}\wedge s_{2,i}, h(s_{0,i},s_{1,i},s_{2,i})=s_{0,i}\wedge \overline{s_{1,i}}\wedge s_{2,i}, h(s_{0,i},s_{1,i},s_{2,i})=\overline{s_{0,i}}\wedge s_{1,i}\wedge s_{2,i}, h(s_{0,i},s_{1,i},s_{2,i})=s_{0,i}\wedge s_{1,i}\wedge \overline{s_{2,i}}, h(s_{0,i},s_{1,i},s_{2,i})=(\overline{s_{0,i}}\wedge s_{2,i})\vee(s_{1,i}\wedge s_{2,i}), h(s_{0,i},s_{1,i},s_{2,i})=(s_{0,i}\wedge \overline{s_{1,i}})\vee(\overline{s_{1,i}}\wedge s_{2,i}), h(s_{0,i},s_{1,i},s_{2,i})=(\overline{s_{0,i}}\wedge s_{1,i})\vee(\overline{s_{0,i}}\wedge s_{2,i}), h(s_{0,i},s_{1,i},s_{2,i})=(s_{1,i}\wedge \overline{s_{2,i}})\vee(s_{0,i}\vee s_{2,i})$, and $h(s_{0,i},s_{1,i},s_{2,i})=(s_{0,i}\wedge \overline{s_{2,i}})\vee(s_{1,i}\wedge s_{2,i})$. For another example, the predetermined function set may alternatively include some or all functions h shown in Table 1 to Table 4, or functions not shown in Table 1 to Table 4.

In some example embodiments, a specified code length of the Hamming code is 180, a length of to-be-sent information bits is 170, all elements in a ninth row of the target parity-check matrix are 1, and the target function $h(s_{0,i},s_{1,i},s_{2,i})$ determines an element $s_{8,i}$ of a column vector corresponding to the not-all-zero row vector as $s_{8,i}=h(s_{0,i},s_{1,i},s_{2,i})=s_{0,i}\wedge s_{1,i}$. Herein i is an integer greater than or equal to 0 and less than 180, $i=2^7 s_{7,i}+2^6 s_{6,i}+2^5 s_{5,i}+2^4 s_{4,i}+2^3 s_{3,i}+2^2 s_{2,i}+2s_{1,i}+s_{0,i}$, and $s_{8,i}, s_{7,i}, s_{6,i}, s_{5,i}, s_{4,i}, s_{3,i}, s_{2,i}, s_{1,i}$, and $s_{0,i}$ are respectively elements of column vectors corresponding to the row vector of the target parity-check matrix.

In some other example embodiments, a specified code length of the Hamming code is 128, and a length of to-be-sent information bits is 119. In this embodiment, all elements $s_{8,i}$ in an eighth row of the target parity-check matrix $H_{DE}$ are 1, and the target function $h(s_{0,i},s_{1,i},s_{2,i})$ determines an element $s_{7,i}$ of a column vector corresponding to the not-all-zero row vector D as one of $s_{7,i}=h(s_{0,i},s_{1,i},s_{2,i})=s_{0,i}\wedge s_{1,i}, s_{7,i}=h(s_{0,i},s_{1,i},s_{2,i})=s_{0,i}\wedge s_{2,i}$, and $s_{7,i}=h(s_{0,i},s_{1,i},s_{2,i})=s_{1,i}\wedge s_{2,i}$. Herein i is an integer greater than or equal to 0 and less than 128, $i=2^6 s_{6,i}+2^5 s_{5,i}+2^4 s_{4,i}+2^3 s_{3,i}+2^2 s_{2,i}+2s_{1,i}+s_{0,i}$, and $s_{7,i}, s_{6,i}, s_{5,i}, s_{4,i}, s_{3,i}, s_{2,i}, s_{1,i}$, and $s_{0,i}$ are respectively elements of column vectors corresponding to the row vector of the target parity-check matrix.

In still other example embodiments, a specified code length of the Hamming code is 64, and a length of information bits is 56. In this embodiment, all elements $s_{7,i}$ in a seventh row of the target parity-check matrix $H_{DE}$ are 1, and the target function $h(s_{0,i},s_{1,i},s_{2,i})$ determines an element $s_{6,i}$ of a column vector corresponding to the not-all-zero row vector as one of $s_{6,i}=h(s_{0,i},s_{1,i},s_{2,i})=s_{0,i}\wedge s_{1,i}, s_{6,i}=h(s_{0,i},s_{1,i},s_{2,i})=s_{0,i}\wedge s_{2,i}$, and $s_{6,i}=h(s_{0,i},s_{1,i},s_{2,i})=s_{1,i}\wedge s_{2,i}$. Herein i is an integer greater than or equal to 0 and less than 64, $i=2^5 s_{5,i}+2^4 s_{4,i}+2^3 s_{3,i}+2^2 s_{2,i}+2s_{1,i}+s_{0,i}$, and $s_{6,i}, s_{5,i}, s_{4,i}, s_{3,i}, s_{2,i}, s_{1,i}$, and $s_{0,i}$ are respectively elements of column vectors corresponding to the row vector of the target parity-check matrix.

In some example embodiments, the generator matrix G is determined by using a system check matrix, and the system check matrix is obtained by transforming the target parity-check matrix $H_{DE}$, for example, as described in the foregoing Hamming code generating method provided in embodiments of this disclosure.

In an example implementation of determining the target parity-check matrix $H_{DE}$, a plurality of candidate parity-check matrices $H_j$ may be determined based on a plurality of candidate functions hj. A non-singular matrix is selected from the plurality of candidate parity-check matrices $H_j$, to obtain a first candidate parity-check matrix set. Then, the first candidate parity-check matrix set is transformed to a second candidate parity-check matrix set in a systematic form. An associated third parameter may be determined for each candidate parity-check matrix in the second candidate parity-check matrix set. For example, the third parameter may indicate encoding complexity of the Hamming code. A first group of candidate parity-check matrices may be selected from the first candidate parity-check matrix set based on the third parameter. Then, the target parity-check matrix $H_{DE}$ may be determined from the first group of candidate parity-check matrices.

In some example embodiments, the target parity-check matrix $H_{DE}$ may be further determined from the first group of candidate parity-check matrices based on a fourth parameter indicating a quantity of minimum code weights of the Hamming code. Specifically, the associated fourth parameter is determined for each candidate parity-check matrix in the first group of candidate parity-check matrices, and the fourth parameter may indicate a quantity of minimum code weights of the Hamming code corresponding to each candidate parity-check matrix in the first group of candidate parity-check matrices. A second group of candidate parity-check matrices may be selected from the first group of candidate parity-check matrices based on the determined fourth parameter. Then, the target parity-check matrix $H_{DE}$ may be determined from the second group of candidate parity-check matrices.

In another example implementation of determining the target parity-check matrix $H_{DE}$, after the second candidate parity-check matrix set in the systematic form is obtained, a fourth parameter associated with each candidate parity-check matrix in the second candidate parity-check matrix set may be determined. For example, the fourth parameter may indicate a quantity of minimum code weights of the Hamming code corresponding to each candidate parity-check matrix in the second candidate parity-check matrix set. The first group of candidate parity-check matrices may be selected from the first candidate parity-check matrix set based on the fourth parameter. For example, a candidate parity-check matrix corresponding to the Hamming code with a minimum quantity of minimum code weights may be selected as the first group of candidate parity-check matrices. Then, the target parity-check matrix $H_{DE}$ may be determined from the first group of candidate parity-check matrices.

In some example embodiments, the target parity-check matrix $H_{DE}$ may be further determined from the first group of candidate parity-check matrices based on the third parameter indicating the encoding complexity of the Hamming code. Specifically, an associated third parameter may be determined for each candidate parity-check matrix in the first group of candidate parity-check matrices. For example, the third parameter may indicate the encoding complexity of the Hamming code. Then a second group of candidate parity-check matrices may be selected from the first group of candidate parity-check matrices based on the determined third parameter. For example, the second group of candidate parity-check matrices has the third parameter less than a predetermined threshold. Additionally, or alternatively, a candidate parity-check matrix with the lowest encoding complexity may be selected as the second group of candidate parity-check matrices. Then, the target parity-check matrix $H_{DE}$ may be determined from the second group of candidate parity-check matrices.

In an example implementation of determining the target parity-check matrix $H_{DE}$ from the second group of candidate parity-check matrices, an operation quantity of a function hj corresponding to each candidate parity-check matrix in the second group of candidate parity-check matrices in the function set may be further determined, for example, a total quantity of operators "negate $\bar{b}$", "and $\wedge$", and "or $\vee$" in a logical expression of the function hj. Then, the target parity-check matrix $H_{DE}$ is determined based on the determined operation quantity. For example, a target function hj with a minimum operation quantity may be selected as the target function $h(s_{0,i}, s_{1,i}, s_{2,i})$, and a parity-check matrix $H_{DE,j}$ corresponding to the target function is determined as the target parity-check matrix $H_{DE}$.

In some example embodiments, for each candidate parity-check matrix in the first candidate parity-check matrix set, at least some linearly independent column vectors are moved from right to left to the rightmost of the corresponding candidate parity-check matrix, and elementary row transformation is performed, so that a right part of the corresponding candidate parity-check matrix is an identity matrix, to obtain the second candidate parity-check matrix set in the systematic form.

At a block 202, the encoding device 110 encodes an information bit sequence by using the generator matrix G to obtain an encoded data stream c. For example, for the information bit sequence b, the encoded data stream corresponding to the information bit sequence is c=bG.

At a block 203, the encoding device 110 sends the encoded data stream. For example, the encoding device 110 may send the encoded data stream to the decoding device 120 through the channel 104.

According to this embodiment of this disclosure, the encoding method is provided. In the method, a double-extended Hamming code is obtained based on a conventional Hamming code, and the parity-check matrix $H_{DE}$ is generated by selecting an appropriate function $h_j$. Therefore, in specific code space, both encoding complexity $\mathcal{O}$ and a quantity $A_j$ of minimum code weights 4 of the designed double-extended Hamming code are minimum. In addition, a target function with a minimum quantity of operations (for example, "negate $\bar{b}$", "and $\wedge$", or "or $\vee$") in a logical expression of a function may be selected, to reduce encoding complexity of using the Hamming code.

Figure 3:
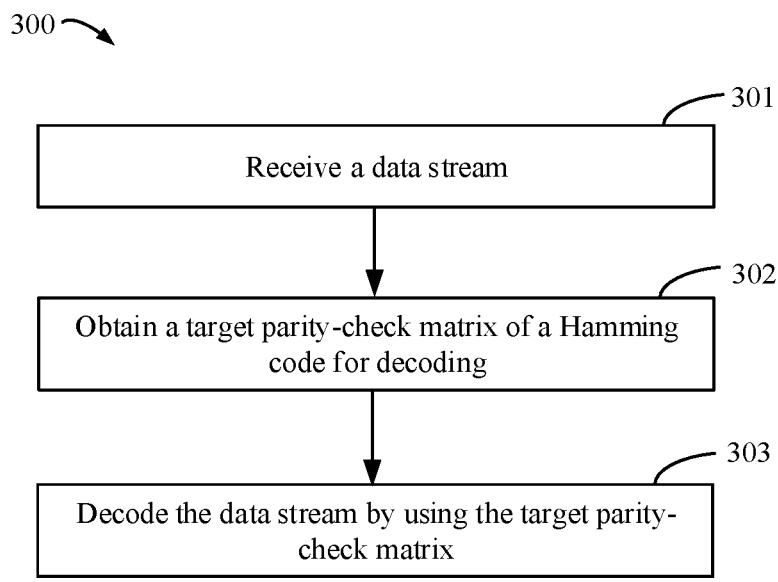
FIG. 3 is a flowchart of a decoding method according to an example embodiment of this disclosure.

FIG. 3 is a flowchart of a decoding method 300 according to an example embodiment of this disclosure. The method 300 may be implemented by the decoding device 120 shown in FIG. 1, and may involve the channel 104 and the encoding device 110 shown in FIG. 1. For ease of discussion, the following describes the method 300 with reference to FIG. 1. It should be understood that the method 300 is also applicable to other communication scenarios and other decoding devices.

At a block 301, the decoding device 120 receives a data stream. For example, the decoding device 120 may receive, from the encoding device 110 through the channel 104, the data stream encoded by using a Hamming code.

At a block 302, the decoding device 120 obtains a target parity-check matrix $H_{DE}$ of a Hamming code for decoding. In some example embodiments, the target parity-check matrix $H_{DE}$ is determined based on a target function $h(s_{0,i},$ $s_{1,i}, s_{2,i}$) for decoding. The target function $h(s_{0,i}, s_{1,i}, s_{2,i})$ is one of a predetermined function set, and is used to determine a not-all-zero row vector D extended based on the target parity-check matrix $H_{DE}$.

The predetermined function set may include a plurality of candidate functions for determining the not-all-zero row vector D extended based on the target parity-check matrix $H_{DE}$. In some example embodiments, the target function $h(s_{0,i}, s_{1,i}, s_{2,i})$ may determine the not-all-zero row vector D based on at least some elements of first three elements $s_{0,i}, s_{1,i}$, and $s_{2,i}$ of column vectors corresponding to the not-all-zero row vector D. For example, the predetermined function set may include one or more of the following: $h(s_{0,i}, s_{1,i}, s_{2,i}) = s_{1,i} \wedge s_{2,i}, h(s_{0,i}, s_{1,i}, s_{2,i}) = s_{0,i} \wedge s_{1,i}, h(s_{0,i}, s_{1,i}, s_{2,i}) = s_{0,i} \wedge s_{2,i}, h(s_{0,i}, s_{1,i}, s_{2,i}) = s_{0,i} \wedge \overline{s_{1,i}} \wedge s_{2,i}, h(s_{0,i}, s_{1,i}, s_{2,i}) = s_{0,i} \wedge \overline{s_{1,i}} \wedge \overline{s_{2,i}}, h(s_{0,i}, s_{1,i}, s_{2,i}) = s_{0,i} \wedge \overline{s_{1,i}} \wedge \overline{s_{2,i}}, h(s_{0,i}, s_{1,i}, s_{2,i}) = (s_{0,i} \wedge \overline{s_{2,i}}) \vee (s_{1,i} \vee \overline{s_{2,i}}), h(s_{0,i}, s_{1,i}, s_{2,i}) = (s_{0,i} \wedge \overline{s_{1,i}}) \vee (\overline{s_{1,i}} \wedge s_{2,i}), h(s_{0,i}, s_{1,i}, s_{2,i}) = (s_{0,i} \wedge \overline{s_{1,i}}) \vee (\overline{s_{0,i}} \wedge s_{2,i}), h(s_{0,i}, s_{1,i}, s_{2,i}) = (s_{1,i} \wedge \overline{s_{2,i}}) \vee (s_{0,i} \vee s_{2,i})$, and $h(s_{0,i}, s_{1,i}, s_{2,i}) = (s_{0,i} \wedge \overline{s_{2,i}}) \vee (s_{1,i} \wedge s_{2,i})$. For another example, the predetermined function set may alternatively include some or all functions h shown in Table 1 to Table 4, or functions not shown in Table 1 to Table 4.

In some example embodiments, a specified code length of the Hamming code is 180, a length of received information bits is 170, all elements in a ninth row of the target parity-check matrix are 1, and the target function $h(s_{0,i}, s_{1,i}, s_{2,i})$ determines an element $s_{8,i}$ of a column vector corresponding to the not-all-zero row vector as $s_{8,i} = h(s_{0,i}, s_{1,i}, s_{2,i}) = s_{0,i} \wedge s_{1,i}$. Herein i is an integer greater than or equal to 0 and less than 180, $i = 2^7 s_{7,i} + 2^6 s_{6,i} + 2^5 s_{5,i} + 2^4 s_{4,i} + 2^3 s_{3,i} + 2^2 s_{2,i} + 2 s_{1,i} + s_{0,i}$, and $s_{8,i}, s_{7,i}, s_{6,i}, s_{5,i}, s_{4,i}, s_{3,i}, s_{2,i}, s_{1,i}$, and $s_{0,i}$ are respectively elements of column vectors corresponding to the row vector of the target parity-check matrix.

In some other example embodiments, a specified code length of the Hamming code is 128, and a length of received information bits is 119. In this embodiment, all elements $s_{8,i}$ in an eighth row of the target parity-check matrix $H_{DE}$ are 1, and the target function $h(s_{0,i}, s_{1,i}, s_{2,i})$ determines an element $s_{7,i}$ of a column vector corresponding to the not-all-zero row vector D as one of $s_{7,i} = h(s_{0,i}, s_{1,i}, s_{2,i}) = s_{0,i} \wedge s_{1,i}, s_{7,i} = h(s_{0,i}, s_{1,i}, s_{2,i}) = s_{0,i} \wedge s_{2,i}$, and $s_{7,i} = h(s_{0,i}, s_{1,i}, s_{2,i}) = s_{1,i} \wedge s_{2,i}$. Herein i is an integer greater than or equal to 0 and less than 128, $i = 2^6 s_{6,i} + 2^5 s_{5,i} + 2^4 s_{4,i} + 2^3 s_{3,i} + 2^2 s_{2,i} + 2 s_{1,i} + s_{0,i}$, and $s_{7,i}, s_{6,i}, s_{5,i}, s_{4,i}, s_{3,i}, s_{2,i}, s_{1,i}$, and $s_{0,i}$ are respectively elements of column vectors corresponding to the row vector of the target parity-check matrix.

In still other example embodiments, a specified code length of the Hamming code is 64, and a length of information bits is 56. In this embodiment, all elements $s_{7,i}$ in a seventh row of the target parity-check matrix $H_{DE}$ are 1, and the target function $h(s_{0,i}, s_{1,i}, s_{2,i})$ determines an element $s_{6,i}$ of a column vector corresponding to the not-all-zero row vector as one of $s_{6,i} = h(s_{0,i}, s_{1,i}, s_{2,i}) = s_{0,i} \wedge s_{1,i}, s_{6,i} = h(s_{0,i}, s_{1,i}, s_{2,i}) = s_{0,i} \wedge s_{2,i}$, and $s_{6,i} = h(s_{0,i}, s_{1,i}, s_{2,i}) = s_{1,i} \wedge s_{2,i}$. Herein i is an integer greater than or equal to 0 and less than 64, $i = 2^5 s_{5,i} + 2^4 s_{4,i} + 2^3 s_{3,i} + 2^2 s_{2,i} + s_{0,i}$, and $s_{6,i}, s_{5,i}, s_{4,i}, s_{3,i}, s_{2,i}, s_{1,i}$, and $s_{0,i}$ are respectively elements of column vectors corresponding to the row vector of the target parity-check matrix.

In some example embodiments, a generator matrix G is determined by using a system check matrix, and the system check matrix is obtained by transforming the target parity-check matrix $H_{DE}$, for example, as described in the foregoing Hamming code generating method provided in embodiments of this disclosure.

In an example implementation of determining the target parity-check matrix $H_{DE}$, a plurality of candidate parity-check matrices $H_j$ may be determined based on a plurality of candidate functions hj. A non-singular matrix is selected from the plurality of candidate parity-check matrices $H_j$, to obtain a first candidate parity-check matrix set. Then, the first candidate parity-check matrix set is transformed to a second candidate parity-check matrix set in a systematic form. An associated third parameter may be determined for each candidate parity-check matrix in the second candidate parity-check matrix set. For example, the third parameter may indicate encoding complexity of the Hamming code. The first group of candidate parity-check matrices may be selected from the first candidate parity-check matrix set based on the third parameter. Then, the target parity-check matrix $H_{DE}$ may be determined from the first group of candidate parity-check matrices.

In some example embodiments, the target parity-check matrix $H_{DE}$ may be further determined from the first group of candidate parity-check matrices based on a fourth parameter indicating a quantity of minimum code weights of the Hamming code. Specifically, the associated fourth parameter is determined for each candidate parity-check matrix in the first group of candidate parity-check matrices, and the fourth parameter may indicate a quantity of minimum code weights of the Hamming code corresponding to each candidate parity-check matrix in the first group of candidate parity-check matrices. A second group of candidate parity-check matrices may be selected from the first group of candidate parity-check matrices based on the determined fourth parameter. Then, the target parity-check matrix $H_{DE}$ may be determined from the second group of candidate parity-check matrices.

In another example implementation of determining the target parity-check matrix $H_{DE}$, after the second candidate parity-check matrix set in the systematic form is obtained, a fourth parameter associated with each candidate parity-check matrix in the second candidate parity-check matrix set may be determined. For example, the fourth parameter may indicate a quantity of minimum code weights of the Hamming code corresponding to each candidate parity-check matrix in the second candidate parity-check matrix set. The first group of candidate parity-check matrices may be selected from the first candidate parity-check matrix set based on the fourth parameter. For example, a candidate parity-check matrix corresponding to the Hamming code with a minimum quantity of minimum code weights may be selected as the first group of candidate parity-check matrices. Then, the target parity-check matrix $H_{DE}$ may be determined from the first group of candidate parity-check matrices.

In some example embodiments, the target parity-check matrix $H_{DE}$ may be further determined from the first group of candidate parity-check matrices based on the third parameter indicating the encoding complexity of the Hamming code. Specifically, an associated third parameter may be determined for each candidate parity-check matrix in the first group of candidate parity-check matrices. For example, the third parameter may indicate the encoding complexity of the Hamming code. Then a second group of candidate parity-check matrices may be selected from the first group of candidate parity-check matrices based on the determined third parameter. For example, the second group of candidate parity-check matrices has the third parameter less than a predetermined threshold. Additionally, or alternatively, a candidate parity-check matrix with the lowest encoding complexity may be selected as the second group of candidate parity-check matrices. Then, the target parity-check matrix $H_{DE}$ may be determined from the second group of candidate parity-check matrices.

In an example implementation of determining the target parity-check matrix $H_{DE}$ from the second group of candidate parity-check matrices, an operation quantity of a function hj corresponding to each candidate parity-check matrix in the second group of candidate parity-check matrices in the function set may be further determined, for example, a total quantity of operators "negate $\bar{b}$", "and $\wedge$", and "or $\vee$" in a logical expression of the function hj. Then, the target parity-check matrix $H_{DE}$ is determined based on the determined operation quantity. For example, a target function hj with a minimum operation quantity may be selected as the target function $h(s_{0,i}, s_{1,i}, s_{2,i})$, and a parity-check matrix $H_{DE,j}$ corresponding to the target function is determined as the target parity-check matrix $H_{DE}$.

In some example embodiments, for each candidate parity-check matrix in the first candidate parity-check matrix set, at least some linearly independent column vectors are moved from right to left to the rightmost of the corresponding candidate parity-check matrix, and elementary row transformation is performed, so that a right part of the corresponding candidate parity-check matrix is an identity matrix, to obtain the second candidate parity-check matrix set in the systematic form.

At a block 303, the decoding device 120 decodes the data stream by using the target parity-check matrix $H_{DE}$. In this way, the decoding device 120 may obtain original information bits sent by a transmit end.

In some example embodiments, the decoding device 120 may calculate a syndrome for the data based on the target parity-check matrix $H_{DE}$. If the syndrome is zero, at least some bits of the data stream may be output as decoded information bits. Otherwise, if the syndrome is not zero, it is determined whether there is a first column vector equal to the syndrome in the target parity-check matrix $H_{DE}$. If there is the first column vector equal to the syndrome in the target parity-check matrix, bits in the data stream that correspond to the first column vector are flipped, and at least some bits of the data stream after the flipping are output as the decoded information bits.

According to an example embodiment of this disclosure, a decoding method is provided. This method uses the double-extended Hamming code based on a conventional Hamming code. The parity-check matrix $H_{DE}$ of the Hamming code is generated by using a more concise target function selected from the predetermined function set based on the complexity $\mathcal{O}$, the quantity $A_j$ of minimum code weights, and the quantity of operations (for example, "negate $\bar{b}$", "and $\wedge$", "or $\vee$") of the logical expression of the function. In this way, in specific code space, by using the designed double-extended Hamming code, a same data stream is generated at the transmit end, and lower decoding complexity can be implemented at a receive end, thereby improving performance of a communication system and further reducing a bit error rate.

Although the steps of the foregoing methods 200 and 300 are described in a particular order, the order is merely for illustration instead of limitation. Unless expressly stated, it should not be understood that such processes are required to be completed in the shown particular order or in a successive order. In some cases, multitasking or parallel processing is advantageous. In addition, the methods 200 and 300 may further include additional operations that are not shown, and/or one or more shown operations may be omitted.

The following describes some example embodiments of this disclosure.

First Embodiment

In a first embodiment of this disclosure, an improved Hamming code (DE-Hamming) (180, 170) is provided. A code length is 180, and a length of to-be-sent information bits is 170. The Hamming code (DE-Hamming) according to this disclosure may be obtained by shortening 76 bits based on a conventional Hamming code (255, 247) and performing double extension, that is, m=8 and q=76. It may be considered that decoding is performed based on a finite field $GF(2^8)$. A target parity-check matrix $H_{DE}$ of the Hamming code (DE-Hamming) according to this disclosure has a form of Formula (2).

In this embodiment, a size of a parity-check matrix H of a shortened Hamming code (179,171) is 8×179, 1 is an all-one row vector with a length of 180, 0 is an all-zero column vector whose length is 8, and a length of a not-all-zero row vector D of the target parity-check matrix $H_{DE}$ is 180. The following can be obtained according to Formula (3):

$$g(i) = \begin{bmatrix} s_{0,i} \\ s_{1,i} \\ \vdots \\ s_{7,i} \\ s_{8,i} \\ 1 \end{bmatrix} \qquad (10)$$

Herein i is an integer greater than or equal to 0 and less than 180, $i=2^7 s_{7,i}+2^6 s_{6,i}+2^5 s_{5,i}+2^4 s_{4,i}+2^3 s_{3,i}+2^2 s_{2,i}+2 s_{1,i}+s_{0,i}$, and elements in a ninth row of the target parity-check matrix $H_{DE}$ are all 1. A target function $h(s_{0,i}, s_{1,i}, s_{2,i})$ of the Hamming code (DE-Hamming) according to this disclosure determines an element $s_{8,i}$ of a column vector corresponding to the not-all-zero row vector D as $s_{8,i}=h(s_{0,i}, s_{1,i}, s_{2,i})=s_{0,i} \wedge s_{1,i}$, and $s_{8,i}, s_{7,i}, s_{6,i}, s_{5,i}, s_{4,i}, s_{3,i}, s_{2,i}, s_{1,i}$, and $s_{0,i}$ are respectively elements of column vectors corresponding to the row vector of the target parity-check matrix.

According to Formula (6) and Table 1 to Table 4, the following candidate parity-check matrix $H_j$ with a size of 10×180 may be determined, where $0<j\leq 162$.

$$H_j=[g(0),g(1),g(2),\ldots,g(179)] \qquad (11)$$

A non-singular matrix is selected from a plurality of candidate parity-check matrices $H_j$, to obtain a first candidate parity-check matrix set. Further, the first candidate parity-check matrix set is transformed to a second candidate parity-check matrix set in a systematic form according to Formula (7). Specifically, in this embodiment, 10 linearly independent column vectors are selected from the candidate parity-check matrices $H_j$ from right to left, and are moved to the rightmost of the matrix. Herein $H_R$ is a 10×10 matrix formed by the 10 linearly independent column vectors, and $H_L$ is a 10×170 matrix obtained after $H_R$ is removed from the candidate parity-check matrix $H_j$.

Further, according to Formula (8), a system check matrix $H_{sys,j}$ may be obtained through elementary row transformation. Herein I is a 10×10 identity matrix, and a matrix $P=(H_R)^{-1}H_L$ has a size of 10×170.

A generator matrix $G_j$ with a size of 170×180 may be determined according to Formula (9).

For the 162 functions $h_j$ shown in Table 1 to Table 4, corresponding candidate parity-check matrices $H_j$ are respectively obtained according to Formula (4) and Formula (5). It may be determined that 14 matrices in the 162 candidate parity-check matrices $H_j$ are not non-singular matrices. For 148 non-singular matrices $H_j$, eight linearly independent column vectors are selected from right to left and moved to the rightmost of the matrix through transformation according to Formula (7), to obtain a first group of candidate parity-check matrices $H_{DE,j}$.

From the first group of candidate parity-check matrices $H_{DE,j}$, based on a third parameter $\mathcal{O}$ indicating encoding complexity and a fourth parameter $A_j$ indicating a quantity of minimum code weights 4, a target parity-check matrix $H_{DE}$ may be selected, and a target function $h(s_{0,i}, s_{1,i}, s_{2,i})$ may be selected. Table 5 shows a logical expression of a candidate function $h_j$ for this embodiment and an operation quantity $\mathcal{H}$ corresponding to the candidate function.

TABLE 5

Predetermined function set of the Hamming code (180, 170) according to this disclosure

| i %8 | 0 | 1 | 2 | 3 | 4 | 5 | 6 | 7 | Logical expression | $\mathcal{H}_j$ |
|---|---|---|---|---|---|---|---|---|---|---|
| $h_{15}$ | 1 | 0 | 0 | 0 | 1 | 0 | 0 | 0 | $s_{8,i} = s0,i \wedge s1,i$ | 3 |
| $h_{20}$ | 0 | 1 | 0 | 0 | 0 | 1 | 0 | 0 | $s_{8,i} = s_{0,i} \wedge s1,i$ | 2 |
| $h_{26}$ | 0 | 0 | 1 | 0 | 0 | 0 | 1 | 0 | $s_{8,i} = s0,i \wedge s_{1,i}$ | 2 |
| $h_{33}$ | 0 | 0 | 0 | 1 | 0 | 0 | 0 | 1 | $s_{8,i} = s_{0,i} \wedge s_{1,i}$ | 1 |
| $h_{97}$ | 0 | 1 | 1 | 1 | 1 | 0 | 0 | 0 | $s_{8,i} = (s_{0,i} \wedge s2,i) \vee (s_{1,i} \wedge s2,i) \vee (s0,i \wedge s1,i \wedge s_{2,i})$ | 9 |
| $h_{100}$ | 1 | 0 | 1 | 1 | 0 | 1 | 0 | 0 | $s_{8,i} = (s0,i \wedge s2,i) \vee (s_{1,i} \wedge s2,i) \vee (s_{0,i} \wedge s1,i \wedge s_{2,i})$ | 9 |
| $h_{109}$ | 1 | 1 | 0 | 1 | 0 | 0 | 1 | 0 | $s_{8,i} = (s_{0,i} \wedge s2,i) \vee (s1,i \wedge s2,i) \vee (s0,i \wedge s_{1,i} \wedge s_{2,i})$ | 9 |
| $h_{127}$ | 0 | 0 | 0 | 1 | 1 | 1 | 1 | 0 | $s_{8,i} = (s0,i \wedge s_{2,i}) \vee (s1,i \wedge s_{2,i}) \vee (s_{0,i} \wedge s_{1,i} \wedge s2,i)$ | 9 |
| $h_{128}$ | 1 | 1 | 1 | 0 | 0 | 0 | 0 | 1 | $s_{8,i} = (s0,i \wedge s2,i) \vee (s1,i \wedge s2,i) \vee (s_{0,i} \wedge s_{1,i} \wedge s_{2,i})$ | 9 |
| $h_{146}$ | 0 | 0 | 1 | 0 | 1 | 1 | 0 | 1 | $s_{8,i} = (s_{0,i} \wedge s_{2,i}) \vee (s1,i \wedge s_{2,i}) \vee (s0,i \wedge s_{1,i} \wedge s2,i)$ | 9 |
| $h_{155}$ | 0 | 1 | 0 | 0 | 1 | 0 | 1 | 1 | $s_{8,i} = (s0,i \wedge s_{2,i}) \vee (s_{1,i} \wedge s_{2,i}) \vee (s_{0,i} \wedge s1,i \wedge s2,i)$ | 9 |
| $h_{158}$ | 1 | 0 | 0 | 0 | 0 | 1 | 1 | 1 | $s_{8,i} = (s0,i \wedge s_{2,i}) \vee (s_{1,i} \wedge s_{2,i}) \vee (s0,i \wedge s1,i \wedge s2,i)$ | 9 |

It may be determined from Table 5 that, according to the first embodiment, the encoding complexity of the Hamming code is that $\mathcal{O}=706$, and the quantity of minimum code weights 4 is that $A_j=107660$.

Further, a function with lower complexity may be selected from the 12 candidate functions h based on the operation quantities $\mathcal{H}$ shown in Table 5. In this embodiment, function complexity of $h_{33}=s_{0,i} \wedge s_{1,i}$ is that $\mathcal{H}_{33}=1$ and is the lowest among the 12 candidate functions h, and complexity of a shortened double-extended Hamming code corresponding to this function is lower.

Figure 4:
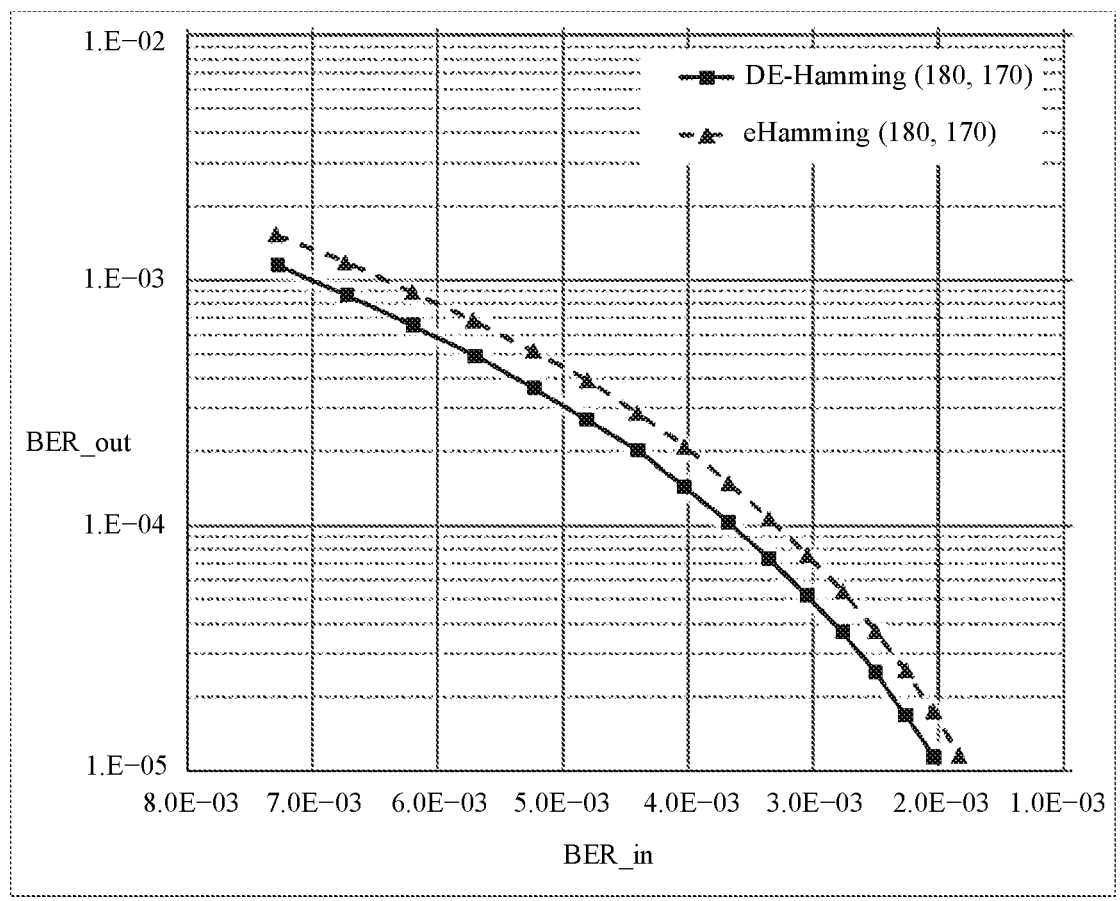
FIG. 4 is a diagram of performance of a double-extended Hamming code and a conventional extended Hamming code according to an example embodiment of this disclosure.

FIG. 4 is a diagram of performance of a double-extended Hamming-code (180, 170) and a conventional extended Hamming-code (180, 170) according to an example embodiment of this disclosure. Herein the double-extended Hamming-code (DE-Hamming) (180, 170) uses maximum a posteriori decoding(maximum a posteriori decoding, MAP). In this example, the conventional extended Hamming code (eHamming) (180, 170) is shortened by 332 bits and implements single-bit extension based on the conventional Hamming code (Hamming) (511, 502). Decoding for the conventional extended Hamming code may be considered to be implemented based on a finite field $GF(2^9)$. As shown in FIG. 4, the Hamming code (DE-Hamming) (180, 170) according to this disclosure has better performance than the conventional extended Hamming code (eHamming) (180, 170). In addition, hard-decision decoding of the double-extended Hamming code (DE-Hamming) (180, 170) according to this disclosure is based on a finite field $GF(2^8)$, while hard-decision decoding of the conventional extended Hamming codes (eHamming) (180, 170) is based on a finite field $GF(2^9)$. Therefore, decoding complexity of the double-extended Hamming code (DE-Hamming) (180, 170) provided in this disclosure is lower than that of the conventional extended Hamming code (180, 170).

The conventional extended Hamming code (180, 170) uses a function shown in Formula (12):

$$s_{8,i} = (s_{0,i} \wedge \overline{s_{2,i}}) \wedge \overline{(\overline{s_{0,i}} \wedge \overline{s_{1,i}} \wedge \overline{s_{2,i}})} \vee (s_{0,i} \wedge s_{1,i} \wedge \overline{s_{2,i}}) \quad (12)$$

Encoding complexity of the conventional extended Hamming code (180, 170) is 748, and a quantity of minimum code weights 4 is 107749. Encoding complexity of the double-extended Hamming code (DE-Hamming) (180, 170) provided in this disclosure is 706, and a quantity of minimum code weights 4 is 107660, which are both better than the conventional extended Hamming code (180, 170). In addition, in the first embodiment, a function logical expression of the target function $s_{8,i}=h_{33}=s_{0,1} \wedge s_{1,i}$ is simpler than Formula (12). Therefore, function complexity of the double-extended Hamming code (DE-Hamming) provided in this disclosure is also lower.

Second Embodiment

In a second embodiment of this disclosure, an improved Hamming code (DE-Hamming) (128, 119) is provided. A code length is 128, a length of to-be-sent information bits is 119, m=7, and q=0. The Hamming code (DE-Hamming) (128, 119) according to this disclosure may be obtained through performing double extension based on a conventional Hamming code (Hamming) (127, 120), that is, m=7, and q=0. It may be considered that decoding is performed based on a finite field $GF(2^7)$. A target parity-check matrix $H_{DE}$ of the Hamming code (DE-Hamming) (128, 119) according to this disclosure has a form of Formula (2).

In this embodiment, a size of a parity-check matrix H of the conventional Hamming code (Hamming) (127, 120) is 8×179, 1 is an all-one row vector with a length of 128, 0 is an all-zero column vector with a length of 7, and a length of a not-all-zero row vector D of the target parity-check matrix $H_{DE}$ is 128. The following can be obtained according to Formula (3):

$$g(i) = \begin{bmatrix} s_{0,i} \\ s_{1,i} \\ \vdots \\ s_{6,i} \\ s_{7,i} \\ 1 \end{bmatrix} \quad (13)$$

Herein i is an integer greater than or equal to 0 and less than 128, $i=2^6 s_{6,i}+2^5 s_{5,i}+2^4 s_{4,i}+2^3 s_{3,i}+2^2 s_{2,i}+2s_{1,i}+s_{0,i}$, and elements in an eighth row of the target parity-check matrix $H_{DE}$ are all 1. A target function $h(s_{0,i},s_{1,i},s_{2,i})$ of the Hamming code (DE-Hamming) according to this disclosure determines an element $s_{7,i}$ of a column vector corresponding to a not-all-zero row vector D as one of $s_{7,i}=h(s_{0,i},s_{1,i},s_{2,i})=s_{0,i}\wedge s_{1,i}, s_{7,i}=h(s_{0,i},s_{1,i},s_{2,i})=s_{0,i}\wedge s_{2,i}$, and $s_{7,i}=h(s_{0,i},s_{1,i},s_{2,i})=s_{1,i}\wedge s_{2,i}$, and $s_{7,i},s_{6,i},s_{5,i},s_{4,i},s_{3,i},s_{2,i},s_{1,i}$, and $s_{0,i}$ are respectively elements of column vectors corresponding to the row vector of the target parity-check matrix.

According to Formula (5) and Table 1 to Table 4, the following candidate parity-check matrix $H_j$ with a size of 9×128 may be determined, where $0<j\le 162$.

$$H_j=[g(0),g(1),g(2),\ldots,g(127)] \quad (14)$$

A non-singular matrix is selected from a plurality of candidate parity-check matrices $H_j$, to obtain a first candidate parity-check matrix set. Further, the first candidate parity-check matrix set is transformed to a second candidate parity-check matrix set in a systematic form according to Formula (7). Specifically, in this embodiment, 9 linearly independent column vectors are selected from the candidate parity-check matrices $H_j$ from right to left, and are moved to the rightmost of the matrix. Herein $H_R$ is a 9×9 matrix formed by the 9 linearly independent column vectors, and $H_L$ is a 9×128 matrix obtained after $H_R$ is removed from the candidate parity-check matrix $H_j$.

Further, according to Formula (8), a system check matrix $H_{sys,j}$ may be obtained through elementary row transformation. Herein I is a 9×9 identity matrix, and a matrix $P=(H_R)^{-1}H_L$ has a size of 9×119.

A generator matrix $G_j$ with a size of 119×128 may be determined according to Formula (9).

For a first group of candidate parity-check matrices $H_{DE,j}$, corresponding candidate parity-check matrices $H_j$ may be respectively obtained according to Formula (4) and Formula (5) for the 162 functions $h_j$ shown in Table 1 to Table 4. It may be determined that 14 matrices in the 162 candidate parity-check matrices $H_j$ are not non-singular matrices. For 148 non-singular matrices $H_j$, 9 linearly independent column vectors are selected from right to left and moved to the rightmost of the matrix through transformation according to Formula (7), to obtain the first group of candidate parity-check matrices $H_{DE,j}$.

Based on a third parameter $\mathcal{O}$ indicating encoding complexity and a fourth parameter $A_j$ indicating a quantity of minimum code weights 4, a target parity-check matrix $H_{DE}$ may be selected, and a target function $h(s_{0,i},s_{1,i},s_{2,i})$ may be selected. Table 6 shows a logical expression of a candidate function $h_j$ for this embodiment and an operation quantity $\mathcal{H}$ corresponding to the candidate function.

TABLE 6

Predetermined function set of the Hamming code (128, 119) according to this disclosure

| i %8 | 0 | 1 | 2 | 3 | 4 | 5 | 6 | 7 | Logical expression | $\mathcal{H}_j$ |
|---|---|---|---|---|---|---|---|---|---|---|
| $h_9$ | 1 | 1 | 0 | 0 | 0 | 0 | 0 | 0 | $s_{7,i}=s1,i \wedge s2,i$ | 3 |
| $h_{10}$ | 1 | 0 | 1 | 0 | 0 | 0 | 0 | 0 | $s_{7,i}=s0,i \wedge s2,i$ | 3 |
| $h_{13}$ | 0 | 1 | 0 | 1 | 0 | 0 | 0 | 0 | $s_{7,i}=s_{0,i} \wedge s2,i$ | 2 |
| $h_{14}$ | 0 | 0 | 1 | 1 | 0 | 0 | 0 | 0 | $s_{7,i}=s_{1,i} \wedge s2,i$ | 2 |
| $h_{15}$ | 1 | 0 | 0 | 1 | 0 | 0 | 0 | 0 | $s_{7,i}=s0,i \wedge s1,i$ | 3 |
| $h_{20}$ | 0 | 1 | 0 | 0 | 0 | 1 | 0 | 0 | $s_{7,i}=s_{0,i} \wedge s1,i$ | 2 |
| $h_{23}$ | 0 | 0 | 0 | 0 | 1 | 1 | 0 | 0 | $s_{7,i}=s1,i \wedge s_{2,i}$ | 2 |
| $h_{26}$ | 0 | 0 | 1 | 0 | 0 | 0 | 1 | 0 | $s_{7,i}=s0,i \wedge s_{1,i}$ | 2 |
| $h_{28}$ | 0 | 0 | 0 | 0 | 1 | 0 | 1 | 0 | $s_{7,i}=s0,i \wedge s_{2,i}$ | 2 |
| $h_{33}$ | 0 | 0 | 0 | 1 | 0 | 0 | 0 | 1 | $s_{7,i}=s_{0,i} \wedge s_{1,i}$ | 1 |
| $h_{35}$ | 0 | 0 | 0 | 0 | 0 | 1 | 0 | 1 | $s_{7,i}=s_{0,i} \wedge s_{2,i}$ | 1 |
| $h_{36}$ | 0 | 0 | 0 | 0 | 0 | 0 | 1 | 1 | $s_{7,i}=s_{1,i} \wedge s_{2,i}$ | 1 |
| $h_{97}$ | 0 | 1 | 1 | 1 | 1 | 0 | 0 | 0 | $s_{7,i}=(s_{0,i} \wedge s2,i) \vee (s_{1,i} \wedge s2,i) \vee (s0,i \wedge s1,i \wedge s_{2,i})$ | 9 |
| $h_{100}$ | 1 | 0 | 1 | 1 | 0 | 1 | 0 | 0 | $s_{7,i}=(s0,i \wedge s2,i) \vee (s_{1,i} \wedge s2,i) \vee (s_{0,i} \wedge s1,i \wedge s_{2,i})$ | 9 |
| $h_{104}$ | 0 | 1 | 1 | 0 | 1 | 1 | 0 | 0 | $s_{7,i}=(s_{0,i} \wedge s1,i) \vee (s1,i \wedge s_{2,i}) \vee (s0,i \wedge s1,i \wedge s2,i)$ | 9 |
| $h_{105}$ | 1 | 0 | 0 | 1 | 1 | 1 | 0 | 0 | $s_{7,i}=(s0,i \wedge s1,i) \vee (s1,i \wedge s_{2,i}) \vee (s_{0,i} \wedge s_{1,i} \wedge s2,i)$ | 9 |
| $h_{109}$ | 1 | 1 | 0 | 1 | 0 | 0 | 1 | 0 | $s_{7,i}=(s_{0,i} \wedge s2,i) \vee (s1,i \wedge s2,i) \vee (s0,i \wedge s1,i \wedge s_{2,i})$ | 9 |
| $h_{114}$ | 0 | 1 | 1 | 0 | 1 | 0 | 1 | 0 | $s_{7,i}=(s0,i \wedge s_{1,i}) \vee (s0,i \wedge s_{2,i})$ v $(s_{0,i} \wedge s1,i \wedge s2,i)$ | 9 |
| $h_{115}$ | 1 | 0 | 0 | 1 | 1 | 0 | 1 | 0 | $s_{7,i}=(s0,i \wedge s1,i) \vee (s0,i \wedge s_{2,i}) \vee (s_{0,i} \wedge s_{1,i} \wedge s2,i)$ | 9 |
| $h_{118}$ | 1 | 1 | 0 | 0 | 0 | 1 | 1 | 0 | $s_{7,i}=(s_{0,i} \wedge s1,i) \vee (s0,i \wedge s2,i) \vee (s0,i \wedge s_{1,i} \wedge s_{2,i})$ | 9 |
| $h_{119}$ | 1 | 0 | 1 | 0 | 0 | 1 | 1 | 0 | $s_{7,i}=(s0,i \wedge s_{1,i}) \vee (s0,i \wedge s2,i) \vee (s_{0,i} \wedge s1,i \wedge s_{2,i})$ | 9 |
| $h_{122}$ | 0 | 1 | 0 | 1 | 0 | 1 | 1 | 0 | $s_{7,i}=(s_{0,i} \wedge s1,i) \vee (s_{0,i} \wedge s2,i) \vee (s0,i \wedge s_{1,i} \wedge s_{2,i})$ | 9 |
| $h_{123}$ | 0 | 0 | 1 | 1 | 0 | 1 | 1 | 0 | $s_{7,i}=(s0,i \wedge s_{1,i}) \vee (s_{1,i} \wedge s2,i) \vee (s_{0,} \wedge s1,i \wedge s_{2,i})$ | 9 |
| $h_{127}$ | 0 | 0 | 0 | 1 | 1 | 1 | 1 | 0 | $s_{7,i}=(s0,i \wedge s_{2,i}) \vee (s1,i \wedge s_{2,i})$ v $(s_{0,i} \wedge s_{1,i} \wedge s2,i)$ | 9 |
| $h_{128}$ | 1 | 1 | 1 | 0 | 0 | 0 | 0 | 1 | $s_{7,i}=(s0,i \wedge s2,i) \vee (s1,i \wedge s2,i) \vee (s_{0,i} \wedge s_{1,i} \wedge s_{2,i})$ | 9 |
| $h_{132}$ | 1 | 1 | 0 | 0 | 1 | 0 | 0 | 1 | $s_{7,i}=(s0,i \wedge s1,i) \vee (s1,i \wedge s2,i)$ v $(s_{0,i} \wedge s_{1,i} \wedge s_{2,i})$ | 9 |
| $h_{133}$ | 1 | 0 | 1 | 0 | 1 | 0 | 0 | 1 | $s_{7,i}=(s0,i \wedge s1,i) \vee (s0,i \wedge s2,i) \vee (s_{0,i} \wedge s_{1,i} \wedge s_{2,i})$ | 9 |
| $h_{136}$ | 0 | 1 | 0 | 1 | 1 | 0 | 0 | 1 | $s_{7,i}=(s_{0,i} \wedge s_{1,i}) \vee (s_{0,i} \wedge s2,i) \vee (s0,i \wedge s1,i \wedge s_{2,i})$ | 9 |
| $h_{137}$ | 0 | 0 | 1 | 1 | 1 | 0 | 0 | 1 | $s_{7,i}=(s_{0,i} \wedge s_{1,i}) \vee (s_{1,i} \wedge s2,i) \vee (s0,i \wedge s1,i \wedge s_{2,i})$ | 9 |
| $h_{140}$ | 0 | 1 | 1 | 0 | 0 | 1 | 0 | 1 | $s_{7,i}=(s_{0,i} \wedge s1,i) \vee (s_{0,i} \wedge s_{2,i}) \vee (s0,i \wedge s1,i \wedge s2,i)$ | 9 |
| $h_{141}$ | 1 | 0 | 0 | 1 | 0 | 1 | 0 | 1 | $s_{7,i}=(s_{0,i} \wedge s_{1,i}) \vee (s_{0,i} \wedge s_{2,i}) \vee (s0,i, s1,i \wedge s2,i)$ | 9 |
| $h_{146}$ | 0 | 0 | 1 | 0 | 1 | 1 | 0 | 1 | $s_{7,i}=(s_{0,i} \wedge s_{2,i}) \vee (s1,i \wedge s_{2,i}) \vee (s0,i \wedge s1,i \wedge s2,i)$ | 9 |
| $h_{150}$ | 0 | 1 | 1 | 0 | 0 | 0 | 1 | 1 | $s_{7,i}=(s0,i \wedge s_{1,i}) \vee (s_{1,i} \wedge s_{2,i}) \vee (s_{0,i} \wedge s1,i \wedge s2,i)$ | 9 |
| $h_{151}$ | 1 | 0 | 0 | 1 | 0 | 0 | 1 | 1 | $s_{7,i}=(s_{0,i} \wedge s_{1,i}) \vee (s_{1,i} \wedge s_{2,i}) \vee (s0,i \wedge s1,i \wedge s2,i)$ | 9 |
| $h_{155}$ | 0 | 1 | 0 | 0 | 1 | 0 | 1 | 1 | $s_{7,i}=(s_{0,i} \wedge s_{2,i}) \vee (s_{1,i} \wedge s_{2,i}) \vee (s_{0,i} \wedge s1,i \wedge s2,i)$ | 9 |
| $h_{158}$ | 1 | 0 | 0 | 0 | 0 | 1 | 1 | 1 | $s_{7,i}=(s_{0,i} \wedge s_{2,i}) \vee (s_{1,i} \wedge s_{2,i}) \vee (s0,i \wedge s1,i \wedge s2,i)$ | 9 |

It may be determined from Table 6 that, according to the second embodiment, the encoding complexity of the Hamming code is that $\mathcal{O}=471$, and the quantity of minimum code weights 4 is that $A_j=52576$.

Further, a function with lower complexity may be selected from the 36 candidate functions h based on the operation quantities $\mathcal{H}$ shown in Table 6. In this embodiment, function complexity of $s_{7,i}=h_{33}=s_{0,i}\wedge s_{1,i}, s_{7,i}=h_{35}=s_{0,i}\wedge s_{2,i}$, and $s_{7,i}=h_{36}=s_{1,i}\wedge s_{2,i}$ is 1. The three functions have the lowest complexity in the 36 candidate functions h, and complexity of shortened double-extended Hamming codes corresponding to the three functions is lower.

Particularly, when $s_{7,i}=h_{36}=s_{1,i}\wedge s_{2,i}$, the following may be determined according to Formula (5).

$$H=[g(0):g(62):g(64):g(94),g(96):g(110),g(112):g\\(118),g(120),g(122),g(124),g(63),g(95),g(111),g\\(119),g(121),g(123),g(125):g(127)] \quad (15)$$

Herein g(a):g(b) indicates [g(a), g(a+1), g(a+2), . . . , g(b)].

A generator matrix G may be determined according to Formula (9) and Formula (16).

$$P=B[g(0):g(62),g(64): g(94),g(96): g(110),g(112):\\g(118),g(120),g(122),g(124)] \quad (16)$$

Herein $B=[g(63),g(95),g(111),g(119),g(121),g(123),g(125):g(127)]^{-1}$.

In the second embodiment of this disclosure, the corresponding parity-check matrix $H_{DE,36}$ of the Hamming code in this embodiment is different from a Hamming code (DE-Hamming) $(128,119)_{OIF}$ defined in the OIF-400ZR standard, but both a systematic parity-check matrix $H_{sys,36}$ and a generator matrix $G_j$ of the Hamming code in this embodiment are the same as those of the Hamming code $(128,119)_{OIF}$ defined in the OIF-400ZR standard. In other words, same codewords are obtained through encoding based on the two double-extended Hamming codes (128, 119) and $(128,119)_{OIF}$. In other words, data streams output from a transmit end are consistent. The double-extended Hamming code (DE-Hamming) according to this disclosure has lower function complexity $s_{7,i}=h_{36}=s_{1,i}\wedge s_{2,i}$ at a receive end.

Third Embodiment

In a third embodiment of this disclosure, an improved Hamming code (DE-Hamming) (64, 56) is provided. A code length is 64, and a length of to-be-sent information bits is 56. The Hamming code DE-Hamming(64, 56) may be obtained through performing double extension based on a conventional Hamming code (Hamming) (63, 57), that is, m=6, and q=0. It may be considered that decoding is performed based on a finite field $GF(2^6)$. A target parity-check matrix $H_{DE}$ of the Hamming code (DE-Hamming) according to this disclosure has a form of Formula (2).

In this embodiment, a size of a parity-check matrix H of the conventional Hamming code (Hamming) (63, 57) is 6×63, 1 is an all-one row vector with a length of 64, 0 is an all-zero column vector with a length of 6, and a length of a not-all-zero row vector D of the target parity-check matrix $H_{DE}$ is 64. The following can be obtained according to Formula (3):

$$g(i)=\begin{bmatrix}s_{0,i}\\s_{1,i}\\\vdots\\s_{5,i}\\s_{6,i}\\1\end{bmatrix} \quad (17)$$

Herein i is an integer greater than or equal to 0 and less than 64, $i=2^5 s_{5,i}+2^4 s_{4,i}+2^3 s_{3,i}+2^2 s_{2,i}+2s_{1,i}+s_{0,i}$, and elements in a seventh row of the target parity-check matrix $H_{DE}$ are all 1. A target function $h(s_{0,i},s_{1,i},s_{2,i})$ of the Hamming code (DE-Hamming) determines an element $s_{6,i}$ of a column vector corresponding to a not-all-zero row vector D as one of $s_{6,i}=h(s_{0,i},s_{1,i},s_{2,i})=s_{0,i}\wedge s_{1,i}, s_{6,i}=h(s_{0,i},s_{1,i},s_{2,i})=s_{0,i}\wedge s_{2,i}$, and $s_{6,i}=h(s_{0,i},s_{1,i},s_{2,i})=s_{1,i}\wedge s_{2,i}$, and $s_{6,i},s_{5,i},s_{4,i},s_{3,i},s_{2,i},s_{1,i}$, and $s_{0,i}$ are respectively elements of column vectors corresponding to the row vector of the target parity-check matrix.

According to Formula (5) and Table 1 to Table 4, the following candidate parity-check matrix $H_j$ with a size of 8×64 may be determined, where 0<j≤162.

$$H_j=[g(0),g(1),g(2), \ldots ,g(63)] \quad (18)$$

A non-singular matrix is selected from a plurality of candidate parity-check matrices $H_j$, to obtain a first candidate parity-check matrix set. Further, the first candidate parity-check matrix set is transformed to a second candidate parity-check matrix set in a systematic form according to Formula (7). Specifically, in this embodiment, eight linearly independent column vectors are selected from the candidate parity-check matrices $H_j$ from right to left, and are moved to the rightmost of the matrix. Herein $H_R$ is an 8×8 matrix formed by the eight linearly independent column vectors, and $H_L$ is an 8×56 matrix obtained after $H_R$ is removed from the candidate parity-check matrix $H_j$.

Further, according to Formula (7), a system check matrix $H_{sys,j}$ may be obtained through elementary row transformation. Herein I is an 8×8 identity matrix, and a matrix $P=(H_R)^{-1}H_L$ has a size of 8×56.

A generator matrix $G_j$ with a size of 56×64 may be determined according to Formula (9).

For the 162 functions $h_j$ shown in Table 1 to Table 4, corresponding candidate parity-check matrices $H_j$ are respectively obtained according to Formula (4) and Formula (5). It may be determined that 14 matrices in the 162 candidate parity-check matrices $H_j$ are not non-singular matrices. For 148 non-singular matrices $H_j$, eight linearly independent column vectors are selected from right to left and moved to the rightmost of the matrix through transformation according to Formula (7), to obtain a first group of candidate parity-check matrices $H_{DE,j}$.

For the first group of candidate parity-check matrices $H_{DE,j}$, based on a third parameter $\mathcal{O}$ indicating encoding complexity and a fourth parameter $A_j$ indicating a quantity of minimum code weights 4, a target parity-check matrix $H_{DE}$ may be selected, and a target function $h(s_{0,i},s_{1,i},s_{2,i})$ may be selected. Table 7 shows a logical expression of a candidate function $h_j$ for this embodiment and an operation quantity $\mathcal{H}$ corresponding to the candidate function.

TABLE 7

Predetermined function set of the Hamming code (64, 56) according to this disclosure

| i %8 | 0 | 1 | 2 | 3 | 4 | 5 | 6 | 7 | Logical expression | $\mathcal{H}_j$ |
|---|---|---|---|---|---|---|---|---|---|---|
| $h_9$ | 1 | 1 | 0 | 0 | 0 | 0 | 0 | 0 | $s_{6,i}=s1,i\wedge s2,i$ | 3 |
| $h_{10}$ | 1 | 0 | 1 | 0 | 0 | 0 | 0 | 0 | $s_{6,i}=s0,i\wedge s2,i$ | 3 |
| $h_{13}$ | 0 | 1 | 0 | 1 | 0 | 0 | 0 | 0 | $s_{6,i}=s_{0,i}\wedge s2,i$ | 2 |
| $h_{14}$ | 0 | 0 | 1 | 1 | 0 | 0 | 0 | 0 | $s_{6,i}=s_{1,i}\wedge s2,i$ | 2 |
| $h_{15}$ | 1 | 0 | 0 | 0 | 1 | 0 | 0 | 0 | $s_{6,i}=s0,i\wedge s1,i$ | 3 |
| $h_{20}$ | 0 | 1 | 0 | 0 | 0 | 1 | 0 | 0 | $s_{6,i}=s_{0,i}\wedge s1,i$ | 2 |
| $h_{23}$ | 0 | 0 | 0 | 0 | 1 | 1 | 0 | 0 | $s_{6,i}=s1,i\wedge s_{2,i}$ | 2 |
| $h_{26}$ | 0 | 0 | 1 | 0 | 0 | 0 | 1 | 0 | $s_{6,i}=s0,i\wedge s_{1,i}$ | 2 |
| $h_{28}$ | 0 | 0 | 0 | 0 | 1 | 0 | 1 | 0 | $s_{6,i}=s0,i\wedge s_{2,i}$ | 2 |
| $h_{33}$ | 0 | 0 | 0 | 1 | 0 | 0 | 0 | 1 | $s_{6,i}=s_{0,i}\wedge s_{1,i}$ | 1 |
| $h_{35}$ | 0 | 0 | 0 | 0 | 0 | 1 | 0 | 1 | $s_{6,i}=s_{0,i}\wedge s_{2,i}$ | 1 |
| $h_{36}$ | 0 | 0 | 0 | 0 | 0 | 0 | 1 | 1 | $s_{6,i}=s_{1,i}\wedge s_{2,i}$ | 1 |
| $h_{97}$ | 0 | 1 | 1 | 1 | 1 | 0 | 0 | 0 | $s_{6,i}=(s_{0,i}\wedge s2,i)\vee(s_{1,i}\wedge s2,i)\vee(s0,i\wedge s1,i\wedge s_{2,i})$ | 9 |
| $h_{100}$ | 1 | 0 | 1 | 1 | 0 | 1 | 0 | 0 | $s_{6,i}=(s0,i\wedge s2,i)\vee(s_{1,i}\wedge s2,i)\vee(s_{0,i}\wedge s1,i\wedge s_{2,i})$ | 9 |

TABLE 7-continued

Predetermined function set of the Hamming code (64, 56) according to this disclosure

| i %8 | 0 1 | 2 3 | 4 5 | 6 7 | Logical expression | $\mathcal{H}_j$ |
|---|---|---|---|---|---|---|
| $h_{104}$ | 0 1 | 1 0 | 1 1 | 0 0 | $s_{6,i} = (s_{0,i} \wedge s1,i) \vee (s1,i \wedge s_{2,i}) \vee (s0,i \wedge s_{1,i} \wedge s2,i)$ | 9 |
| $h_{105}$ | 1 0 | 0 1 | 1 1 | 0 0 | $s_{6,i} = (s0,i \wedge s1,i) \vee (s1,i \wedge s_{2,i}) \vee (s_{0,i} \wedge s_{1,i} \wedge s2,i)$ | 9 |
| $h_{109}$ | 1 1 | 0 1 | 0 0 | 1 0 | $s_{6,i} = (s_{0,i} \wedge s2,i) \vee (s1,i \wedge s2,i) \vee (s0,i \wedge s_{1,i} \wedge s_{2,i})$ | 9 |
| $h_{114}$ | 0 1 | 1 0 | 1 0 | 1 0 | $s_{6,i} = (s0,i \wedge s_{1,i}) \vee (s0,i \wedge s_{2,i}) \vee (s_{0,i} \wedge s1,i \wedge s2,i)$ | 9 |
| $h_{115}$ | 1 0 | 0 1 | 1 0 | 1 0 | $s_{6,i} = (s0,i \wedge s1,i) \vee (s0,i \wedge s_{2,i}) \vee (s_{0,i} \wedge s_{1,i} \wedge s2,i)$ | 9 |
| $h_{118}$ | 1 1 | 0 0 | 0 1 | 1 0 | $s_{6,i} = (s_{0,i} \wedge s1,i) \vee (s0,i \wedge s2,i) \vee (s0,i \wedge s_{1,i} \wedge s_{2,i})$ | 9 |
| $h_{119}$ | 1 0 | 1 0 | 0 1 | 1 0 | $s_{6,i} = (s0,i \wedge s_{1,i}) \vee (s0,i \wedge s_{2,i}) \vee (s_{0,i} \wedge s1,i \wedge s_{2,i})$ | 9 |
| $h_{122}$ | 0 1 | 0 1 | 0 1 | 1 0 | $s_{6,i} = (s_{0,i} \wedge s1,i) \vee (s_{0,i} \wedge s_{2,i}) \vee (s0,i \wedge s_{1,i} \wedge s_{2,i})$ | 9 |
| $h_{123}$ | 0 0 | 1 1 | 0 1 | 1 0 | $s_{6,i} = (s0,i \wedge s_{1,i}) \vee (s_{1,i} \wedge s_{2,i}) \vee (s_{0,i} \wedge s1,i \wedge s_{2,i})$ | 9 |
| $h_{127}$ | 0 0 | 0 1 | 1 1 | 1 0 | $s_{6,i} = (s0,i \wedge s_{2,i}) \vee (s1,i \wedge s_{2,i}) \vee (s_{0,i} \wedge s_{1,i} \wedge s2,i)$ | 9 |
| $h_{128}$ | 1 1 | 1 0 | 0 0 | 0 1 | $s_{6,i} = (s0,i \wedge s2,i) \vee (s1,i \wedge s_{2,i}) \vee (s_{0,i} \wedge s_{1,i} \wedge s_{2,i})$ | 9 |
| $h_{132}$ | 1 1 | 0 0 | 1 0 | 0 1 | $s_{6,i} = (s0,i \wedge s1,i) \vee (s1,i \wedge s_{2,i}) \vee (s_{0,i} \wedge s_{1,i} \wedge s_{2,i})$ | 9 |
| $h_{133}$ | 1 0 | 1 0 | 1 0 | 0 1 | $s_{6,i} = (s0,i \wedge s1,i) \vee (s0,i \wedge s_{2,i}) \vee (s_{0,i} \wedge s_{1,i} \wedge s_{2,i})$ | 9 |
| $h_{136}$ | 0 1 | 0 1 | 1 0 | 0 1 | $s_{6,i} = (s_{0,i} \wedge s_{1,i}) \vee (s_{0,i} \wedge s_{2,i}) \vee (s0,i \wedge s1,i \wedge s_{2,i})$ | 9 |
| $h_{137}$ | 0 0 | 1 1 | 1 0 | 0 1 | $s_{6,i} = (s_{0,i} \wedge s_{1,i}) \vee (s_{1,i} \wedge s_{2,i}) \vee (s0,i \wedge s1,i \wedge s_{2,i})$ | 9 |
| $h_{140}$ | 0 1 | 1 0 | 0 1 | 0 1 | $s_{6,i} = (s_{0,i} \wedge s1,i) \vee (s_{0,i} \wedge s_{2,i}) \vee (s0,i \wedge s_{1,i} \wedge s2,i)$ | 9 |
| $h_{141}$ | 1 0 | 0 1 | 0 1 | 0 1 | $s_{6,i} = (s_{0,i} \wedge s_{1,i}) \vee (s_{0,i} \wedge s_{2,i}) \vee (s0,i \wedge s1,i \wedge s2,i)$ | 9 |
| $h_{146}$ | 0 0 | 1 0 | 1 1 | 0 1 | $s_{6,i} = (s_{0,i} \wedge Sz,i) \vee (s1,i \wedge s_{2,i}) \vee (s0,i \wedge s_{1,i} \wedge s2,i)$ | 9 |
| $h_{150}$ | 0 1 | 1 0 | 0 0 | 1 1 | $s_{6,i} = (s0,i \wedge s_{1,i}) \vee (s_{1,i} \wedge s_{2,i}) \vee (s_{0,i} \wedge s1,i \wedge s2,i)$ | 9 |
| $h_{151}$ | 1 0 | 0 1 | 0 0 | 1 1 | $s_{6,i} = (s_{0,i} \wedge s_{1,i}) \vee (s_{1,i} \wedge s_{2,i}) \vee (s0,i \wedge s1,i \wedge s2,i)$ | 9 |
| $h_{155}$ | 0 1 | 0 0 | 1 0 | 1 1 | $s_{6,i} = (s0,i \wedge s_{2,i}) \vee (s_{1,i} \wedge s_{2,i}) \vee (s_{0,i} \wedge s1,i \wedge s2,i)$ | 9 |
| $h_{158}$ | 1 0 | 0 0 | 0 1 | 1 1 | $s_{6,i} = (s0,i \wedge s_{2,i}) \vee (s_{1,i} \wedge s_{2,i}) \vee (s0,i \wedge s1,i \wedge s2,i)$ | 9 |

It may be determined from Table 7 that, according to the third embodiment, the encoding complexity of the Hamming code is that $\mathcal{O}=200$, and the quantity of minimum code weights 4 is that $A_j=6320$.

Further, a function with lower complexity may be selected from the 36 candidate functions h based on the operation quantities $\mathcal{H}$ shown in Table 7. In this embodiment, function complexity of $s_{6,i}=h_{33}=s_{0,i}\wedge=s_{1,i}, s_{6,i}=h_{35}=s_{0,i}\wedge s_{2,i}$, and $s_{6,i}=h_{36}=s_{1,i}\wedge s_{2,i}$ is 1. The three functions have the lowest complexity in the 36 candidate functions h, and complexity of shortened double-extended Hamming codes corresponding to the three functions is lower.

Fourth Embodiment

In a fourth embodiment of this disclosure, a shortened double-extended Hamming code (DE-Hamming) ($2^m-q$, $2^m-2-m-q$) is provided, where m is given. As shown in Formula (19), a length q of shortened bits is selected, to implement different code redundancy OH. Herein $0 \leq q < (2^m-1)/2$.

$$OH = \frac{n}{k} - 1 \qquad (19)$$

A code length is $n=2^m-q$, and an information length is $k=2^m-2-m-q$.

In Table 8 and Table 9, target functions $h_j$ for the shortened double-extended Hamming code provided in this disclosure are listed for a case of m=8 and different qs and a case of m=7 and different qs.

TABLE 8

Target functions $h_j$ of the Hamming code according to this disclosure, where m = 8, and q = 0-113

| OH | q | n | k | Target function $h_j$ |
|---|---|---|---|---|
| 4.07% | 0 | 256 | 246 | $h_{33}, h_{35}, h_{36}$ |
|  |  |  |  | $h_{33} = s_{0,i} \wedge s_{1,i}$, |
|  |  |  |  | $h_{35} = s_{0,i} \wedge s_{2,i}$, |
|  |  |  |  | $h_{36} = s_{1,i} \wedge s_{2,i}$ |
| 4.08% | 1 | 255 | 245 | $h_{33}, h_{35}, h_{36}$ |
| 4.10% | 2 | 254 | 244 | $h_7$ |
| 4.12% | 3 | 253 | 243 | $h_{143}, h_{152}$ |
| 4.13% | 4 | 252 | 242 | $h_{33}$ |
| 4.15% | 5 | 251 | 241 | $h_4$ |
| 4.17% | 6 | 250 | 240 | $h_{33}, h_{35}$ |
| 4.18% | 7 | 249 | 239 | $h_{33}, h_{35}, h_{36}$ |
| 4.20% | 8 | 248 | 238 | $h_{33}, h_{35}, h_{36}$ |
| 4.22% | 9 | 247 | 237 | $h_{33}, h_{35}, h_{36}$ |
| 4.24% | 10 | 246 | 236 | $h_7$ |
| 4.26% | 11 | 245 | 235 | $h_6, h_7$ |
| 4.27% | 12 | 244 | 234 | $h_{33}$ |
| 4.29% | 13 | 243 | 233 | $h_4$ |
| 4.31% | 14 | 242 | 232 | $h_{40}, h_{54}, h_{65}$ |
| 4.33% | 15 | 241 | 231 | $h_{33}, h_{35}, h_{36}$ |
| 4.35% | 16 | 240 | 230 | $h_{33}, h_{35}, h_{36}$ |
| 4.37% | 17 | 239 | 229 | $h_{33}, h_{35}, h_{36}$ |
| 4.39% | 18 | 238 | 228 | $h_7$ |
| 4.41% | 19 | 237 | 227 | $h_{143}, h_{152}$ |
| 4.42% | 20 | 236 | 226 | $h_{33}$ |
| 4.44% | 21 | 235 | 225 | $h_4$ |
| 4.46% | 22 | 234 | 224 | $h_{33}, h_{35}$ |
| 4.48% | 23 | 233 | 223 | $h_{33}, h_{35}, h_{36}$ |
| 4.50% | 24 | 232 | 222 | $h_{33}, h_{35}, h_{36}$ |
| 4.52% | 25 | 231 | 221 | $h_{33}, h_{35}, h_{36}$ |
| 4.55% | 26 | 230 | 220 | $h_7$ |
| 4.57% | 27 | 229 | 219 | $h_6, h_7$ |
| 4.59% | 28 | 228 | 218 | $h_{33}$ |
| 4.61% | 29 | 227 | 217 | $h_4$ |
| 4.63% | 30 | 226 | 216 | $h_{40}, h_{54}, h_{65}$ |
| 4.65% | 31 | 225 | 215 | $h_{33}, h_{35}, h_{36}$ |
| 4.67% | 32 | 224 | 214 | $h_{33}, h_{35}, h_{36}$ |
| 4.69% | 33 | 223 | 213 | $h_{33}, h_{35}, h_{36}$ |
| 4.72% | 34 | 222 | 212 | $h_7$ |
| 4.74% | 35 | 221 | 211 | $h_{143}, h_{152}$ |
| 4.76% | 36 | 220 | 210 | $h_{33}$ |
| 4.78% | 37 | 219 | 209 | $h_4$ |
| 4.81% | 38 | 218 | 208 | $h_{33}, h_{35}$ |
| 4.83% | 39 | 217 | 207 | $h_{33}, h_{35}, h_{36}$ |
| 4.85% | 40 | 216 | 206 | $h_{33}, h_{35}, h_{36}$ |
| 4.88% | 41 | 215 | 205 | $h_{33}, h_{35}, h_{36}$ |

TABLE 8-continued

Target functions $h_j$ of the Hamming code according to this disclosure, where m = 8, and q = 0-113

| OH | q | n | k | Target function $h_j$ |
|---|---|---|---|---|
| 4.90% | 42 | 214 | 204 | $h_7$ |
| 4.93% | 43 | 213 | 203 | $h_6, h_7$ |
| 4.95% | 44 | 212 | 202 | $h_{33}$ |
| 4.98% | 45 | 211 | 201 | $h_4$ |
| 5.00% | 46 | 210 | 200 | $h_{40}, h_{54}, h_{65}$ |
| 5.03% | 47 | 209 | 199 | $h_{33}, h_{35}, h_{36}$ |
| 5.05% | 48 | 208 | 198 | $h_{33}, h_{35}, h_{36}$ |
| 5.08% | 49 | 207 | 197 | $h_{33}, h_{35}, h_{36}$ |
| 5.10% | 50 | 206 | 196 | $h_7$ |
| 5.13% | 51 | 205 | 195 | $h_{143}, h_{152}$ |
| 5.15% | 52 | 204 | 194 | $h_{33}$ |
| 5.18% | 53 | 203 | 193 | $h_4$ |
| 5.21% | 54 | 202 | 192 | $h_{33}, h_{35}$ |
| 5.24% | 55 | 201 | 191 | $h_{33}, h_{35}, h_{36}$ |
| 5.26% | 56 | 200 | 190 | $h_{33}, h_{35}, h_{36}$ |
| 5.29% | 57 | 199 | 189 | $h_{33}, h_{35}, h_{36}$ |
| 5.32% | 58 | 198 | 188 | $h_7$ |
| 5.35% | 59 | 197 | 187 | $h_6, h_7$ |
| 5.38% | 60 | 196 | 186 | $h_{33}$ |
| 5.41% | 61 | 195 | 185 | $h_4$ |
| 5.43% | 62 | 194 | 184 | $h_{40}, h_{54}, h_{65}$ |
| 5.46% | 63 | 193 | 183 | $h_{33}, h_{35}, h_{36}$ |
| 5.49% | 64 | 192 | 182 | $h_{33}, h_{35}, h_{36}$ |
| 5.52% | 65 | 191 | 181 | $h_{33}, h_{35}, h_{36}$ |
| 5.56% | 66 | 190 | 180 | $h_7$ |
| 5.59% | 67 | 189 | 179 | $h_{143}, h_{152}$ |
| 5.62% | 68 | 188 | 178 | $h_{33}$ |
| 5.65% | 69 | 187 | 177 | $h_4$ |
| 5.68% | 70 | 186 | 176 | $h_{33}, h_{35}$ |
| 5.71% | 71 | 185 | 175 | $h_{33}, h_{35}, h_{36}$ |
| 5.75% | 72 | 184 | 174 | $h_{33}, h_{35}, h_{36}$ |
| 5.78% | 73 | 183 | 173 | $h_{33}, h_{35}, h_{36}$ |
| 5.81% | 74 | 182 | 172 | $h_7$ |
| 5.85% | 75 | 181 | 171 | $h_6, h_7$ |
| 5.88% | 76 | 180 | 170 | $h_{33}$ |
| 5.92% | 77 | 179 | 169 | $h_4$ |
| 5.95% | 78 | 178 | 168 | $h_{40}, h_{54}, h_{65}$ |
| 5.99% | 79 | 177 | 167 | $h_{33}, h_{35}, h_{36}$ |
| 6.02% | 80 | 176 | 166 | $h_{33}, h_{35}, h_{36}$ |
| 6.06% | 81 | 175 | 165 | $h_{33}, h_{35}, h_{36}$ |
| 6.10% | 82 | 174 | 164 | $h_7$ |
| 6.13% | 83 | 173 | 163 | $h_{143}, h_{152}$ |
| 6.17% | 84 | 172 | 162 | $h_{33}$ |
| 6.21% | 85 | 171 | 161 | $h_4$ |
| 6.25% | 86 | 170 | 160 | $h_{33}, h_{35}$ |
| 6.29% | 87 | 169 | 159 | $h_{33}, h_{35}, h_{36}$ |
| 6.33% | 88 | 168 | 158 | $h_{33}, h_{35}, h_{36}$ |
| 6.37% | 89 | 167 | 157 | $h_{33}, h_{35}, h_{36}$ |
| 6.41% | 90 | 166 | 156 | $h_7$ |
| 6.45% | 91 | 165 | 155 | $h_6, h_7$ |
| 6.49% | 92 | 164 | 154 | $h_{33}$ |
| 6.54% | 93 | 163 | 153 | $h_4$ |
| 6.58% | 94 | 162 | 152 | $h_{40}, h_{54}, h_{65}$ |
| 6.62% | 95 | 161 | 151 | $h_{33}, h_{35}, h_{36}$ |
| 6.67% | 96 | 160 | 150 | $h_{33}, h_{35}, h_{36}$ |
| 6.71% | 97 | 159 | 149 | $h_{33}, h_{35}, h_{36}$ |
| 6.76% | 98 | 158 | 148 | $h_7$ |
| 6.80% | 99 | 157 | 147 | $h_{143}, h_{152}$ |
| 6.85% | 100 | 156 | 146 | $h_{33}$ |
| 6.90% | 101 | 155 | 145 | $h_4$ |
| 6.94% | 102 | 154 | 144 | $h_{33}, h_{35}$ |
| 6.99% | 103 | 153 | 143 | $h_{33}, h_{35}, h_{36}$ |
| 7.04% | 104 | 152 | 142 | $h_{33}, h_{35}, h_{36}$ |
| 7.09% | 105 | 151 | 141 | $h_{33}, h_{35}, h_{36}$ |
| 7.14% | 106 | 150 | 140 | $h_7$ |
| 7.19% | 107 | 149 | 139 | $h_6, h_7$ |
| 7.25% | 108 | 148 | 138 | $h_{33}$ |
| 7.30% | 109 | 147 | 137 | $h_4$ |
| 7.35% | 110 | 146 | 136 | $h_{40}, h_{54}, h_{65}$ |
| 7.41% | 111 | 145 | 135 | $h_{33}, h_{35}, h_{36}$ |
| 7.46% | 112 | 144 | 134 | $h_{33}, h_{35}, h_{36}$ |
| 7.52% | 113 | 143 | 133 | $h_{33}, h_{35}, h_{36}$ |

TABLE 9

Target functions $h_j$ of the Hamming code according to this disclosure, where m = 7, and q = 0-57

| OH | q | n | k | Target function $h_j$ |
|---|---|---|---|---|
| 7.56% | 0 | 128 | 119 | $h_{33}, h_{35}, h_{36}$ |
| 7.63% | 1 | 127 | 118 | $h_{33}, h_{35}, h_{36}$ |
| 7.69% | 2 | 126 | 117 | $h_7$ |
| 7.76% | 3 | 125 | 116 | $h_{143}, h_{152}$ |
| 7.83% | 4 | 124 | 115 | $h_{33}$ |
| 7.89% | 5 | 123 | 114 | $h_4$ |
| 7.96% | 6 | 122 | 113 | $h_{33}, h_{35}$ |
| 8.04% | 7 | 121 | 112 | $h_{33}, h_{35}, h_{36}$ |
| 8.11% | 8 | 120 | 111 | $h_{33}, h_{35}, h_{36}$ |
| 8.18% | 9 | 119 | 110 | $h_{33}, h_{35}, h_{36}$ |
| 8.26% | 10 | 118 | 109 | $h_7$ |
| 8.33% | 11 | 117 | 108 | $h_6, h_7$ |
| 8.41% | 12 | 116 | 107 | $h_{33}$ |
| 8.49% | 13 | 115 | 106 | $h_4$ |
| 8.57% | 14 | 114 | 105 | $h_{40}, h_{54}, h_{65}$ |
| 8.65% | 15 | 113 | 104 | $h_{33}, h_{35}, h_{36}$ |
| 8.74% | 16 | 112 | 103 | $h_{33}, h_{35}, h_{36}$ |
| 8.82% | 17 | 111 | 102 | $h_{33}, h_{35}, h_{36}$ |
| 8.91% | 18 | 110 | 101 | $h_7$ |
| 9.00% | 19 | 109 | 100 | $h_{143}, h_{152}$ |
| 9.09% | 20 | 108 | 99 | $h_{33}$ |
| 9.18% | 21 | 107 | 98 | $h_4$ |
| 9.28% | 22 | 106 | 97 | $h_{33}, h_{35}$ |
| 9.38% | 23 | 105 | 96 | $h_{33}, h_{35}, h_{36}$ |
| 9.47% | 24 | 104 | 95 | $h_{33}, h_{35}, h_{36}$ |
| 9.57% | 25 | 103 | 94 | $h_{33}, h_{35}, h_{36}$ |
| 9.68% | 26 | 102 | 93 | $h_7$ |
| 9.78% | 27 | 101 | 92 | $h_6, h_7$ |
| 9.89% | 28 | 100 | 91 | $h_{33}$ |
| 10.00% | 29 | 99 | 90 | $h_4$ |
| 10.11% | 30 | 98 | 89 | $h_{40}, h_{54}, h_{65}$ |
| 10.23% | 31 | 97 | 88 | $h_{33}, h_{35}, h_{36}$ |
| 10.34% | 32 | 96 | 87 | $h_{33}, h_{35}, h_{36}$ |
| 10.47% | 33 | 95 | 86 | $h_{33}, h_{35}, h_{36}$ |
| 10.59% | 34 | 94 | 85 | $h_7$ |
| 10.71% | 35 | 93 | 84 | $h_{143}, h_{152}$ |
| 10.84% | 36 | 92 | 83 | $h_{33}$ |
| 10.98% | 37 | 91 | 82 | $h_4$ |
| 11.11% | 38 | 90 | 81 | $h_{33}, h_{35}$ |
| 11.25% | 39 | 89 | 80 | $h_{33}, h_{35}, h_{36}$ |
| 11.39% | 40 | 88 | 79 | $h_{33}, h_{35}, h_{36}$ |
| 11.54% | 41 | 87 | 78 | $h_{33}, h_{35}, h_{36}$ |
| 11.69% | 42 | 86 | 77 | $h_7$ |
| 11.84% | 43 | 85 | 76 | $h_6, h_7$ |
| 12.00% | 44 | 84 | 75 | $h_{33}$ |
| 12.16% | 45 | 83 | 74 | $h_4$ |
| 12.33% | 46 | 82 | 73 | $h_{40}, h_{54}, h_{65}$ |
| 12.50% | 47 | 81 | 72 | $h_{33}, h_{35}, h_{36}$ |
| 12.68% | 48 | 80 | 71 | $h_{33}, h_{35}, h_{36}$ |
| 12.86% | 49 | 79 | 70 | $h_{33}, h_{35}, h_{36}$ |
| 13.04% | 50 | 78 | 69 | $h_7$ |
| 13.24% | 51 | 77 | 68 | $h_{143}, h_{152}$ |
| 13.43% | 52 | 76 | 67 | $h_{33}$ |
| 13.64% | 53 | 75 | 66 | $h_4$ |
| 13.85% | 54 | 74 | 65 | $h_{33}, h_{35}$ |
| 14.06% | 55 | 73 | 64 | $h_{33}, h_{35}, h_{36}$ |
| 14.29% | 56 | 72 | 63 | $h_{33}, h_{35}, h_{36}$ |
| 14.52% | 57 | 71 | 62 | $h_{33}, h_{35}, h_{36}$ |

According to the fourth embodiment of this disclosure, the improved double-extended Hamming code is provided. A target parity-check matrix of the improved double-extended Hamming code is obtained based on a target function with a smaller operation quantity that is selected from a predetermined function set, so that such an extended Hamming code can adapt to configurations of various code lengths and information bit lengths. The double-extended Hamming code according to this disclosure can provide low encoding and decoding complexity in specified code space, reduce a bit error rate of a communication system, and maintain redundancy within an appropriate range, thereby providing optimized Hamming code performance.

Figure 5:
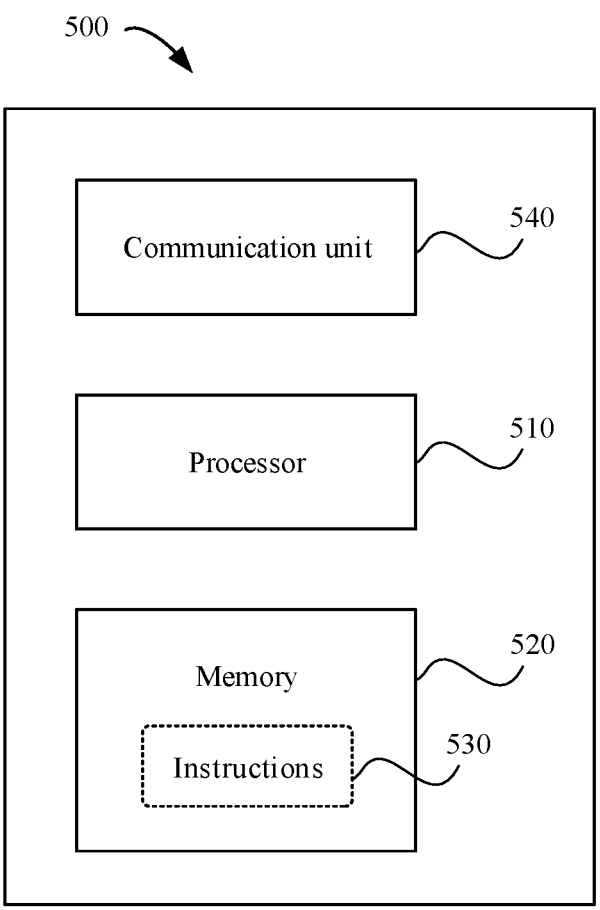
FIG. 5 is a block diagram of an electronic device according to an example embodiment of this disclosure.

FIG. 5 is a block diagram of a device 500 that can implement some embodiments of this disclosure. The device 500 can be used to implement the encoding device 110 and the decoding device 120 shown in FIG. 1. It should be understood that the device 500 is merely used as an example and does not imply any limitation on the scope of this disclosure. Embodiments of this disclosure may be further embodied in different devices. It should be further understood that the device 500 may further include other elements or entities that are not shown for ease of description, but it does not mean that embodiments of this disclosure do not have these elements or entities.

As shown in FIG. 5, the device 500 includes a processor 510. The processor 510 controls an operation and a function of the device 500. For example, in some example embodiments, the processor 510 may perform various operations by using instructions 530 stored in a memory 520 coupled to the processor 510. The memory 520 may be of any appropriate type applicable to a local technical environment, and may be implemented by using any appropriate data storage technology, including but not limited to a semiconductor-based storage device, a magnetic storage device and system, and an optical storage device and system. Although only one memory unit is shown in FIG. 5, there may be a plurality of physically different memory units in the device 500.

The processor 510 may be of any appropriate type applicable to a local technical environment, and may include but is not limited to one or more of a general-purpose computer, a dedicated computer, a microcontroller, a digital signal processor (DSP), and a controller-based multi-core controller architecture. The device 500 may also include a plurality of processors 510. The processor 510 is coupled to a communication unit 540. The communication unit 540 may receive and send information by using a radio signal or through an optical fiber, a cable, and/or another component.

When the device 500 serves as the encoding device 110 or the decoding device 120, the processor 510 may implement the operations and the actions described above with reference to FIG. 2 and FIG. 3 by executing instructions. All features described above with reference to FIG. 2 and FIG. 3 are applicable to the device 500. Details are not described herein again.

In general, various example embodiments of this disclosure may be implemented in hardware or a dedicated circuit, software, logic, or any combination thereof. Some aspects may be implemented in hardware. Other aspects may be implemented in firmware or software that may be executed by a controller, a microprocessor, or another computing device. When aspects of the example embodiments of this disclosure are illustrated or described as block diagrams, flowcharts, or represented using some other graphs, it may be understood that the blocks, apparatuses, systems, techniques, or methods described herein may be implemented as non-limiting examples in hardware, software, firmware, a dedicated circuit or logic, general-purpose hardware or a controller, another computing device, or some combinations thereof.

For example, the example embodiments of this disclosure may be described in a context of machine-executable or computer-executable instructions. The machine-executable instructions are included, for example, in a program module executed in a device in a target real or virtual processor. Generally, the program module includes a routine, a program, a library, an object, a type, a component, a data structure, and the like, and executes a specific task or implements a specific abstract data structure. In various example embodiments, functions of the program module may be combined or divided between the described program modules. The machine-executable instructions used for the program module may be executed locally or in a distributed device. In the distributed device, the program module may be located in both a local storage medium and a remote storage medium.

Computer program code used to implement the methods disclosed in this disclosure may be written in one or more programming languages. The computer program code may be provided for a processor of a general-purpose computer, a dedicated computer, or another programmable data processing apparatus. In this way, when the program code is executed by the computer or the another programmable data processing apparatus, functions/operations specified in the flowcharts and/or the block diagrams are implemented. The program code may be executed completely on a computer, partially on a computer, as an independent software package, partially on a computer and partially on a remote computer, or all on a remote computer or server.

In the context of this disclosure, a machine-readable medium or a computer-readable medium may be any tangible medium that includes or stores a program used for or related to an instruction execution system, apparatus, or device. The machine-readable medium may be a machine-readable signal medium or a machine-readable storage medium. The machine-readable medium may include but is not limited to an electronic, a magnetic, an optical, an electromagnetic, an infrared, or a semiconductor system, apparatus, or device, or any appropriate combination thereof. More detailed examples of the machine-readable storage medium include an electrical connection with one or more conducting wires, a portable computer disk, a hard disk, a random-access memory (RAM), a read-only memory (ROM), an erasable programmable read-only memory (EPROM or flash memory), an optical storage device, a magnetic storage device, or any appropriate combination thereof.

In addition, although operations are described in a particular order, this should not be understood as requiring such operations to be completed in the shown particular order or in the successive order, or performing all the illustrated operations to obtain the desired results. In some cases, multitasking or parallel processing is advantageous. Similarly, although the foregoing description includes some specific implementation details, this should not be construed as limiting the scope of the present disclosure or claims, but rather as description of specific example embodiments that may be specific to a particular embodiment. Some features described in this specification in the context of separate example embodiments may be alternatively integrated into a single example embodiment. Alternatively, various features that are described in the context of a single example embodiment may be separately implemented in a plurality of example embodiments or in any appropriate sub-combination.

Although the subject matter has been described in a language specific to structural features and/or methodological actions, it should be understood that the subject matter defined in the appended claims is not limited to the specific features or actions described above. On the contrary, the specific features and actions described above are disclosed as example forms of implementing the claims.

What is claimed is:

1. A method implemented by an encoding device, the method comprising:
obtaining a generator matrix for encoding, wherein the generator matrix is based on a target parity-check matrix of a Hamming code for encoding, wherein the target parity-check matrix is based on a target function for decoding, and wherein the target function is one of a predetermined function set;

encoding information bits using the generator matrix to obtain an encoded data stream; and sending the encoded data stream to a decoding device.

2. The method of claim 1, wherein the target function is a target function $h(s_{0,i},s_{1,i},s_{2,i})$ that is configured to determine a not-all-zero row vector based on at least some elements of first three elements $s_{0,i}, s_{1,i}$, and $s_{2,i}$ of column vectors corresponding to the not-all-zero row vector, wherein the predetermined function set comprises one or more of the following: $h(s_{0,i},s_{1,i},s_{2,i})=s_{1,i}\wedge s_{2,i}, h(s_{0,i},s_{1,i},s_{2,i})=s_{0,i}\wedge s_{1,i}, h(s_{0,i},s_{1,i},s_{2,i})=s_{0,i}\wedge s_{2,i}, h(s_{0,i},s_{1,i},s_{2,i})=s_{0,i}\wedge \overline{s_{1,i}} \wedge \overline{s_{2,i}}, h(s_{0,i},s_{1,i},s_{2,i})=\overline{s_{0,i}}\wedge s_{1,i}\wedge \overline{s_{2,i}}, h(s_{0,i},s_{1,i},s_{2,i})=(s_{0,i}\wedge \overline{s_{2,i}})\vee ([s]_{1,i}\wedge \overline{s_{2,i}}), h(s_{0,i},s_{1,i},s_{2,i})=(s_{0,i}\wedge \overline{s_{1,i}})\vee (\overline{s_{1,i}}\wedge s_{2,i}), h(s_{0,i},s_{1,i},s_{2,i})=(\overline{s_{0,i}}\wedge s_{1,i})\vee (\overline{s_{0,i}}\wedge s_{2,i}), h(s_{0,i},s_{1,i},s_{2,i})=([s]_{1,i}\wedge \overline{s_{2,i}})\vee (s_{0,i}\wedge s_{1,i})$, or $h(s_{0,i},s_{1,i},s_{2,i})=([s]_{1,i}\wedge \overline{s_{2,i}})\vee (s_{0,i}\wedge s_{2,i})$.

3. The method of claim 2, wherein a code length of the Hamming code is 180, wherein a length of the information bits is 170, wherein all elements in a ninth row of the target parity-check matrix are 1, wherein the target function $h(s_{0,i},s_{1,i},s_{2,i})$ determines an element $s_{8,i}$ of a column vector corresponding to the not-all-zero row vector as $s_{8,i}=h(s_{0,i},s_{1,i},s_{2,i})=s_{0,i}\wedge s_{1,i}$, wherein i is an integer greater than or equal to 0 and less than 180, wherein $i=2^7 s_{7,i}+2^6 s_{6,i}+2^5 s_{5,i}+2^4 s_{4,i}+2^3 s_{3,i}+2^2 s_{2,i}+2s_{1,i}+s_{0,i}$, and wherein $s_{8,i}, s_{7,i}, s_{6,i}, s_{5,i}, s_{4,i}, s_{3,i}, s_{2,i}, s_{1,i}$, and $s_{0,i}$ are respectively elements of column vectors corresponding to a row vector of the target parity-check matrix.

4. The method of claim 2, wherein a code length of the Hamming code is 128, wherein a length of the information bits is 119, wherein all elements $s_{8,i}$ in an eighth row of the target parity-check matrix are 1, wherein the target function $h(s_{0,i},s_{1,i},s_{2,i})$ determines an element $s_{7,i}$ of a column vector corresponding to the not-all-zero row vector as one of $s_{7,i}=h(s_{0,i},s_{1,i},s_{2,i})=s_{0,i}\wedge s_{1,i}, s_{7,i}=h(s_{0,i},s_{1,1},s_{2,i})=s_{0,i}\wedge s_{2,i}$, or $s_{7,i}=h(s_{0,i},s_{1,i},s_{2,i})=s_{1,i}\wedge s_{2,i}$, and wherein i is an integer greater than or equal to 0 and less than 128, wherein $i=2^6 s_{6,i}+2^5 s_{5,i}+2^4 s_{4,i}+2^3 s_{3,i}+2^2 s_{2,i}+2s_{1,i}+s_{0,i}$, and wherein $s_{7,i}, s_{6,i}, s_{5,i}, s_{4,i}, s_{3,i}, s_{2,i}, s_{1,i}$, and $s_{0,i}$ are respectively elements of column vectors corresponding to a row vector of the target parity-check matrix.

5. The method of claim 2, wherein a code length of the Hamming code is 64, wherein a length of the information bits is 56, wherein all elements $s_{7,i}$ in a seventh row of the target parity-check matrix are 1, wherein the target function $h(s_{0,i},s_{1,i},s_{2,i})$ determines an element $s_{6,i}$ of a column vector corresponding to the not-all-zero row vector as one of $s_{6,i}=h(s_{0,i},s_{1,i},s_{2,i})=s_{0,i}\wedge s_{1,i}, s_{0,i}=h(s_{0,i},s_{1,i},s_{2,i})=s_{0,i}\wedge s_{2,i}$, and $s_{0,i}=h(s_{0,i},s_{1,i},s_{2,i})=s_{1,i}\wedge s_{2,i}$, wherein i is an integer greater than or equal to 0 and less than 64, wherein $i=2^5 s_{5,i}+2^4 s_{4,i}+2^3 s_{3,i}+2^2 s_{2,i}+2s_{1,i}+s_{0,i}$, and wherein $s_{6,i}, s_{5,i}, s_{4,i}, s_{3,i}, s_{2,i}, s_{1,i}$, and $s_{0,i}$ are respectively elements of column vectors corresponding to a row vector of the target parity-check matrix.

6. The method of claim 1, wherein the generator matrix is based on a system check matrix, and wherein the system check matrix is obtained by transforming the target parity-check matrix.

7. The method of claim 1, wherein the predetermined function set comprises a plurality of candidate functions for determining a not-all-zero row vector extended based on the target parity-check matrix.

8. The method of claim 7, further comprising:
determining a plurality of candidate parity-check matrices based on the plurality of candidate functions;
selecting a non-singular matrix from the plurality of candidate parity-check matrices to obtain a first candidate parity-check matrix set;
transforming the first candidate parity-check matrix set into a second candidate parity-check matrix set in a systematic form;
determining a third parameter associated with each candidate parity-check matrix in the second candidate parity-check matrix set, wherein the third parameter indicates encoding complexity of the Hamming code;
selecting a first group of candidate parity-check matrices from the first candidate parity-check matrix set based on the third parameter; and
determining the target parity-check matrix from the first group of candidate parity-check matrices.

9. The method of claim 8, further comprising:
determining a fourth parameter associated with each candidate parity-check matrix in the first group of candidate parity-check matrices, wherein the fourth parameter indicates a quantity of minimum code weights of the Hamming code corresponding to each candidate parity-check matrix in the first group of candidate parity-check matrices;
selecting a second group of candidate parity-check matrices from the first group of candidate parity-check matrices based on the fourth parameter; and
determining the target parity-check matrix from the second group of candidate parity-check matrices.

10. The method of claim 9, further comprising:
determining an operation quantity of a function corresponding to each candidate parity-check matrix in the second group of candidate parity-check matrices in the function set; and
determining the target parity-check matrix based on the operation quantity.

11. The method of claim 8, further comprising for each candidate parity-check matrix in the first candidate parity-check matrix set:
moving at least some linearly independent column vectors from right to left to a rightmost of a corresponding candidate parity-check matrix; and
performing elementary row transformation, so that a right part of the corresponding candidate parity-check matrix is an identity matrix.

12. The method of claim 7, further comprising:
determining a plurality of candidate parity-check matrices based on the plurality of candidate functions;
selecting a non-singular matrix from the plurality of candidate parity-check matrices to obtain a first candidate parity-check matrix set;
transforming the first candidate parity-check matrix set into a second candidate parity-check matrix set in a systematic form;
determining a fourth parameter associated with each candidate parity-check matrix in the second candidate parity-check matrix set, wherein the fourth parameter indicates a quantity of minimum code weights of the Hamming code corresponding to each candidate parity-check matrix in the second candidate parity-check matrix set;
selecting a first group of candidate parity-check matrices from the first candidate parity-check matrix set based on the fourth parameter; and determining the target parity-check matrix from the first group of candidate parity-check matrices.

13. The method of claim 12, further comprising:
determining a third parameter associated with each candidate parity-check matrix in the first group of candidate parity-check matrices, wherein the third parameter indicates encoding complexity of the Hamming code;
selecting a second group of candidate parity-check matrices from the first group of candidate parity-check matrices, wherein the second group of candidate parity-check matrices has the third parameter below a predetermined threshold; and
determining the target parity-check matrix from the second group of candidate parity-check matrices.

14. A method implemented by a decoding device, the method comprising:
receiving a data stream;
obtaining a target parity-check matrix of a Hamming code for decoding, wherein the target parity-check matrix is based on a target function for decoding, and wherein the target function is one of a predetermined function set; and
decoding the data stream by using the target parity-check matrix.

15. The method of claim 14, wherein the target function is a target function $h(s_{0,i}, s_{1,i}, s_{2,i})$ that is configured to determine a not-all-zero row vector based on at least some elements of first three elements $s_{0,i}, s_{1,i}$, and $s_{2,i}$ of column vectors corresponding to the not-all-zero row vector, wherein the predetermined function set comprises one or more of the following: $h(s_{0,i}, s_{1,i}, s_{2,i}) = s_{1,i} \wedge s_{2,i}, h(s_{0,i}, s_{1,i}, s_{2,i}) = s_{0,i} \wedge s_{1,i}, h(s_{0,i}, s_{1,i}, s_{2,i}) = s_{0,i} \wedge s_{2,i}, h(s_{0,i}, s_{1,i}, s_{2,i}) = s_{0,i} \wedge s_{1,i} \wedge s_{2,i}, h(s_{0,i}, s_{1,i}, s_{2,i}) = \overline{s_{0,i}} \wedge s_{1,i} \wedge s_{2,i}, h(s_{0,i}, s_{1,i}, s_{2,i}) = (s_{0,i} \wedge \overline{s_{2,i}}) \vee (\overline{(s)}_{1,i} \wedge s_{2,i}), h(s_{0,i}, s_{1,i}, s_{2,i}) = (s_{0,i} \wedge \overline{s_{1,i}}) \vee (\overline{s_{1,i}} \wedge s_{2,i}), h(s_{0,i}, s_{1,i}, s_{2,i}) = (\overline{s_{0,i}} \wedge s_{1,i}) \vee (\overline{s_{0,i}} \wedge s_{2,i}), h(s_{0,i}, s_{1,i}, s_{2,i}) = \overline{(s)}_{1,i} \wedge \overline{s_{2,i}}) \vee (s_{0,i} \wedge s_{1,i})$, or $h(s_{0,i}, s_{1,i}, s_{2,i}) = \overline{(s)}_{1,i} \wedge \overline{s_{2,i}}) \vee (s_{0,i} \wedge s_{2,i})$.

16. The method of claim 15, wherein a code length of the Hamming code is 180, wherein a length of information bits is 170, wherein all elements in a ninth row of the target parity-check matrix are 1, wherein the target function $h(s_{0,i}, s_{1,i}, s_{2,i})$ determines an element $s_{8,i}$ of a column vector corresponding to the not-all-zero row vector as $s_{8,i} = h(s_{0,i}, s_{1,i}, s_{2,i}) = s_{0,i} \wedge s_{1,i}, i = 2^7 s_{7,i} + 2^6 s_{6,i} + 2^5 s_{5,i} + 2^4 s_{4,i} + 2^3 s_{3,i} + 2^2 s_{2,i} + 2 s_{1,i} + s_{0,i}$, wherein i is an integer greater than or equal to 0 and less than 180, and wherein $s_{8,i}, s_{7,i}, s_{6,i}, s_{5,i}, s_{4,i}, s_{3,i}, s_{2,i}, s_{1,i}$, and $s_{0,i}$ are respectively elements of column vectors corresponding to a row vector of the target parity-check matrix.

17. An encoding device comprising:
at least one memory configured to store data; and
at least one processor configured to:
obtain a generator matrix for encoding, wherein the generator matrix is based on a target parity-check matrix of a Hamming code for encoding, wherein the target parity-check matrix is based on a target function for decoding, and wherein the target function is one of a predetermined function set;
encode information bits by using the generator matrix to obtain an encoded data stream; and
send the encoded data stream to a decoding device.

18. The device of claim 17, wherein the target function is a target function $h(s_{0,i}, s_{1,i}, s_{2,i})$ that is configured to determine a not-all-zero row vector based on at least some elements of first three elements $s_{0,i}, s_{1,i}$, and $s_{2,i}$ of column vectors corresponding to the not-all-zero row vector, and the predetermined function set comprises one or more of the following: $h(s_{0,i}, s_{1,i}, s_{2,i}) = s_{1,i} \wedge s_{2,i}, h(s_{0,i}, s_{1,i}, s_{2,i}) = s_{0,i} \wedge s_{1,i}, h(s_{0,i}, s_{1,i}, s_{2,i}) = s_{0,i} \wedge s_{2,i}, h(s_{0,i}, s_{1,i}, s_{2,i}) = s_{0,i} \wedge s_{1,i} \wedge \overline{s_{2,i}}, h(s_{0,i}, s_{1,i}, s_{2,i}) = \overline{s_{0,i}} \wedge s_{1,i} \wedge s_{2,i}, h(s_{0,i}, s_{1,i}, s_{2,i}) = (s_{0,i} \wedge \overline{s_{2,i}}) \vee (\overline{(s)}_{1,i} \wedge \overline{s_{2,i}}), h(s_{0,i}, s_{1,i}, s_{2,i}) = (s_{0,i} \wedge \overline{s_{1,i}}) \vee (\overline{s_{1,i}} \wedge s_{2,i}), h(s_{0,i}, s_{1,i}, s_{2,i}) = (\overline{s_{0,i}} \wedge s_{1,i}) \vee (\overline{s_{0,i}} \wedge s_{2,i}), h(s_{0,i}, s_{1,i}, s_{2,i}) = \overline{(s)}_{1,i} \wedge \overline{s_{2,i}}) \vee (s_{0,i} \wedge s_{1,i})$, and $h(s_{0,i}, s_{1,i}, s_{2,i}) = \overline{(s)}_{1,i} \wedge \overline{s_{2,i}}) \vee (s_{0,i} \wedge s_{2,i})$.

19. The device of claim 18, wherein a code length of the Hamming code is 180, wherein a length of the information bits is 170, wherein all elements in a ninth row of the target parity-check matrix are 1, wherein the target function $h(s_{0,i}, s_{1,i}, s_{2,i})$ determines an element $s_{8,i}$ of a column vector corresponding to the not-all-zero row vector as $s_{8,i} = h(s_{0,i}, s_{1,i}, s_{2,i}) = s_{0,i} \wedge s_{1,i}$, wherein i is an integer greater than or equal to 0 and less than 180, wherein $i = 2^7 s_{7,i} + 2^6 s_{6,i} + 2^5 s_{5,i} + 2^4 s_{4,i} + 2^3 s_{3,i} + 2^2 s_{2,i} + 2 s_{1,i} + s_{0,i}$, and wherein $s_{8,i}, s_{7,i}, s_{6,i}, s_{5,i}, s_{4,i}, s_{3,i}, s_{2,i}, s_{1,i}$, and $s_{0,i}$ are respectively elements of column vectors corresponding to a row vector of the target parity-check matrix.

20. The device of claim 18, wherein a code length of the Hamming code is 128, wherein a length of the information bits is 119, wherein all elements $s_{8,i}$ in an eighth row of the target parity-check matrix are 1, wherein the target function $h(s_{0,i}, s_{1,i}, s_{2,i})$ determines an element $s_{7,i}$ of a column vector corresponding to the not-all-zero row vector as one of $s_{7,i} = h(s_{0,i}, s_{1,i}, s_{2,i}) = s_{0,i} \wedge s_{1,i}, s_{7,i} = h(s_{0,i}, s_{1,i}, s_{2,i}) = s_{0,i} \wedge s_{2,i}$, or $s_{7,i} = h(s_{0,i}, s_{1,i}, s_{2,i}) = s_{1,i} \wedge s_{2,i}$, wherein i is an integer greater than or equal to 0 and less than 128, wherein $i = 2^6 s_{6,i} + 2^5 s_{5,i} + 2^4 s_{4,i} + 2^3 s_{3,i} + 2^2 s_{2,i} + 2 s_{1,i} + s_{0,i}$, and wherein $s_{7,i}, s_{0,i}, s_{5,i}, s_{4,i}, s_{3,i}, s_{2,i}, s_{1,i}$, and $s_{0,i}$ are respectively elements of column vectors corresponding to a row vector of the target parity-check matrix.

21. The device of claim 18, wherein a code length of the Hamming code is 64, wherein a length of the information bits is 56, wherein all elements $s_{7,i}$ in a seventh row of the target parity-check matrix are 1, wherein the target function $h(s_{0,i}, s_{1,i}, s_{2,i})$ determines an element $s_{6,i}$ of a column vector corresponding to the not-all-zero row vector as one of $s_{6,i} = h(s_{0,i}, s_{1,i}, s_{2,i}) = s_{0,i} \wedge s_{1,i}, s_{0,i} = h(s_{0,i}, s_{1,i}, s_{2,i}) = s_{0,i} \wedge s_{2,i}$, or $s_{0,i} = h(s_{0,i}, s_{1,i}, s_{2,i}) = s_{1,i} \wedge s_{2,i}$, wherein i is an integer greater than or equal to 0 and less than 64, $i = 2^5 s_{5,i} + 2^4 s_{4,i} + 2^3 s_{3,i} + 2^2 s_{2,i} + 2 s_{1,i} + s_{0,i}$, and wherein $s_{6,i}, s_{5,i}, s_{4,i}, s_{3,i}, s_{2,i}, s_{1,i}$, and $s_{0,i}$ are respectively elements of column vectors corresponding to a row vector of the target parity-check matrix.

22. The device of claim 17, wherein the at least one processor is further configured to:
transform the target parity-check matrix to obtain a system check matrix; and
determine the generator matrix based on a system check matrix.

23. The device of claim 17, wherein the at least one processor is further configured to extend a not-all-zero row vector based on the target parity-check matrix and using a plurality of candidate functions in the predetermined function set.

24. The device of claim 23, wherein the at least one processor is further configured to:
determine a plurality of candidate parity-check matrices based on the plurality of candidate functions;
select a non-singular matrix from the plurality of candidate parity-check matrices, to obtain a first candidate parity-check matrix set;
transform the first candidate parity-check matrix set into a second candidate parity-check matrix set in a systematic form;

determine a third parameter associated with each candidate parity-check matrix in the second candidate parity-check matrix set, wherein the third parameter indicates encoding complexity of the Hamming code;

select a first group of candidate parity-check matrices from the first candidate parity-check matrix set based on the third parameter; and determine the target parity-check matrix from the first group of candidate parity-check matrices.

25. The device of claim 24, wherein the at least one processor is further configured to:

determine a fourth parameter associated with each candidate parity-check matrix in the first group of candidate parity-check matrices, wherein the fourth parameter indicates a quantity of minimum code weights of the Hamming code corresponding to each candidate parity-check matrix in the first group of candidate parity-check matrices;

select a second group of candidate parity-check matrices from the first group of candidate parity-check matrices based on the fourth parameter; and determine the target parity-check matrix from the second group of candidate parity-check matrices.

26. The device of claim 25, wherein the at least one processor is further configured to:

determine an operation quantity of a function corresponding to each candidate parity-check matrix in the second group of candidate parity-check matrices in the function set; and determine the target parity-check matrix based on the operation quantity.

27. The device of claim 24, wherein the at least one processor is further configured to:

for each candidate parity-check matrix in the first candidate parity-check matrix set, move at least some linearly independent column vectors from right to left to a rightmost of a corresponding candidate parity-check matrix, and perform elementary row transformation, so that a right part of the corresponding candidate parity-check matrix is an identity matrix.

28. The device of claim 23, wherein the at least one processor is further configured to:

determine a plurality of candidate parity-check matrices based on the plurality of candidate functions;

select a non-singular matrix from the plurality of candidate parity-check matrices, to obtain a first candidate parity-check matrix set;

transform the first candidate parity-check matrix set into a second candidate parity-check matrix set in a systematic form;

determine a fourth parameter associated with each candidate parity-check matrix in the second candidate parity-check matrix set, wherein the fourth parameter indicates a quantity of minimum code weights of the Hamming code corresponding to each candidate parity-check matrix in the second candidate parity-check matrix set;

select a first group of candidate parity-check matrices from the first candidate parity-check matrix set based on the fourth parameter; and determine the target parity-check matrix from the first group of candidate parity-check matrices.

29. The device of claim 28, wherein the at least one processor is further configured to:

determine a third parameter associated with each candidate parity-check matrix in the first group of candidate parity-check matrices, wherein the third parameter indicates encoding complexity of the Hamming code;

select a second group of candidate parity-check matrices from the first group of candidate parity-check matrices, wherein the second group of candidate parity-check matrices has the third parameter below a predetermined threshold; and determine the target parity-check matrix from the second group of candidate parity-check matrices.

30. A decoding device comprising:

at least one memory configured to store data; and at least one processor configured to:

receive a data stream;

obtain a target parity-check matrix of a Hamming code for decoding, wherein the target parity-check matrix is based on a target function for decoding, and wherein the target function is one of a predetermined function set; and decode the data stream by using the target parity-check matrix.

* * * * *

UNITED STATES PATENT AND TRADEMARK OFFICE
CERTIFICATE OF CORRECTION

Page 1 of 1

PATENT NO. : 12,500,607 B2
APPLICATION NO. : 18/469087
DATED : December 16, 2025
INVENTOR(S) : Kechao Huang et al.

It is certified that error appears in the above-identified patent and that said Letters Patent is hereby corrected as shown below:

In the Claims

Claim 5, Column 45, Line 53: "$s_{0,i}=h($" should read "$s_{6,i}=h($"

Claim 5, Column 45, Line 54: "$s_{0,i}=h($" should read "$s_{6,i}=h($"

Claim 19, Column 48, Line 17: "$2^4{}_{4,i}+$" should read "$2^4 s_{4,i}+$"

Claim 20, Column 48, Line 31: "$s_{7,1},s_{0,1},s_{5,i}$" should read "$s_{7,1},s_{6,1},s_{5,i}$"

Claim 21, Column 48, Line 41: "$s_{0,i}=h($" should read "$s_{6,i}=h($"

Claim 21, Column 48, Line 42: "$s_{0,i}=h($" should read "$s_{6,i}=h($"

Signed and Sealed this
Third Day of February, 2026

John A. Squires
*Director of the United States Patent and Trademark Office*